United States Patent
Sato et al.

(10) Patent No.: US 11,209,877 B2
(45) Date of Patent: Dec. 28, 2021

(54) ELECTRICAL MODULE, DISPLAY PANEL, DISPLAY DEVICE, INPUT/OUTPUT DEVICE, DATA PROCESSING DEVICE, AND METHOD OF MANUFACTURING ELECTRICAL MODULE

(71) Applicant: Semiconductor Energy Laboratory Co., Ltd., Kanagawa-ken (JP)

(72) Inventors: Masataka Sato, Tochigi (JP); Hiroki Adachi, Tochigi (JP)

(73) Assignee: Semiconductor Energy Laboratory Co., Ltd.

( * ) Notice: Subject to any disclaimer, the term of this patent is extended or adjusted under 35 U.S.C. 154(b) by 0 days.

(21) Appl. No.: 16/980,218

(22) PCT Filed: Mar. 4, 2019

(86) PCT No.: PCT/IB2019/051701
§ 371 (c)(1),
(2) Date: Sep. 11, 2020

(87) PCT Pub. No.: WO2019/175704
PCT Pub. Date: Sep. 19, 2019

(65) Prior Publication Data
US 2021/0011532 A1   Jan. 14, 2021

(30) Foreign Application Priority Data

Mar. 16, 2018 (JP) .............................. JP2018-048815
Apr. 27, 2018 (JP) .............................. JP2018-086283
May 18, 2018 (JP) .............................. JP2018-096028

(51) Int. Cl.
*G06F 1/18* (2006.01)
*G06F 3/01* (2006.01)
(Continued)

(52) U.S. Cl.
CPC .............. *G06F 1/189* (2013.01); *G06F 3/013* (2013.01); *G06F 3/0416* (2013.01); *G09G 3/3275* (2013.01); *H01L 27/3276* (2013.01)

(58) Field of Classification Search
CPC ...... G06F 1/189; G06F 1/1637; G06F 1/1652; G06F 1/1626; G06F 1/1616;
(Continued)

(56) References Cited

U.S. PATENT DOCUMENTS 5,731,856 A   3/1998   Kim et al.
5,744,864 A   4/1998   Cillessen et al.
(Continued)

FOREIGN PATENT DOCUMENTS

CN   001769987 A   5/2006
CN   107403807 A   11/2017
(Continued)

OTHER PUBLICATIONS

International Search Report (Application No. PCT/IB2019/051701) dated May 7, 2019.
(Continued)

*Primary Examiner* — Ryan A Lubit
(74) *Attorney, Agent, or Firm* — Husch Blackwell LLP

(57) ABSTRACT

A novel electrical module that is highly convenient or reliable is provided. A novel display panel that is highly convenient or reliable is provided. A novel display device that is highly convenient or reliable is provided. The functional layer includes an element, a conductive film, and an intermediate layer and the element is electrically connected to the conductive film. The intermediate layer includes an opening portion and a first surface, the opening portion overlaps with the conductive film, the opening portion includes a side end portion, and the side end portion is in contact with the conductive film. Moreover, the first surface
(Continued)

includes a first region, the first region is positioned at the periphery of the opening portion, and the first region is in contact with the conductive film.

11 Claims, 34 Drawing Sheets

(51) Int. Cl.
  *G06F 3/041*  (2006.01)
  *G09G 3/3275*  (2016.01)
  *H01L 27/32*  (2006.01)

(58) Field of Classification Search
  CPC ........ G06F 1/1643; G06F 1/163; G06F 3/013; G06F 3/0416; G06F 3/044; G06F 2203/04102; G09G 3/3233; G09G 3/3225; G09G 3/3275; G09G 2320/0247; G09G 2340/0435; G09G 2330/021; G09G 2310/0221; G09G 2320/0666; G09G 2360/144; G09G 2300/0842; H01L 27/3276; H01L 27/323; H01L 29/786; G02F 1/13338; G02F 1/133514; G02F 1/136286
  See application file for complete search history.

(56) References Cited

U.S. PATENT DOCUMENTS

| | | | |
|---|---|---|---|
| 5,821,597 | A | 10/1998 | Nakajima et al. |
| 6,294,274 | B1 | 9/2001 | Kawazoe et al. |
| 6,331,722 | B1 | 12/2001 | Yamazaki et al. |
| 6,563,174 | B2 | 5/2003 | Kawasaki et al. |
| 6,714,268 | B2 | 3/2004 | Wang et al. |
| 6,727,522 | B1 | 4/2004 | Kawasaki et al. |
| 7,038,641 | B2 | 5/2006 | Hirota et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,084,936 | B2 | 8/2006 | Kato |
| 7,102,704 | B2 | 9/2006 | Mitsui et al. |
| 7,105,868 | B2 | 9/2006 | Nause et al. |
| 7,176,991 | B2 | 2/2007 | Mitsui et al. |
| 7,211,825 | B2 | 5/2007 | Shih et al. |
| 7,239,361 | B2 | 7/2007 | Kato |
| 7,248,235 | B2 | 7/2007 | Fujii et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,385,654 | B2 | 6/2008 | Mitsui et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,485,511 | B2 | 2/2009 | Yamada et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 7,814,786 | B2 | 10/2010 | Woodard |
| 7,863,188 | B2 | 1/2011 | Tsurume et al. |
| 8,138,502 | B2 | 3/2012 | Nakamura et al. |
| 8,222,666 | B2 | 7/2012 | Hatano et al. |
| 8,264,144 | B2 | 9/2012 | Oikawa et al. |
| 8,377,762 | B2 | 2/2013 | Eguchi et al. |
| 8,450,769 | B2 | 5/2013 | Hatano et al. |
| 8,576,209 | B2 | 11/2013 | Miyaguchi |
| 8,610,155 | B2 | 12/2013 | Hatano et al. |
| 8,766,314 | B2 | 7/2014 | Hatano et al. |
| 8,970,520 | B2 | 3/2015 | Teraguchi et al. |
| 9,257,449 | B2 | 2/2016 | Yamazaki et al. |
| 9,337,244 | B2 | 5/2016 | Hatano et al. |
| 9,337,344 | B2 | 5/2016 | Hanaoka |
| 9,356,054 | B2 | 5/2016 | Miyairi et al. |
| 9,425,371 | B2 | 8/2016 | Hatano et al. |
| 9,666,820 | B2 | 5/2017 | Eguchi et al. |
| 9,690,150 | B2 | 6/2017 | Ueno et al. |
| 9,735,222 | B2 | 8/2017 | Nishido et al. |
| 9,799,716 | B2 | 10/2017 | Hatano et al. |
| 10,163,940 | B2 | 12/2018 | Kubota et al. |
| 10,181,424 | B2 | 1/2019 | Yamazaki et al. |
| 10,374,184 | B2 | 8/2019 | Eguchi et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2002/0146893 | A1 | 10/2002 | Shimoda et al. |
| 2003/0027369 | A1 | 2/2003 | Yamazaki |
| 2003/0047280 | A1 | 3/2003 | Takayama et al. |
| 2003/0057422 | A1 | 3/2003 | Yamazaki et al. |
| 2003/0062519 | A1 | 4/2003 | Yamazaki et al. |
| 2003/0082859 | A1 | 5/2003 | Ichijo et al. |
| 2003/0189401 | A1 | 10/2003 | Kido et al. |
| 2003/0201960 | A1 | 10/2003 | Fujieda |
| 2003/0218222 | A1 | 11/2003 | Wager, III et al. |
| 2004/0038446 | A1 | 2/2004 | Takeda et al. |
| 2004/0046909 | A1 | 3/2004 | Sekiguchi |
| 2004/0127038 | A1 | 7/2004 | Garcia et al. |
| 2005/0017302 | A1 | 1/2005 | Hoffman |
| 2005/0199959 | A1 | 9/2005 | Chiang et al. |
| 2005/0244995 | A1* | 11/2005 | Fukuchi .............. H01L 51/0023 438/30 |
| 2006/0035452 | A1 | 2/2006 | Garcia et al. |
| 2006/0043377 | A1 | 3/2006 | Hoffman et al. |
| 2006/0072047 | A1 | 4/2006 | Sekiguchi |
| 2006/0091793 | A1 | 5/2006 | Baude et al. |
| 2006/0097022 | A1 | 5/2006 | Kim |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0180618 | A1 | 7/2008 | Fujieda |
| 2008/0182358 | A1 | 7/2008 | Cowdery-Corvan et al. |
| 2008/0224133 | A1 | 9/2008 | Park et al. |

(56) References Cited

U.S. PATENT DOCUMENTS

| | | |
|---|---|---|
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0115942 A1 | 5/2009 | Watanabe |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0171905 A1 | 7/2010 | Huang et al. |
| 2011/0062434 A1 | 3/2011 | Eguchi et al. |
| 2011/0171764 A1 | 7/2011 | Toonen et al. |
| 2011/0199564 A1 | 8/2011 | Moriwaki |
| 2011/0227851 A1* | 9/2011 | Oh .................... G02F 1/136204 345/173 |
| 2011/0234964 A1 | 9/2011 | Moriwaki |
| 2012/0161125 A1 | 6/2012 | Yamazaki |
| 2012/0175608 A1 | 7/2012 | Yamazaki |
| 2013/0134422 A1 | 5/2013 | Tsubuku |
| 2013/0181268 A1 | 7/2013 | Hirota |
| 2013/0300456 A1 | 11/2013 | Lennon |
| 2014/0028961 A1* | 1/2014 | Yanagisawa .......... G02F 1/1368 349/106 |
| 2014/0065430 A1 | 3/2014 | Yamazaki et al. |
| 2014/0132643 A1 | 5/2014 | Yamazaki et al. |
| 2014/0179110 A1 | 6/2014 | Park et al. |
| 2014/0325249 A1 | 10/2014 | Toyotaka |
| 2014/0326992 A1 | 11/2014 | Hondo et al. |
| 2015/0021597 A1 | 1/2015 | Lu et al. |
| 2015/0103023 A1 | 4/2015 | Iwaki |
| 2015/0137098 A1 | 5/2015 | Tanaka |
| 2015/0154730 A1 | 6/2015 | Hirakata et al. |
| 2015/0187814 A1 | 7/2015 | Miyairi et al. |
| 2015/0214256 A1 | 7/2015 | Miyairi |
| 2015/0270288 A1 | 9/2015 | Yamazaki et al. |
| 2015/0303392 A1 | 10/2015 | Ohsawa et al. |
| 2015/0309637 A1 | 10/2015 | Sakuishi et al. |
| 2015/0317015 A1 | 11/2015 | Eguchi et al. |
| 2015/0348909 A1 | 12/2015 | Yamazaki et al. |
| 2015/0355710 A1 | 12/2015 | Modarres et al. |
| 2016/0013442 A1 | 1/2016 | Akimoto et al. |
| 2016/0056410 A1 | 2/2016 | Yanagisawa et al. |
| 2016/0070314 A1 | 3/2016 | Takahashi et al. |
| 2016/0109998 A1 | 4/2016 | Watanabe |
| 2016/0179229 A1 | 6/2016 | Ahn |
| 2016/0179259 A1 | 6/2016 | Watanabe et al. |
| 2016/0195983 A1 | 7/2016 | Miyake |
| 2016/0240685 A1 | 8/2016 | Tanaka |
| 2016/0299387 A1 | 10/2016 | Yamazaki et al. |
| 2016/0315134 A1 | 10/2016 | Nishido et al. |
| 2017/0025444 A1* | 1/2017 | Hirakata ............. H01L 27/1244 |
| 2017/0294463 A1 | 10/2017 | Yamazaki et al. |
| 2017/0338246 A1 | 11/2017 | Kubota et al. |
| 2018/0138257 A1 | 5/2018 | Higano et al. |
| 2018/0335677 A1* | 11/2018 | Zhang ............... G02F 1/136286 |
| 2019/0267440 A1* | 8/2019 | Park .................... G09G 3/3266 |
| 2019/0326538 A1 | 10/2019 | Eguchi et al. |
| 2021/0011342 A1* | 1/2021 | Chen ................ G02F 1/133553 |

FOREIGN PATENT DOCUMENTS

| | | |
|---|---|---|
| JP | 2011-085923 A | 4/2011 |
| JP | 2016-208020 A | 12/2016 |
| JP | 2017-116928 A | 6/2017 |
| JP | 2017-134382 A | 8/2017 |
| JP | 2017-195367 A | 10/2017 |
| JP | 2017-211651 A | 11/2017 |
| KR | 2006-0040281 A | 5/2006 |
| KR | 2012-0068772 A | 6/2012 |
| KR | 2017-0131229 A | 11/2017 |
| TW | 201126697 | 8/2011 |
| TW | 201806453 | 2/2018 |
| WO | WO 2011/034068 A1 | 3/2011 |

OTHER PUBLICATIONS

Written Opinion (Application No. PCT/IB2019/051701) dated May 7, 2019.

* cited by examiner

FIG. 4A
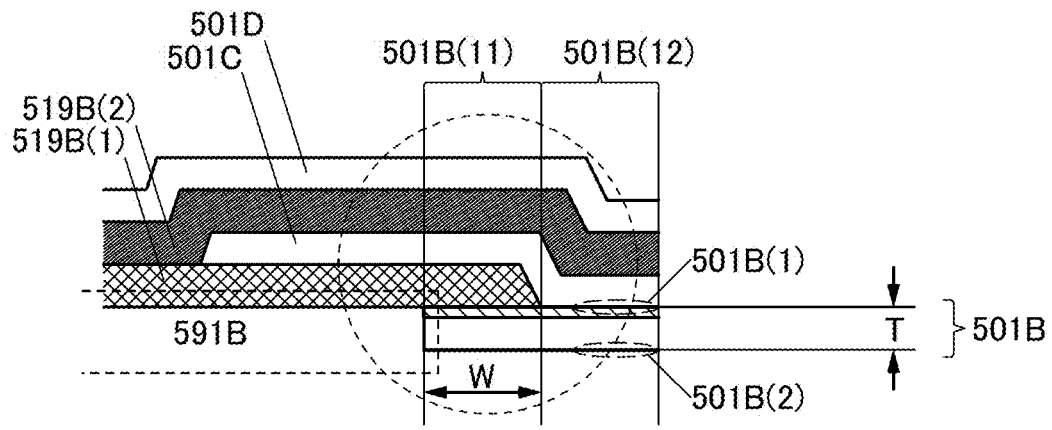
FIG. 4B1
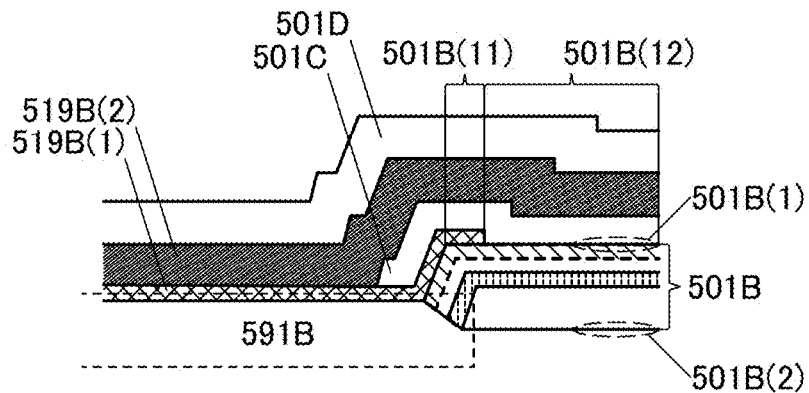
FIG. 4B2
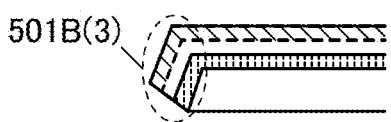
FIG. 4C1
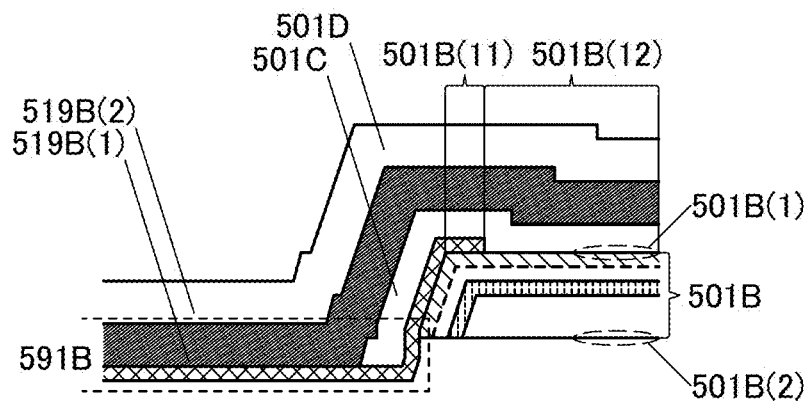
FIG. 4C2
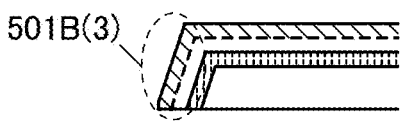

FIG. 18A1
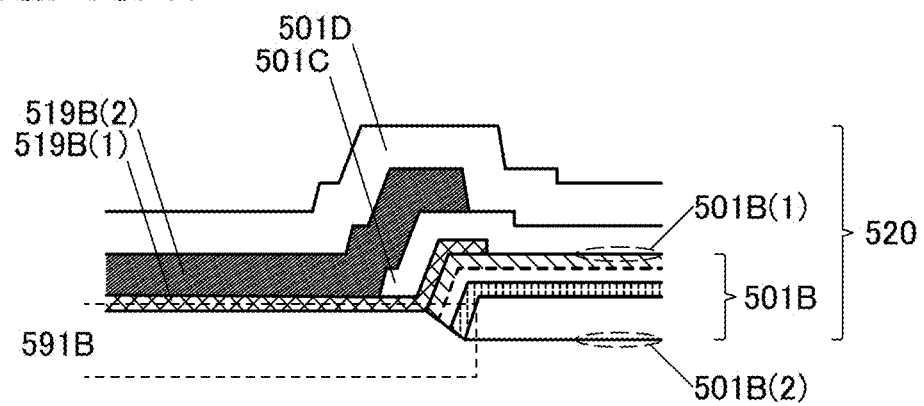
FIG. 18A2
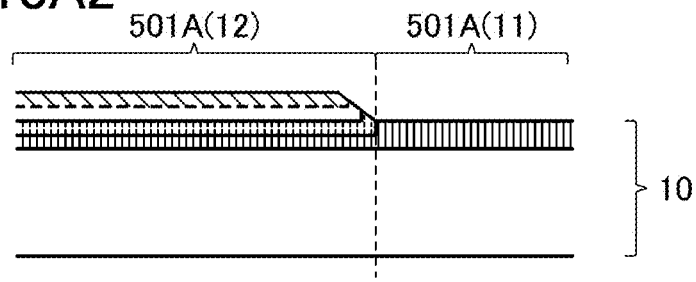
FIG. 18B1
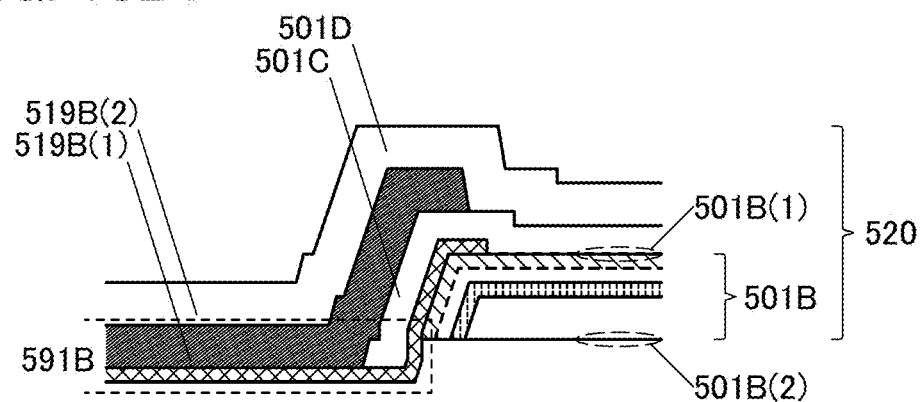
FIG. 18B2
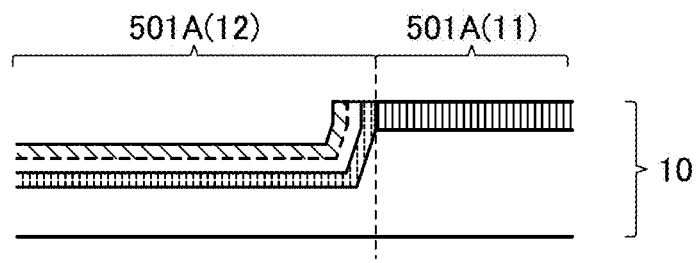

FIG. 20A
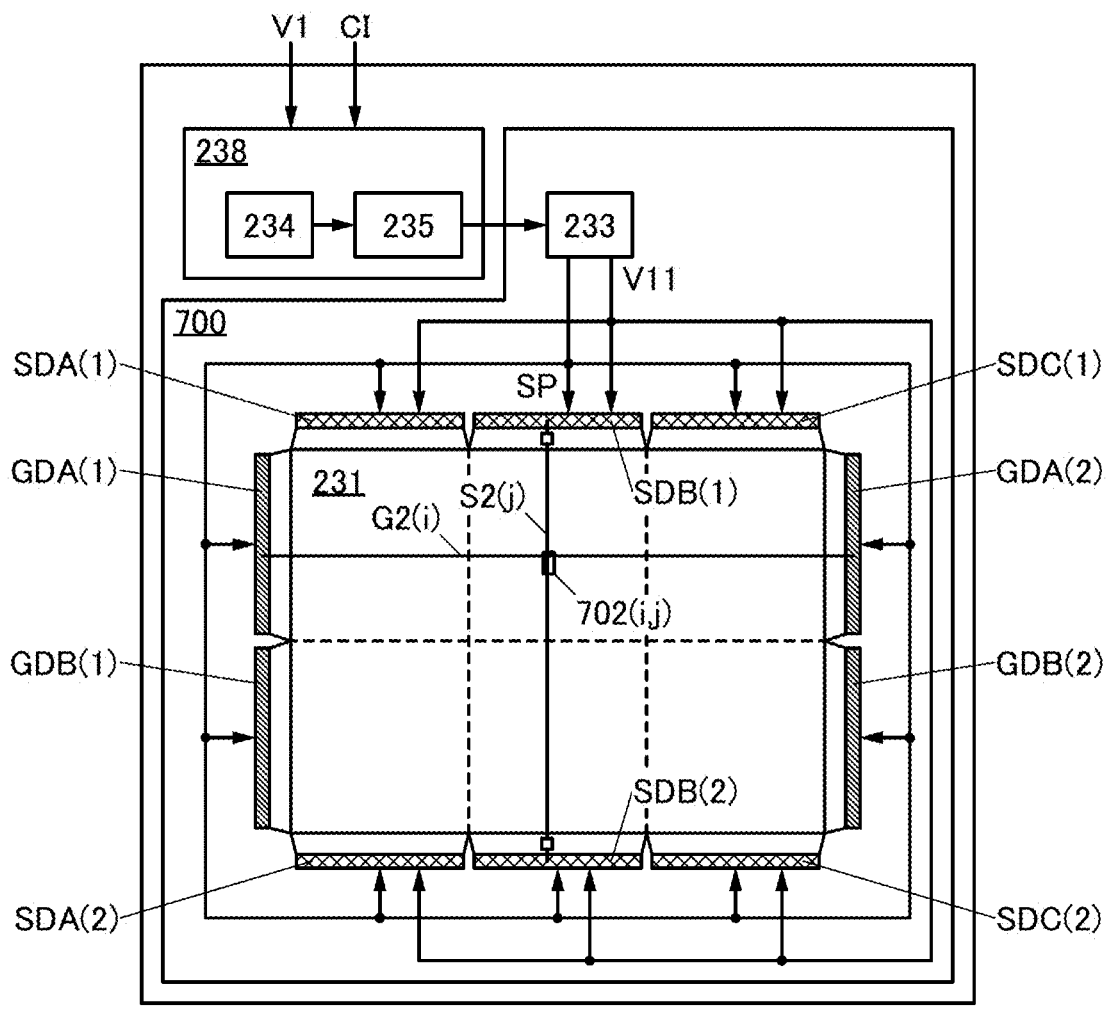
FIG. 20B1
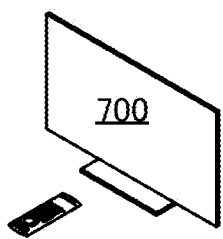
FIG. 20B2
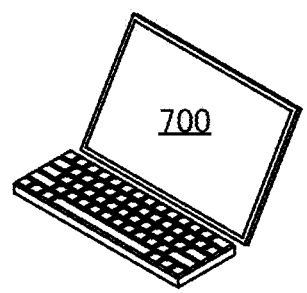
FIG. 20B3
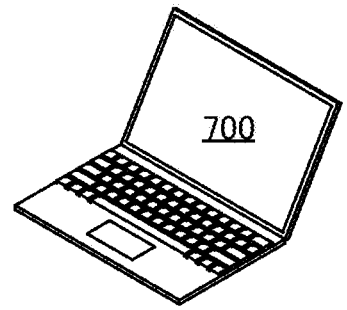

FIG. 34A
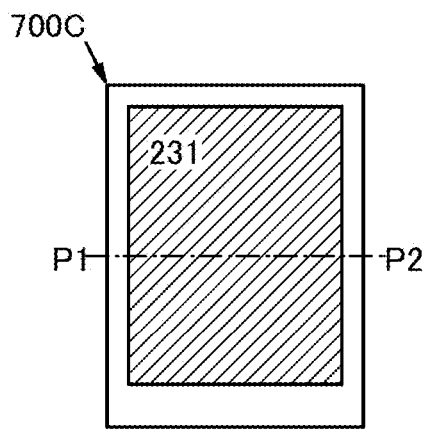
FIG. 34B
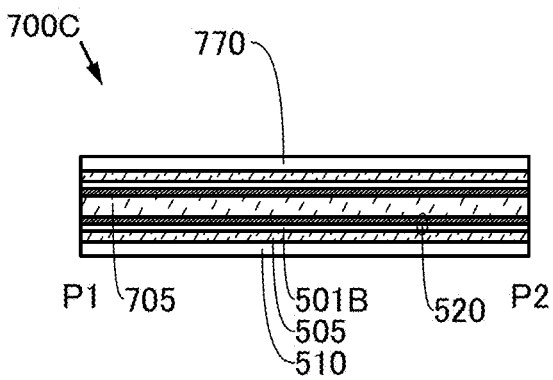
FIG. 34C1
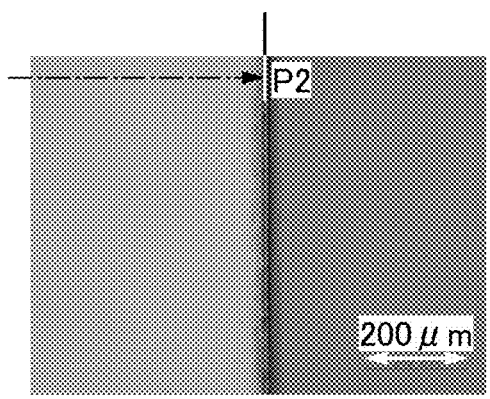
FIG. 34C2
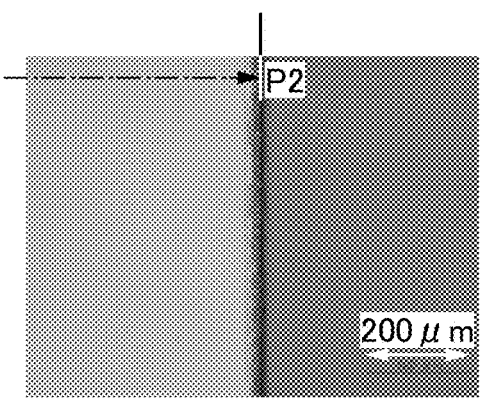
FIG. 34C3
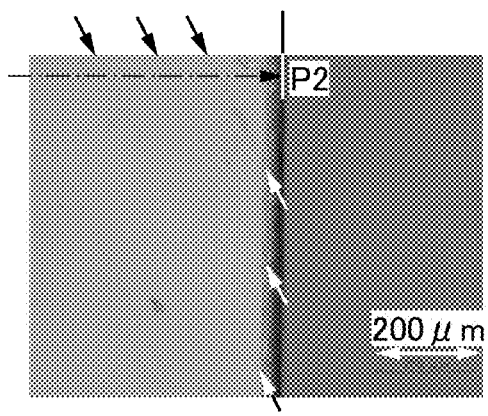

ELECTRICAL MODULE, DISPLAY PANEL, DISPLAY DEVICE, INPUT/OUTPUT DEVICE, DATA PROCESSING DEVICE, AND METHOD OF MANUFACTURING ELECTRICAL MODULE

This application is a 371 of international application PCT/IB2019/051701 filed on Mar. 4, 2019 which is incorporated herein by reference.

TECHNICAL FIELD

One embodiment of the present invention relates to an electrical module, a display panel, a display device, an input/output device, a data processing device, or a method of manufacturing an electrical module.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Thus, more specifically, examples of the technical field of one embodiment of the present invention disclosed in this specification include a semiconductor device, a display device, a light-emitting device, a power storage device, a memory device, a driving method thereof, and a manufacturing method thereof.

BACKGROUND ART

A semiconductor device, which includes an insulating film having an opening portion, a first connection portion penetrating the opening portion, a terminal that is in contact with one surface of the insulating film and electrically connected to the first connection portion, and a circuit electrically connected to the first connection portion on the opposite surface of the insulating film and in which the terminal includes a region embedded in the insulating film and a region exposed from the insulating film and the circuit includes a semiconductor element, is known (Patent Document 1).

Furthermore, a display panel, which includes a pixel, a third conductive film electrically connected to the pixel, an insulating film having an opening portion overlapping with the third conductive film, and an electrode including a first region in contact with the third conductive film and a second region functioning as a contact point, is known (Patent Document 2).

REFERENCES

Patent Documents

[Patent Document 1] Japanese Published Patent Application No. 2017-134382
[Patent Document 2] Japanese Published Patent Application No. 2017-116928

SUMMARY OF THE INVENTION

Problems to be Solved by the Invention

An object of one embodiment of the present invention is to provide a novel electrical module that is highly convenient or reliable. Alternatively, an object is to provide a novel display panel that is highly convenient or reliable. Alternatively, an object is to provide a novel display device that is highly convenient or reliable. Alternatively, an object is to provide a novel input/output device that is highly convenient or reliable. Alternatively, an object is to provide a novel data processing device that is highly convenient or reliable. Alternatively, an object is to provide a novel method of manufacturing an electrical module, which is highly convenient or reliable. Alternatively, an object is to provide a novel electrical module, a novel display panel, a novel display device, a novel input/output device, a novel data processing device, a novel method of manufacturing an electrical module, or a novel semiconductor device.

Note that the description of these objects does not preclude the existence of other objects. One embodiment of the present invention does not need to achieve all of these objects. Other objects will be apparent from and can be derived from the description of the specification, the drawings, the claims, and the like.

Means for Solving the Problems (1) One embodiment of the present invention is an electrical module including a functional layer.

The functional layer includes an element, a conductive film, and an intermediate layer. The element is electrically connected to the conductive film.

The intermediate layer includes an opening portion and a first surface.

The opening portion overlaps with the conductive film.

The first surface includes a first region. The first region is positioned at a periphery of the opening portion and in contact with the conductive film. In addition, the first region has a width W ten times or less the thickness T of the intermediate layer.

Thus, the conductive film can be used for a terminal. Alternatively, the element can be electrically connected to an external device through the conductive film provided in the opening portion. As a result, a novel electrical module that is highly convenient or reliable can be provided.

(2) Furthermore, one embodiment of the present invention is the above-described electrical module in which the intermediate layer includes silicon and oxygen, the first region includes fluorine, and the conductive film includes titanium.

(3) Furthermore, one embodiment of the present invention is the above-described electrical module in which the intermediate layer includes silicon and oxygen, the first region includes nitrogen, and the conductive film includes tungsten.

(4) One embodiment of the present invention is an electrical module including a functional layer.

The functional layer includes an element, a conductive film, and an intermediate layer. The element is electrically connected to the conductive film.

The intermediate layer includes an opening portion and a first surface.

The opening portion overlaps with the conductive film. In addition, the opening portion includes a side end portion, and the side end portion is in contact with the conductive film.

The first surface includes a first region. The first region is positioned at a periphery of the opening portion and in contact with the conductive film.

Thus, the conductive film can be used as the terminal. Alternatively, the element can be electrically connected to an external device through the conductive film provided in the opening portion. As a result, a novel electrical module that is highly convenient or reliable can be provided.

(5) Furthermore, one embodiment of the present invention is the above-described electrical module in which the intermediate layer includes silicon and oxygen, the first region and a side end portion include fluorine, and the conductive film includes titanium.

(6) Furthermore, one embodiment of the present invention is the above-described electrical module in which the intermediate layer includes silicon and oxygen, the first region and a side end portion include nitrogen, and the conductive film includes tungsten.

(7) Furthermore, one embodiment of the present invention is the above-described electrical module in which the intermediate layer includes a second region. The second region adheres to another component of the functional layer with a force greater than that of the first region.

Thus, the diffusion of an impurity that reduces reliability into the element from the outside can be inhibited. Alternatively, the opening portion can be formed in the intermediate layer to overlap with the conductive film. As a result, a novel electrical module that is highly convenient or reliable can be provided.

(8) Furthermore, one embodiment of the present invention is a display panel including a display region and the above electrical module.

The display region includes a pixel (i,j), and the pixel (i,j) includes a pixel circuit (i,j) and a display element (i,j).

The electrical module includes a pixel circuit (i,j).

In addition, the pixel circuit (i,j) is electrically connected to the display element (i,j) and the pixel circuit (i,j) includes an element.

Thus, data can be supplied through the conductive film. Alternatively, data can be displayed. Alternatively, the diffusion of an impurity that reduces reliability into the display element (i,j) from the outside can be inhibited. As a result, a novel display panel that is highly convenient or reliable can be provided.

(9) Furthermore, one embodiment of the present invention is the above display panel in which the display region includes a group of a pixel (i,1) to a pixel (i,n), another one group of a pixel (1,j) to a pixel (m,j), a scan line, and a signal line.

The one group of the pixel (i,1) to the pixel (i,n) include the pixel (i,j), and the one group of the pixel (1,j) to the pixel (m,j) are arranged in a row direction.

The other group of the pixel (1,j) to the pixel (m,j) include the pixel (i,j), and the other group of the pixel (1,j) to the pixel (m,j) are arranged in a column direction intersecting with the row direction.

The scan line is electrically connected to the group of the pixel (i,1) to the pixel (i,n), and the signal line is electrically connected to the other group of the pixel (1,j) to the pixel (m,j).

Thus, image data can be supplied to a plurality of pixels. Alternatively, the image data can be displayed. As a result, a novel display panel that is highly convenient or reliable can be provided.

(10) Furthermore, one embodiment of the present invention is a display device that includes a control portion and the above-described display panel.

The control portion is supplied with image data and control data, the control portion generates data on the basis of the image data, the control portion generates a control signal on the basis of the control data, and the control portion supplies the data and the control signal.

The electrical module includes a driver circuit GD, and the electrical module is supplied with data and the control signal.

The driver circuit operates on the basis of the control signal, and the pixel (i,j) performs display on the basis of the data.

Thus, the image data can be displayed using the display element. As a result, a novel display device that is highly convenient or reliable can be provided.

(11) Furthermore, one embodiment of the present invention is an input/output device including an input portion and a display portion.

The display portion includes the above display panel, the input portion includes a sensing region, and the input portion senses an object approaching the sensing region.

The sensing region includes a region overlapping with the pixel (i,j).

Thus, the object approaching the region overlapping with the display portion can be sensed while image data is displayed by the display portion. Alternatively, a finger or the like that approaches the display portion can be used as a pointer to input positional data. Alternatively, positional data can be associated with image data displayed on the display portion. As a result, a novel input/output device that is highly convenient or reliable can be provided.

(12) Furthermore, one embodiment of the present invention is a data processing device including an arithmetic device and an input/output device.

The arithmetic device is supplied with input data or sensing data, and the arithmetic device generates control data and image data on the basis of the input data or the sensing data. In addition, the arithmetic device supplies the control data and the image data.

The input/output device supplies the input data and the sensing data, the input/output device is supplied with the control data and the image data, and the input/output device includes a display portion, an input portion, and a sensing portion.

The display portion includes the above-described electrical module, and the display portion displays the image data on the basis of the control data.

The input portion generates the input data, and the sensing portion generates the sensing data.

Thus, the control data can be generated on the basis of the input data or the sensing data. Alternatively, the image data can be displayed on the basis of the input data or the sensing data. As a result, a novel data processing device that is highly convenient or reliable can be provided.

(13) One embodiment of the present invention is a data processing device that includes one or more of a keyboard, a hardware button, a pointing device, a touch sensor, an illuminance sensor, an imaging device, an audio input device, an eye-gaze input device, and an attitude detection device, and the above-described display panel.

(14) One embodiment of the present invention is a method of manufacturing an electrical module, which includes a first step of preparing a processed member including a process substrate and a functional layer and a second step of separating the functional layer from the process substrate.

The process substrate includes a functional surface.

The functional surface includes an active region, the functional layer includes a conductive film and an intermediate layer, the intermediate layer includes a first surface and a second surface, the first surface includes a first region, and the first region is in contact with the conductive film.

The second surface is opposite to the first surface, the second surface includes a third region, and the third region is in contact with the active region.

In the second step, the functional layer or the process substrate is bent, and at the first region, the intermediate layer is separated from the conductive film. At the third region, the intermediate layer is separated from the active region.

Thus, in the second step, the intermediate layer can be separated from the conductive film and the intermediate layer can be separated from the active region. Alternatively, the opening portion can be formed in the intermediate layer. Consequently, a novel method of manufacturing an electrical module, which is highly convenient or reliable, can be provided.

Although the block diagram in which components are classified by their functions and shown as independent blocks is shown in the drawings attached to this specification, it is difficult to completely divide actual components according to their functions and one component can relate to a plurality of functions.

In this specification, the names of a source and a drain of a transistor interchange with each other depending on the polarity of the transistor and the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, for the sake of convenience, the connection relation of a transistor is sometimes described assuming that the source and the drain are fixed; in reality, the names of the source and the drain interchange with each other according to the above relation of the potentials.

In this specification, a source of a transistor means a source region that is part of a semiconductor film functioning as an active layer or a source electrode connected to the above-described semiconductor film. Similarly, a drain of a transistor means a drain region that is part of the above-described semiconductor film or a drain electrode connected to the semiconductor film. Moreover, a gate means a gate electrode.

In this specification, a state in which transistors are connected in series means, for example, a state in which only one of a source and a drain of a first transistor is connected to only one of a source and a drain of a second transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor.

In this specification, connection means electrical connection and corresponds to a state in which a current, a voltage, or a potential can be supplied or transmitted. Accordingly, a state of being connected does not necessarily mean a state of being directly connected and also includes, in its category, a state of being indirectly connected through a circuit element such as a wiring, a resistor, a diode, or a transistor that allows a current, a voltage, or a potential to be supplied or transmitted.

In this specification, even when independent components are connected to each other in a circuit diagram, there is actually a case where one conductive film has functions of a plurality of components such as a case where part of a wiring functions as an electrode, for example. Connection in this specification also includes such a case where one conductive film has functions of a plurality of components, in its category.

Furthermore, in this specification, one of a first electrode and a second electrode of a transistor refers to a source electrode and the other refers to a drain electrode.

Effect of the Invention

According to one embodiment of the present invention, a novel electrical module that is highly convenient or reliable can be provided. Alternatively, a novel display device that is highly convenient or reliable can be provided. Alternatively, a novel input/output device that is highly convenient or reliable can be provided. Alternatively, a novel data processing device that is highly convenient or reliable can be provided. Alternatively, a novel method of manufacturing an electrical module, which is highly convenient or reliable, can be provided. Alternatively, a novel electrical module, a novel display device, a novel input/output device, a novel data processing device, or a novel method of manufacturing an electrical module can be provided.

Note that the description of these effects does not preclude the existence of other effects. One embodiment of the present invention does not need to have all of these effects. Other effects will be apparent from and can be derived from the description of the specification, the drawings, the claims, and the like.

BRIEF DESCRIPTION OF THE DRAWINGS

FIGS. 4A-4C2 are cross-sectional views showing a structure of a terminal portion of an electrical module according to an embodiment.

FIGS. 18A1-18B2 are cross-sectional views showing a method of manufacturing a terminal portion of a display panel according to an embodiment.

FIGS. 20A-20B3 are a block diagram showing a configuration of a display device according to an embodiment and projection views showing an appearance of the display device.

FIGS. 34A-34C3 are views and photographs showing a structure of a display panel according to an example.

MODE FOR CARRYING OUT THE INVENTION

Figure 1A:
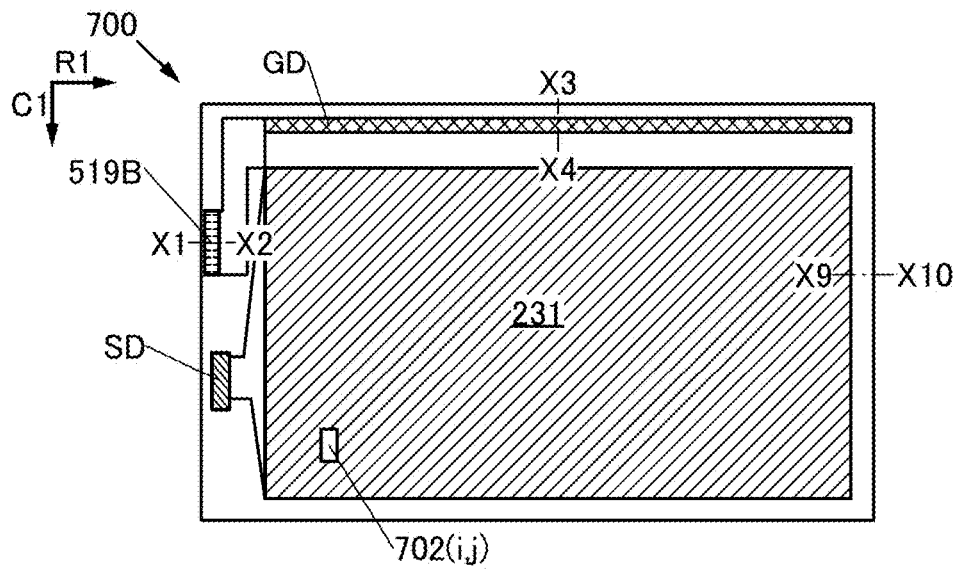
FIGS. 1A-1E are diagrams showing a structure of a display panel including an electrical module according to an embodiment.
Figure 1B:
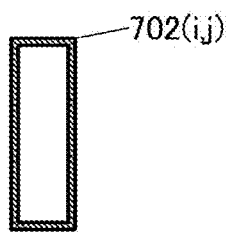

In one embodiment of the present invention, the functional layer includes an element, a conductive film, and an intermediate layer and the element is electrically connected to the conductive film. The intermediate layer includes an opening portion and a first surface, the opening portion overlaps with the conductive film, the opening portion includes a side end portion, and the side end portion is in contact with the conductive film. Moreover, the first surface includes a first region, the first region is positioned at the periphery of the opening portion, and the first region is in contact with the conductive film.

Thus, the conductive film can be used as the terminal. Alternatively, the element can be electrically connected to an external device through the conductive film provided in the opening portion. As a result, a novel electrical module that is highly convenient or reliable can be provided.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description of the following embodiments. Note that in structures of the invention described below, the same portions or portions having similar functions are denoted by the same reference numerals in different drawings, and a description thereof is not repeated.

Embodiment 1

In this embodiment, structures of an electrical module of one embodiment of the present invention will be described with reference to FIG. 1 to FIG. 4.

FIG. 1 is a diagram showing a structure of a display panel including an electrical module of one embodiment of the present invention. FIG. 1(A) is a top view of the display panel including an electrical module of one embodiment of the present invention, and FIG. 1(B) to FIG. 1(E) are top views showing part of FIG. 1(A).

Figure 2A:
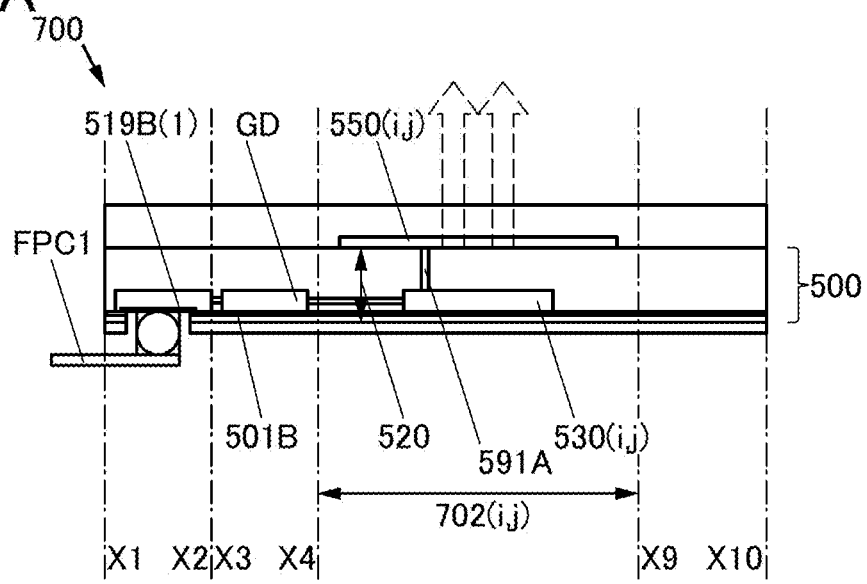
FIGS. 2A-2C are a diagram showing a structure of a display panel including an electrical module, a block diagram showing part of the electrical module, and a circuit diagram showing a pixel circuit according to an embodiment.
Figure 2B:
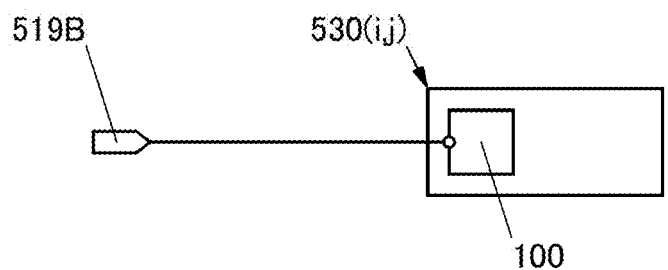
Figure 2C:
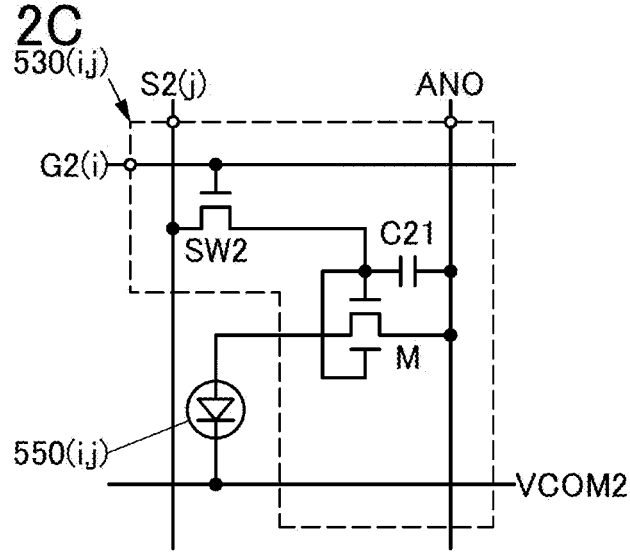

FIG. 2 is a diagram showing a structure of the electrical module of one embodiment of the present invention. FIG. 2(A) is a cross-sectional view taken along cutting plane lines X1-X2, X3-X4, and X9-X10 in FIG. 1(A), FIG. 2(B) is a block diagram showing part of the electrical module, and FIG. 2(C) is a circuit diagram showing a pixel circuit 530($i,j$).

Figure 3A:
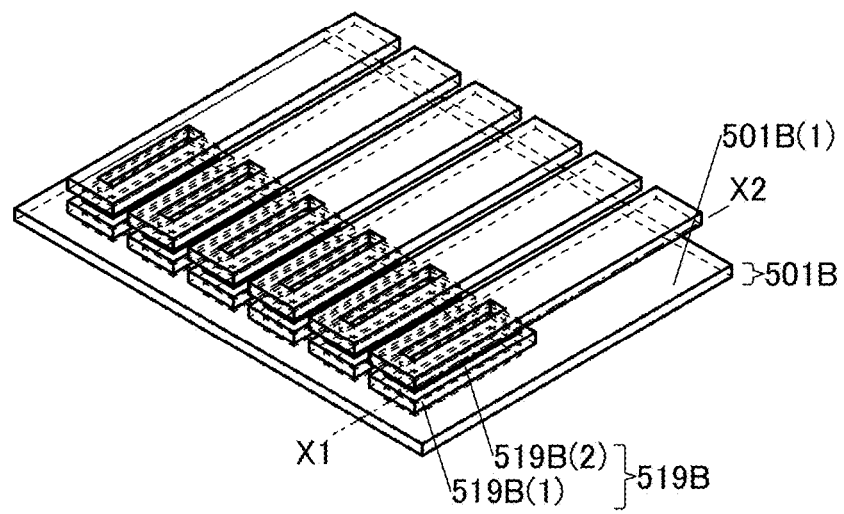
FIGS. 3A-3C are diagrams showing a structure of a terminal portion of an electrical module according to an embodiment.
Figure 3B:
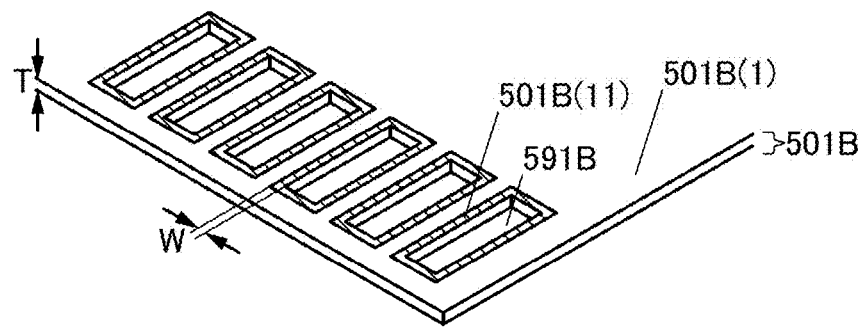
Figure 3C:
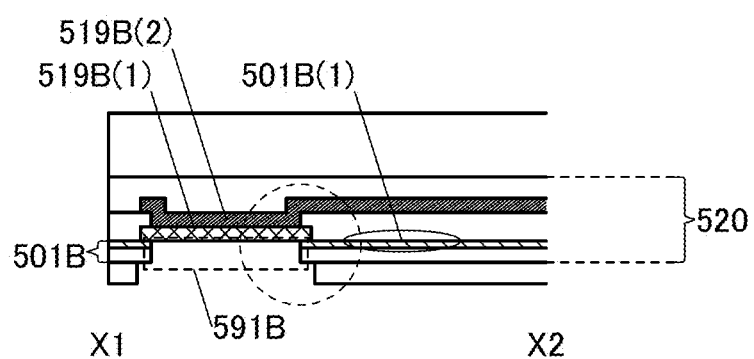

FIG. 3 is a diagram showing a structure of the electrical module of one embodiment of the present invention. FIG. 3(A) and FIG. 3(B) are perspective views showing part of FIG. 1(A), and FIG. 3(C) is a cross-sectional view showing part of FIG. 1(A).

FIG. 4 is a diagram showing a structure of a terminal portion of the electrical module of one embodiment of the present invention. FIG. 4(A), FIG. 4(B-1), and FIG. 4(C-1) are cross-sectional views showing part of FIG. 1(A), FIG. 4(B-2) is a cross-sectional view showing part of FIG. 4(B-1), and FIG. 4(C-2) is a cross-sectional view showing part of FIG. 4(C-1).

Note that in this specification, an integer variable of 1 or more is sometimes used in reference numerals. For example, (p) where p is an integer variable of 1 or more is sometimes used in part of a reference numeral that specifies any of p components at a maximum. For another example, (m,n) where m and n are each an integer variable of 1 or more is sometimes used in part of a reference numeral that specifies any of m×n components at a maximum.

<Structure Example 1 of Electrical Module 500>

An electrical module 500 described in this embodiment includes a functional layer 520 (see FIG. 2(A)).

<<Structure Example 1 of Functional Layer 520>>

The functional layer 520 includes an element 100, a conductive film 519B(1), and an intermediate layer 501B (see FIG. 2(B)).

<<Structure Example 1 of Element 100>>

The element 100 is electrically connected to the conductive film 519B(1) (not illustrated).

A switch, a transistor, a diode, a resistor, an inductor, a capacitor, a memory element, a light-emitting element, a display element, or the like can be used as the element 100, for example. Thus, a pixel circuit, a driver circuit, and the like can be included in the functional layer 520. Alternatively, for example, a display element, a biochip, or the like can be driven.

<<Structure Example 1 of Intermediate Layer 501B>>

The intermediate layer 501B includes an opening portion 591B and a surface 501B(1) (see FIG. 3(A) and FIG. 3(B)).

The opening portion 591B overlaps with the conductive film 519B(1) (see FIG. 3(A) and FIG. 3(C)). In other words, the conductive film 519B(1) is exposed in the opening portion 591B.

The surface 501B(1) includes a region 501B(11) overlapping with the conductive film 519B(1) (see FIG. 3(B), FIG. 3(C), and FIG. 4(A)). In other words, the conductive film 519B(1) includes the region 501B(11) overlapping with the surface 501B(1) in part or all of the periphery of the conductive film 519B(1). For example, the region 501B(11) may be in contact with the conductive film 519B(1).

The region 501B(11) is positioned at the periphery of the opening portion 591B, and the region 501B(11) has a width W ten times or less, preferably five times or less, further preferably twice or less the thickness T of the intermediate layer 501B. Alternatively, an area where the region 501B(11) is in contact with the conductive film 519B(1) is three times or less the area of the opening portion 591B, preferably less than or equal to the area of the opening portion 591B, further preferably less than or equal to 10% of the area of the opening portion 591B, further more preferably less than or equal to 1% of the area of the opening portion 591B. For example, an insulating film having the thickness T of 135 nm and the width W of the region 501B(11) of 700 nm can be used as the intermediate layer 501B.

Thus, the conductive film 519B(1) can be used as the terminal 519B. Alternatively, the element 100 can be electrically connected to an external device through the conductive film 519B(1) provided in the opening portion 591B. As a result, a novel electrical module that is highly convenient or reliable can be provided.

<<Structure Example 2 of Intermediate Layer 501B>>

For example, the intermediate layer 501B includes silicon and oxygen, and the region 501B(11) includes fluorine. The conductive film 519B(1) also includes titanium.

Thus, for example, the force required to peel the conductive film 519B(1) from the intermediate layer 501B can be controlled. Specifically, the force required to peel the conductive film 519B(1) from the intermediate layer 501B can be less than the force required to peel an insulating film 501C from the intermediate layer 501B. Alternatively, the force required to peel the conductive film 519B(1) from the intermediate layer 501B can be less than the force required to peel a conductive film 519B(2) from the intermediate layer 501B.

Alternatively, a film including silicon, oxygen, and nitrogen can be used as the intermediate layer 501B.

Alternatively, the surface 501B(1) of the intermediate layer 501B may include fluorine. Specifically, a film including the surface 501B(1), which is treated with plasma, can be used as the intermediate layer 501B. Specifically, a film including the surface 501B(1), which is treated with plasma using a gas including sulfur hexafluoride, can be used as the intermediate layer 501B.

For example, a film with a thickness greater than or equal to 50 nm and less than or equal to 600 nm, preferably greater than or equal to 50 nm and less than or equal to 200 nm, can be used as the intermediate layer 501B. Specifically, a 200-nm-thick film including silicon, oxygen, and nitrogen can be used as the intermediate layer 501B.

<<Structure Example 3 of Intermediate Layer 501B>>

For example, the intermediate layer 501B includes silicon and oxygen, and the region 501B(11) includes nitrogen. The conductive film 519B(1) also includes tungsten.

Thus, for example, the force required to peel the conductive film 519B(1) from the intermediate layer 501B can be controlled. Specifically, the force required to peel the conductive film 519B(1) from the intermediate layer 501B can be less than the force required to peel the insulating film 501C from the intermediate layer 501B, for example. Alternatively, the force required to peel the conductive film 519B(1) from the intermediate layer 501B can be less than the force required to peel the conductive film 519B(2) from the intermediate layer 501B, for example.

Alternatively, the surface 501B(1) of the intermediate layer 501B may include nitrogen.

For example, a 135-nm-thick film can be used as the intermediate layer 501B. Preferably, a material including silicon and oxygen can be used for the intermediate layer 501B.

<<Structure Example 4 of Intermediate Layer 501B>>

The intermediate layer 501B includes a region 501B(12) (see FIG. 4(A)). The region 501B(12) adheres to another component of the functional layer 520 with a force greater than that of the region 501B(11). For example, the region 501B(12) adheres to the insulating film 501C with a force greater than that with which the region 501B(11) adheres to the conductive film 519B(1). Note that specifically, a microscratch method or the like can be used for measurement of the adhesion force.

Thus, in the manufacturing process of the electrical module 500, stress caused during the removal of the conductive film 519B(1) can be concentrated at or near the region 501B(11). Alternatively, the intermediate layer 501B can be pulled apart with stress concentrated at or near the region 501B(11). Alternatively, the opening portion 591B can be formed in the intermediate layer 501B. Alternatively, the size of the opening portion 591B can be controlled so that the opening portion 591B does not extend beyond the region 501B(11).

Thus, the diffusion of an impurity that reduces reliability into the element 100 from the outside can be inhibited. Alternatively, the opening portion 591B can be formed in the intermediate layer 501B to overlap with the conductive film 519B(1). As a result, a novel electrical module that is highly convenient or reliable can be provided.

<Structure Example 2 of Electrical Module 500>

Another structure of the electrical module of one embodiment of the present invention is described with reference to FIG. 4(B-1), FIG. 4(B-2), and FIG. 4(C-1).

What is different from the electrical module described with reference to FIG. 4(A) is that the opening portion 591B includes a side end portion 501B(3) and the side end portion 501B(3) is in contact with the conductive film 519B(1). Different portions will be described in detail here, and refer to the above description for portions that can use similar structures.

<<Structure Example 1 of Opening Portion 591B>>

The opening portion 591B overlaps with the conductive film 519B(1) (see FIG. 4(B-1)). In other words, the conductive film 519B(1) is exposed in the opening portion 591B. In addition, the opening portion 591B includes the side end portion 501B(3) and the side end portion 501B(3) is in contact with the conductive film 519B(1).

<<Structure Example 1 of Region 501B(11)>>

The surface 501B(1) includes the region 501B(11) (see FIG. 4(B-1) and FIG. 4(C-1)). In other words, the conductive film 519B(1) includes the region overlapping with the surface 501B(1) in part or all of the periphery.

The region 501B(11) is positioned at the periphery of the opening portion 591B and is in contact with the conductive film 519B(1).

Thus, the conductive film 519B(1) can be used as the terminal 519B. Alternatively, the element 100 can be electrically connected to an external device through the conductive film 519B(1) provided in the opening portion 591B. As a result, a novel electrical module that is highly convenient or reliable can be provided.

<<Structure Example 5 of Intermediate Layer 501B>>

For example, the intermediate layer 501B includes silicon and oxygen, and the region 501B(11) and the side end portion 501B(3) include fluorine. The conductive film 519B(1) also includes titanium.

<<Structure Example 6 of Intermediate Layer 501B>>

For example, the intermediate layer 501B includes silicon and oxygen, and the region 501B(11) and the side end portion 501B(3) include nitrogen. The conductive film 519B(1) also includes tungsten.

Note that this embodiment can be combined with other embodiments in this specification as appropriate.

Embodiment 2

In this embodiment, structures of a display panel of one embodiment of the present invention will be described with reference to FIG. 1, FIG. 2, FIG. 5, FIG. 6, and FIG. 19.

Figure 5A:
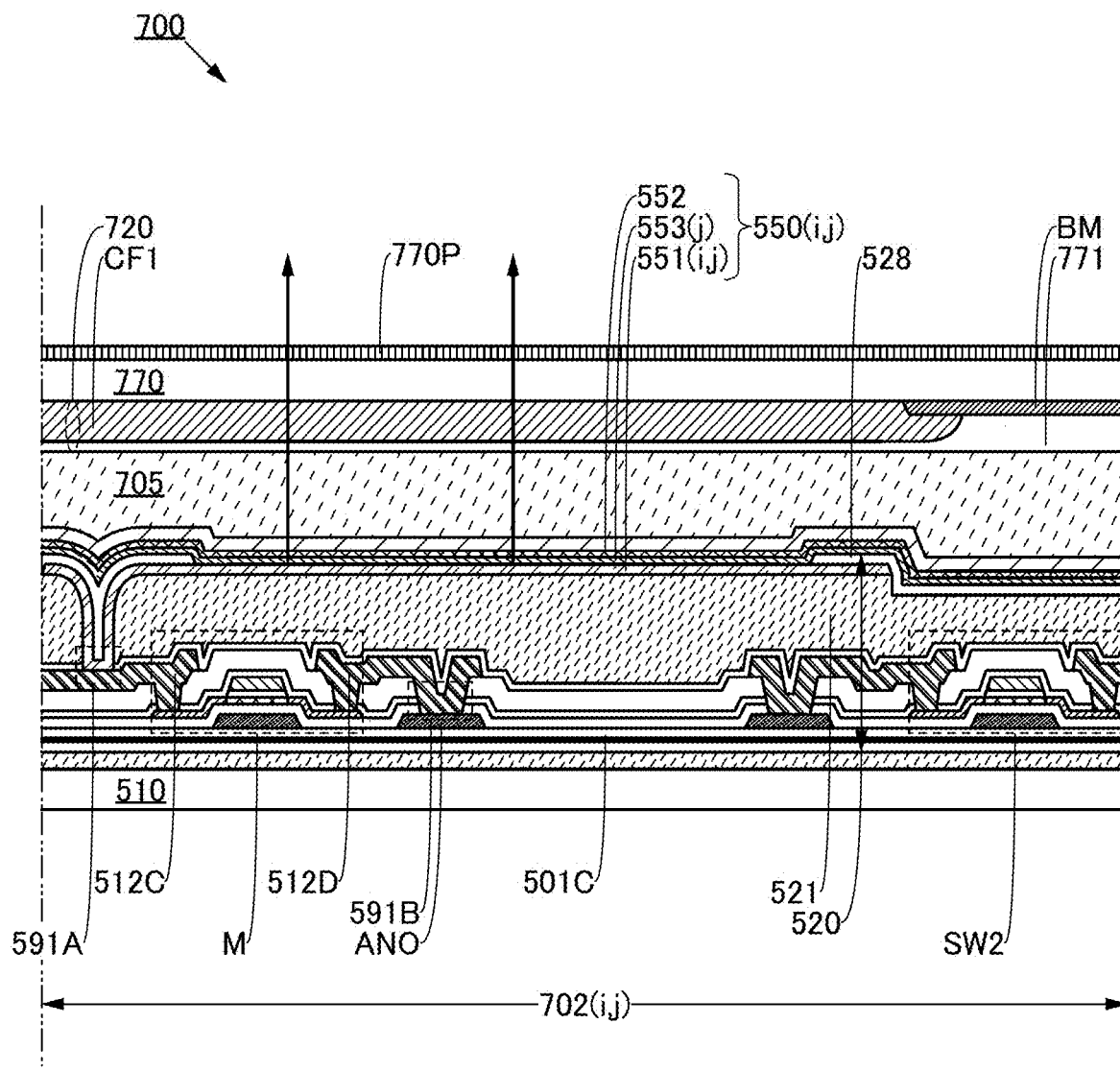
FIGS. 5A and 5B are cross-sectional views showing a structure of a display panel according to an embodiment.
Figure 5B:
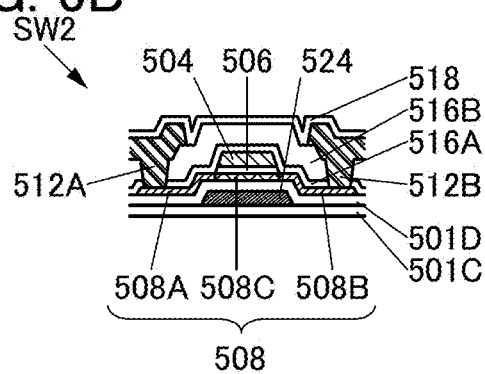

FIG. 5 is a diagram showing a structure of the display panel of one embodiment of the present invention. FIG. 5(A) is a cross-sectional view of a pixel 702($i,j$) in FIG. 1(A), and FIG. 5(B) is a cross-sectional view showing part of FIG. 5(A).

Figure 6A:
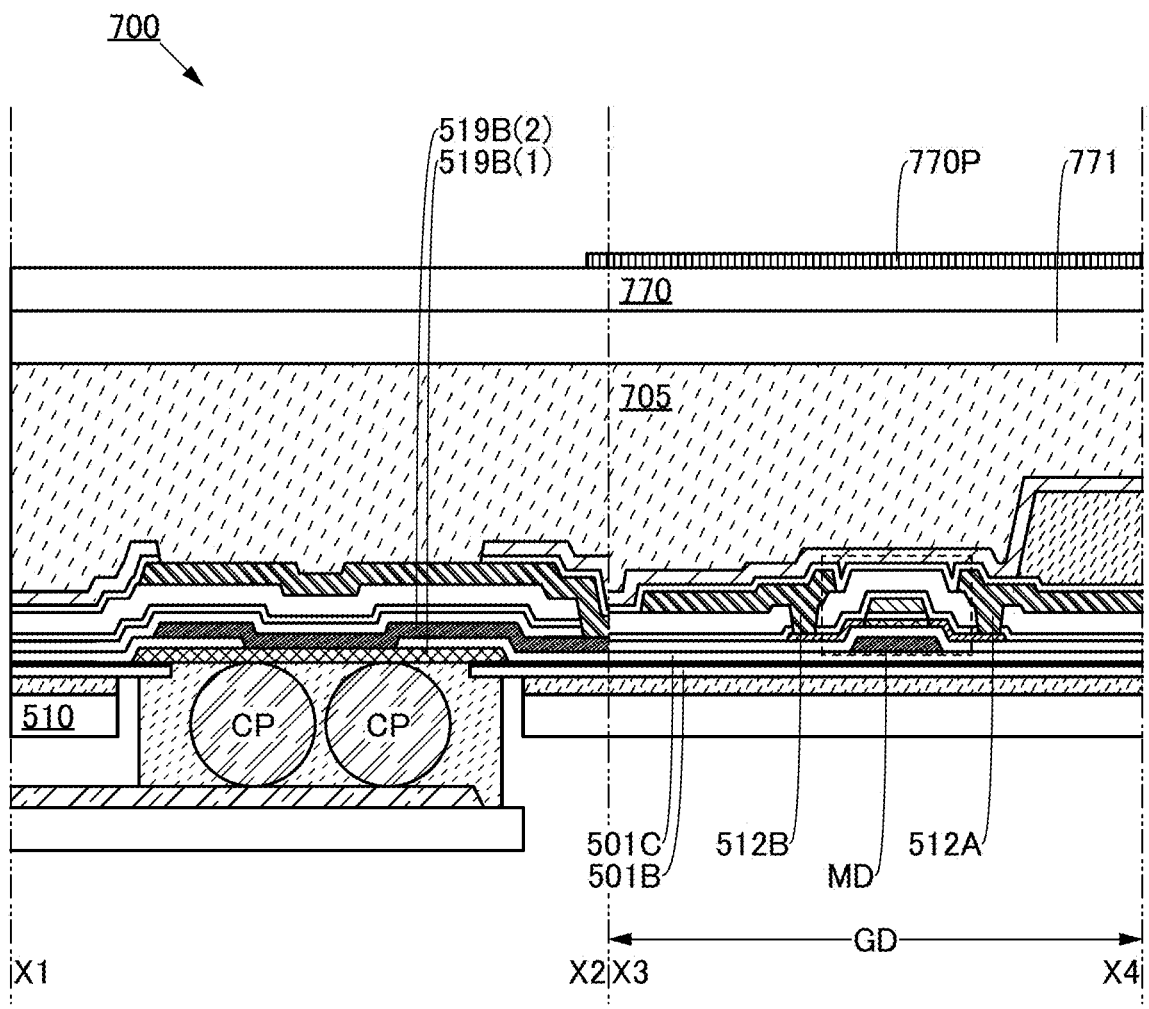
FIGS. 6A and 6B are cross-sectional views showing a structure of a display panel according to an embodiment.
Figure 6B:
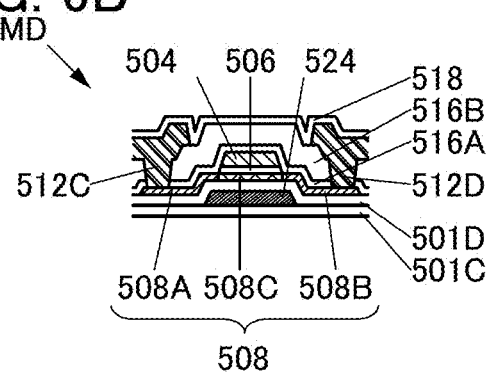

FIG. 6 is a diagram showing a structure of the display panel of one embodiment of the present invention. FIG. 6(A) is a cross-sectional view taken along cutting plane lines X1-X2 and X3-X4 in FIG. 1(A), and FIG. 6(B) is a cross-sectional view showing part of FIG. 6(A).

Figure 19:
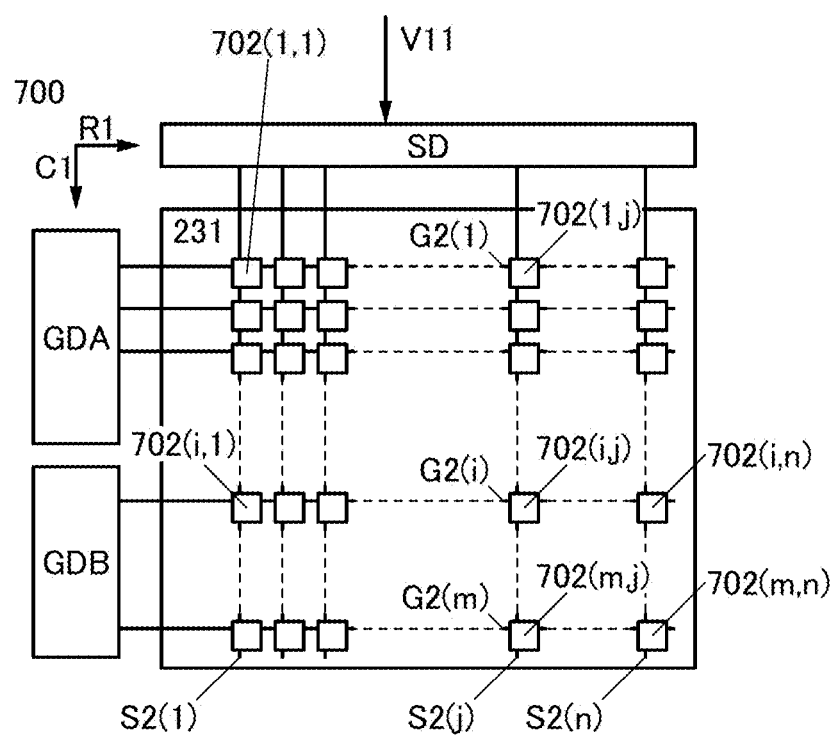
FIG. 19 is a diagram showing a configuration of a display panel according to an embodiment.

FIG. 19 is a diagram showing a configuration of the display panel of one embodiment of the present invention. FIG. 19 is a block diagram of the configuration of the display panel of one embodiment of the present invention.

<Structure Example 1 of Display Panel 700>

The display panel described in this embodiment includes a display region 231 and an electrical module 500 (see FIG. 1(A) and FIG. 2(A)).

<<Structure Example 1 of Display Region 231>>

The display region 231 includes the pixel 702($i,j$).

<<Structure Example 1 of Pixel 702($i,j$)>>

The pixel 702($i,j$) includes the pixel circuit 530($i,j$) and the display element 550($i,j$).

<<Structure Example 3 of Electrical Module 500>>

The electrical module 500 includes the pixel circuit 530($i,j$). For example, the electrical module 500 described in Embodiment 1 can be used as the display panel 700.

<<Structure Example 1 of Pixel Circuit 530($i,j$)>>

A pixel circuit 530($i,j$) includes the element 100, and the pixel circuit 530($i,j$) is electrically connected to the display element 550($i,j$).

Thus, data can be supplied through the conductive film 519B(1). Alternatively, data can be displayed. Alternatively, the diffusion of an impurity that reduces reliability into the display element 550($i,j$) from the outside can be inhibited. As a result, a novel display panel that is highly convenient or reliable can be provided.

The pixel circuit 530($i,j$) is electrically connected to the scan line G2($i$) (see FIG. 2(C) and FIG. 5(A)).

A switch, a transistor, a diode, a resistor, an inductor, a capacitor, or the like can be used in the pixel circuit 530($i,j$), for example.

Specifically, the pixel circuit 530($i,j$) includes the switch SW2, the transistor M, and the capacitor C21. For example, a transistor can be used as the switch SW2.

A bottom-gate transistor or a top-gate transistor can be used in the pixel circuit 530($i,j$), for example.

<<Structure Example 1 of Switch SW2>>

The transistor includes a semiconductor film 508, a conductive film 504, a conductive film 512A, and a conductive film 512B (see FIG. 5(B)).

The semiconductor film 508 includes a region 508A electrically connected to the conductive film 512A and a region 508B electrically connected to the conductive film 512B. The semiconductor film 508 includes a region 508C between the region 508A and the region 508B.

The conductive film 504 includes a region overlapping with the region 508C, and the conductive film 504 has a function of a gate electrode.

An insulating film 506 includes a region positioned between the semiconductor film 508 and the conductive film 504. The insulating film 506 has a function of a gate insulating film.

The conductive film 512A has one of a function of a source electrode and a function of a drain electrode, and the conductive film 512B has the other of the function of the source electrode and the function of the drain electrode.

A conductive film 524 can be used for the transistor. The semiconductor film 508 is positioned between the conductive film 504 and a region included in the conductive film 524. The conductive film 524 has a function of a second gate electrode. The conductive film 524 can be electrically connected to the conductive film 504, for example. Note that the conductive film 524 can be used as the scan line G2($i$).

<<Structure Example 1 of Transistor M>>

The same structure as the transistor used as the switch SW2 can be used for the transistor M, for example. In addition, a semiconductor film that can be formed through the same process as the semiconductor film included in the transistor used in the switch SW2 can be used for the transistor M.

<<Structure Example 1 of Semiconductor Film 508>>

A semiconductor containing a Group 14 element can be used for the semiconductor film 508, for example. Specifically, a semiconductor containing silicon can be used for the semiconductor film 508.

[Hydrogenated Amorphous Silicon]

For example, hydrogenated amorphous silicon can be used for the semiconductor film 508. Alternatively, microcrystalline silicon or the like can be used for the semiconductor film 508. Thus, a display panel having less display unevenness than a display panel that uses polysilicon for the semiconductor film 508, for example, can be provided. Alternatively, the size of the display panel can be easily increased.

[Polysilicon]

For example, polysilicon can be used for the semiconductor film 508. In this case, for example, the field-effect mobility of the transistor can be higher than that of a transistor that uses hydrogenated amorphous silicon for the semiconductor film 508. Alternatively, for example, the driving capability can be higher than that of a transistor that uses hydrogenated amorphous silicon for the semiconductor film 508. Alternatively, for example, the aperture ratio of the pixel can be higher than that in the case of using a transistor that uses hydrogenated amorphous silicon for the semiconductor film 508.

Alternatively, for example, the reliability of the transistor can be higher than that of a transistor that uses hydrogenated amorphous silicon for the semiconductor film 508.

Alternatively, the temperature required for fabrication of the transistor can be lower than that required for a transistor that uses single crystal silicon, for example.

Alternatively, the semiconductor film used for the transistor in the driver circuit can be formed in the same process as the semiconductor film used for the transistor in the pixel circuit. Alternatively, the driver circuit can be formed over the same substrate over which the pixel circuit is formed. Alternatively, the number of components included in an electronic device can be reduced.

[Single Crystal Silicon]

For example, single crystal silicon can be used for the semiconductor film. In this case, for example, the resolution can be higher than that of a display panel that uses hydrogenated amorphous silicon for the semiconductor film 508. Alternatively, for example, a display panel having less display unevenness than a display panel that uses polysilicon for the semiconductor film 508 can be provided. Alternatively, for example, smart glasses or a head mounted display can be provided.

<<Structure Example 2 of Semiconductor Film 508>>

For example, a metal oxide can be used for the semiconductor film 508. Thus, a pixel circuit can hold an image signal for a longer time than a pixel circuit utilizing a transistor that uses amorphous silicon for a semiconductor film. Specifically, a selection signal can be supplied at a frequency of lower than 30 Hz, preferably lower than 1 Hz, further preferably less than once per minute with the suppressed occurrence of flickers. Consequently, fatigue accumulation in a user of a data processing device can be reduced. Moreover, power consumption for driving can be reduced.

A transistor using an oxide semiconductor can be used, for example. Specifically, an oxide semiconductor containing indium or an oxide semiconductor containing indium, gallium, and zinc can be used for the semiconductor film.

A transistor having a lower leakage current in an off state than a transistor that uses amorphous silicon for a semiconductor film can be used, for example. Specifically, a transistor that uses an oxide semiconductor for a semiconductor film can be used.

A 25-nm-thick film containing indium, gallium, and zinc can be used as the semiconductor film 508, for example.

A conductive film in which a 10-nm-thick film containing tantalum and nitrogen and a 300-nm-thick film containing copper are stacked can be used as the conductive film 504, for example. Note that the film containing copper includes a region; between the region and the insulating film 506, the film containing tantalum and nitrogen is positioned.

A stacked-layer film in which a 400-nm-thick film containing silicon and nitrogen and a 200-nm-thick film containing silicon, oxygen, and nitrogen are stacked can be used for the insulating film 506, for example. Note that the film containing silicon and nitrogen includes a region; between the region and the semiconductor film 508, the film containing silicon, oxygen, and nitrogen is positioned.

A conductive film in which a 50-nm-thick film containing tungsten, a 400-nm-thick film containing aluminum, and a 100-nm-thick film containing titanium are stacked in this order can be used as the conductive film 512A or the conductive film 512B, for example. Note that the film containing tungsten includes a region in contact with the semiconductor film 508.

This can inhibit blinks (also called flickers). Alternatively, the power consumption can be reduced. Alternatively, a moving image with quick movements can be smoothly displayed. Alternatively, a photograph and the like can be displayed with a wide range of grayscale. As a result, a novel display panel that is highly convenient or reliable can be provided.

A manufacturing line for a bottom-gate transistor that uses amorphous silicon as a semiconductor can be easily remodeled into a manufacturing line for a bottom-gate transistor that uses an oxide semiconductor as a semiconductor, for example. Furthermore, for example, a manufacturing line for a top-gate transistor that uses polysilicon as a semiconductor can be easily remodeled into a manufacturing line for a top-gate transistor that uses an oxide semiconductor as a semiconductor. In either remodeling, an existing manufacturing line can be effectively utilized.

<<Structure Example 3 of Semiconductor Film 508>>

For example, a compound semiconductor can be used as the semiconductor of the transistor. Specifically, a semiconductor containing gallium arsenide can be used.

For example, an organic semiconductor can be used as the semiconductor of the transistor. Specifically, an organic semiconductor containing polyacene or graphene can be used for a semiconductor film.

<<Structure Example 2 of Functional Layer 520>>

The functional layer 520 includes an insulating film 521, an insulating film 518, the insulating film 516, the insulating film 506, the insulating film 501C, and the like (see FIG. 5(A)).

The insulating film 521 includes a region positioned between the display element 550(*i,j*) and the insulating film 501C (see FIG. 5(A)).

The insulating film 518 includes a region positioned between the insulating film 521 and the insulating film 501C.

The insulating film 516 includes a region positioned between the insulating film 518 and the insulating film 501C.

The insulating film 506 includes a region positioned between the insulating film 516 and the insulating film 501C.

[Insulating Film 521]

An insulating inorganic material, an insulating organic material, or an insulating composite material containing an inorganic material and an organic material, for example, can be used for the insulating film 521.

Specifically, an inorganic oxide film, an inorganic nitride film, an inorganic oxynitride film, or the like, or a layered material in which a plurality of films selected from these films are stacked can be used as the insulating film 521.

For example, a film including a silicon oxide film, a silicon nitride film, a silicon oxynitride film, an aluminum oxide film, or the like, or a film including a layered material in which a plurality of films selected from these films are stacked can be used as the insulating film 521. Note that the silicon nitride film is a dense film and has an excellent function of inhibiting diffusion of impurities.

For example, for the insulating film 521, polyester, polyolefin, polyamide, polyimide, polycarbonate, polysiloxane, an acrylic resin, or the like, or a layered material, a composite material, or the like of a plurality of resins selected from these resins can be used. Alternatively, a photosensitive material may be used. Thus, the insulating film 521 can planarize a level difference due to various components overlapping with the insulating film 521, for example.

Note that polyimide is excellent in thermal stability, insulating property, toughness, low dielectric constant, low coefficient of thermal expansion, chemical resistance, and other properties compared with other organic materials. Accordingly, in particular, polyimide can be suitably used for the insulating film 521 or the like.

For example, a film formed using a photosensitive material can be used as the insulating film 521. Specifically, a film formed using photosensitive polyimide, a photosensitive acrylic resin, or the like can be used as the insulating film 521.

[Insulating Film 518]

The material that can be used for the insulating film 521, for example, can be used for the insulating film 518.

For example, a material that has a function of inhibiting diffusion of oxygen, hydrogen, water, an alkali metal, an alkaline earth metal, and the like can be used for the insulating film 518. Specifically, a nitride insulating film can be used as the insulating film 518. For example, silicon nitride, silicon nitride oxide, aluminum nitride, aluminum nitride oxide, or the like can be used for the insulating film 518. Thus, diffusion of impurities to a semiconductor film of a transistor can be inhibited.

[Insulating Film 516]

The material that can be used for the insulating film 521, for example, can be used for the insulating film 516.

Specifically, a film formed by a fabrication method different from that of the insulating film 518 can be used as the insulating film 516.

[Insulating Film 506 and Insulating Film 501D]

The material that can be used for the insulating film 521, for example, can be used for the insulating film 506 or the insulating film 501D.

Specifically, a film including a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, or a neodymium oxide film can be used as the insulating film 506.

[Insulating Film 501C]

The material that can be used for the insulating film 521, for example, can be used for the insulating film 501C. Specifically, a material containing silicon and oxygen can be used for the insulating film 501C. Thus, diffusion of impurities into the pixel circuit, the display element, or the like can be inhibited.

For example, the insulating film 501C adheres to the region 501B(12) of the intermediate layer 501B (see FIG. 4(A)). Specifically, the force with which the region 501B(12) adheres to the insulating film 501C is greater than the force with which the region 501B(11) adheres to the conductive film 519B(1).

For example, the adhesion force of the region 501B(12) and the adhesion force of the region 501B(11) are compared by the micro-scratch method defined by Japanese Industrial Standards JIS-R3255. Specifically, the pushing pressure of an indenter required to damage the region 501B(11) is lower than the pushing pressure of the indenter required to damage the region 501B(12). For example, the indenter is moved from the region 501B(12) to the region 501B(11), and the damageability is compared.

<Structure Example 2 of Display Panel 700>

The display panel 700 includes the base material 510, the base material 770, and a sealant 705 (see FIG. 5(A)).

<<Base Material 510 and Base Material 770>>

A light-transmitting material can be used for the base material 510 or the base material 770.

For example, a material with a thickness less than or equal to 0.7 mm and greater than or equal to 0.1 mm can be used. Specifically, a material polished to a thickness of approximately 0.1 mm can be used. As a result, the weight can be reduced.

For example, a glass substrate of the 6th generation (1500 mm×1850 mm), the 7th generation (1870 mm×2200 mm), the 8th generation (2200 mm×2400 mm), the 9th generation (2400 mm×2800 mm), the 10th generation (2950 mm×3400 mm), or the like can be used as the base material 510 or the base material 770. Thus, a large-sized display device can be manufactured.

For the base material 510 or the base material 770, an organic material, an inorganic material, a composite material of an organic material and an inorganic material or the like, or the like can be used.

For example, an inorganic material such as glass, ceramic, or a metal can be used. Specifically, non-alkali glass, soda-lime glass, potash glass, crystal glass, aluminosilicate glass, tempered glass, chemically tempered glass, quartz, sapphire, or the like can be used for the base material 510 or the base material 770. Alternatively, aluminosilicate glass, tempered glass, chemically tempered glass, sapphire, or the like can be suitably used for the base material 510 or the base material 770 that is provided on the side close to a user of the display panel. Thus, the display panel can be prevented from being broken or damaged by the use thereof.

Specifically, an inorganic oxide film, an inorganic nitride film, an inorganic oxynitride film, or the like can be used. For example, a silicon oxide film, a silicon nitride film, a silicon oxynitride film, an aluminum oxide film, or the like can be used. Stainless steel, aluminum, or the like can be used for the base material 510 or the base material 770.

For example, a single crystal semiconductor substrate of silicon or silicon carbide, a polycrystalline semiconductor substrate, a compound semiconductor substrate of silicon germanium or the like, an SOI substrate, or the like can be used as the base material 510 or the base material 770. Thus, a semiconductor element can be formed over the base material 510 or the base material 770.

For example, an organic material such as a resin, a resin film, or plastic can be used for the base material 510 or the base material 770. Specifically, a resin film or a resin plate of polyester, polyolefin, polyamide, polyimide, polycarbonate, an acrylic resin, or the like can be used. As a result, the weight can be reduced. Alternatively, for example, the frequency of occurrence of breakage due to dropping or the like can be reduced.

For example, a composite material formed by attaching a metal plate, a thin glass plate, or a film of an inorganic material or the like to a resin film or the like can be used for the base material 510 or the base material 770. For example, a composite material formed by dispersing a fibrous or particulate metal, glass, an inorganic material, or the like into a resin film can be used. For example, a composite material formed by dispersing a fibrous or particulate resin, an organic material, or the like into an inorganic material can be used.

Furthermore, a single-layer material or a material in which a plurality of layers are stacked can be used for the base material 510 or the base material 770. For example, a material in which a base, an insulating film that prevents diffusion of impurities contained in the base, and the like are stacked can be used. Specifically, a material in which glass and one or a plurality of films selected from a silicon oxide layer, a silicon nitride layer, a silicon oxynitride layer, and the like that prevent diffusion of impurities contained in the glass are stacked can be used. Alternatively, a material in which a resin and a silicon oxide film, a silicon nitride film, a silicon oxynitride film, or the like that prevents diffusion of impurities that penetrate the resin are stacked can be used.

Specifically, a material containing polyester, polyolefin, polyamide (nylon, aramid, or the like), polyimide, polycarbonate, polyurethane, an acrylic resin, an epoxy resin, or a resin having a siloxane bond, such as silicone, can be used for the base material 510 or the base material 770. For example, a resin film, a resin plate, a stacked-layer material, or the like containing any of these materials can be used.

Specifically, polyethylene terephthalate (PET), polyethylene naphthalate (PEN), polyethersulfone (PES), a cycloolefin polymer (COP), a cycloolefin copolymer (COC), or the like can be used for the base material 510 or the base material 770. Note that a cycloolefin polymer film and a cycloolefin copolymer film have low water absorbability, excellent dimensional stability, and excellent transparency. Thus, such a material can be favorably used as a base material of the display panel, and a flexible display panel can be achieved. Alternatively, reliability can be improved. In addition, a cycloolefin polymer film and a cycloolefin copolymer film have low birefringence. This enables the use in combination with another functional film such as a circular polarizing plate or a polarizing plate.

Furthermore, paper, wood, or the like can be used for the base material 510 or the base material 770.

For example, a flexible material can be used for the base material 510 or the base material 770.

A material whose surface on one side is provided with an antireflective film with a thickness of 1 μm or less can be used. Specifically, a stacked-layer film in which three or more layers, preferably five or more layers, more preferably 15 or more layers of dielectrics are stacked can be used for the base material 770. This allows the reflectivity to be as low as 0.5% or less, preferably 0.08% or less.

For example, a material having heat resistance high enough to withstand heat treatment in the manufacturing process can be used for the base material 510 or the base material 770.

Specifically, a material that is resistant to heat applied in the process of directly forming the transistor, the capacitor, or the like can be used for the base material 510 or the base material 770. Alternatively, a method in which a transistor, a capacitor, or the like is formed on a substrate which is for use in the process and has heat resistance to heat applied in the manufacturing process, and the formed transistor, capacitor, or the like is transferred to the base material 510 or the base material 770, for example, can be used. Accordingly, a transistor, a capacitor, or the like can be formed on a flexible substrate, for example.

<<Sealant 705>>

The sealant 705 includes a region positioned between the functional layer 520 and the base material 770 and has a function of bonding the functional layer 520 and the base material 770 together.

An inorganic material, an organic material, a composite material of an inorganic material and an organic material, or the like can be used for the sealant 705.

For example, an organic material such as a thermally fusible resin or a curable resin can be used for the sealant 705.

For example, an organic material such as a reactive curable adhesive, a photocurable adhesive, a thermosetting adhesive, and/or an anaerobic adhesive can be used for the sealant 705.

Specifically, an adhesive containing an epoxy resin, an acrylic resin, a silicone resin, a phenol resin, a polyimide resin, an imide resin, a PVC (polyvinyl chloride) resin, a PVB (polyvinyl butyral) resin, an EVA(ethylene vinyl acetate) resin, or the like can be used for the sealant 705.

<Structure Example 3 of Display Panel 700>

The display panel 700 includes a functional layer 720 (see FIG. 5(A)).

<<Functional Layer 720>>

A functional layer 720 includes a coloring film CF1, an insulating film 771, and a light-blocking film BM.

The coloring film CF1 includes a region positioned between the base material 770 and the display element 550($i,j$).

The light-blocking film BM has an opening portion in a region overlapping with the pixel 702($i,j$).

<Structure Example 4 of Display Panel 700>

The display panel 700 includes a functional film 770P (see FIG. 5(A)).

<<Functional Film 770P and the Like>>

The functional film 770P includes a region overlapping with the display element 550($i,j$).

An anti-reflection film, a polarizing film, a retardation film, a light diffusion film, a condensing film, or the like can be used as the functional film 770P, for example.

Specifically, a circularly polarizing film can be used as the functional film 770P.

Furthermore, an antistatic film suppressing the attachment of a dust, a water repellent film suppressing the attachment of a stain, an antireflective film (anti-reflection film), a non-glare film (anti-glare film), a hard coat film suppressing generation of a scratch in use, or the like can be used as the functional film 770P.

<Structure Example 5 of Display Panel 700>

The display panel 700 also includes an insulating film 528 (see FIG. 5(A)).

<<Insulating Film 528>>

An insulating film 528 includes a region positioned between the insulating film 521 and the base material 770 and has an opening portion overlapping with the display element 550($i,j$) (see FIG. 5(A)).

The material that can be used for the insulating film 521, for example, can be used for the insulating film 528. Specifically, a silicon oxide film, a film containing an acrylic resin, or a film containing polyimide can be used as the insulating film 528.

<<Structure Example 1 of Display Element 550($i,j$)>>

The display element 550($i,j$) has a function of emitting light.

The display element 550($i,j$) includes a layer 553($j$) including a light-emitting material (see FIG. 5(A)).

A display element having a function of emitting light, for example, can be used as the display element 550($i,j$). Specifically, an organic electroluminescence element, an inorganic electroluminescence element, a light-emitting diode, a QDLED (Quantum Dot LED), or the like can be used as the display element 550($i,j$).

<<Structure Example 1 of Layer 553(j) Containing Light-Emitting Material>>

A belt-like layered material that is long in the column direction along the signal line S2(j) can be used for the layer 553(j) including a light-emitting material, for example.

Specifically, materials emitting light with different hues can be used for the layer 553(j) including a light-emitting material, the layer 553(j+1) including a light-emitting material, and the layer 553(j+2) including a light-emitting material. Thus, for example, the hue of the light emitted from the display element 550(i,j) can be different between columns.

For example, a material that emits blue light, a material that emits green light, and a material that emits red light can be used for the materials emitting light with different hues.

<<Structure Example 2 of Layer 553(j) Containing Light-Emitting Material>>

A layered material stacked to emit white light can be used for the layer 553(j) including a light-emitting material, for example.

Specifically, materials which emit light with different hues can be used for the layer 553(j) including a light-emitting material.

Specifically, a layered material in which a layer including a light-emitting material including a fluorescent material that emits blue light, and a layer containing materials that are other than a fluorescent material and that emit green light and red light or a layer containing a material that is other than a fluorescent material and that emits yellow light are stacked can be used for the layer 553(j) including a light-emitting material. Alternatively, a stacked-layer material in which a layer containing a material that is other than a fluorescent material and that emits yellow light is stacked can be used for the layer 553(j) including a light-emitting material.

A light-emitting unit can be used for the layer 553(j) including a light-emitting material, for example. The light-emitting unit includes one region where electrons injected from one side are recombined with holes injected from the other side. The light-emitting unit contains a light-emitting material, and the light-emitting material releases energy generated by recombination of electrons and holes as light.

A plurality of light-emitting units and an intermediate layer can be used for the layer 553(j) including a light-emitting material, for example. The intermediate layer includes a region positioned between two light-emitting units. The intermediate layer includes a charge-generation region and has functions of supplying holes to the light-emitting unit provided on the cathode side and supplying electrons to the light-emitting unit provided on the anode side. Furthermore, a structure including a plurality of light-emitting units and an intermediate layer is referred to as a tandem light-emitting element in some cases.

For example, a light-emitting unit including a material emitting light with one hue and a light-emitting unit including a material emitting light with a different hue can be used for the layer 553(j) including a light-emitting material.

For example, a high molecular compound (e.g., an oligomer, a dendrimer, or a polymer), a middle molecular compound (a compound between a low molecular compound and a high molecular compound with a molecular weight greater than or equal to 400 and less than or equal to 4000), or the like can be used for the layer 553(j) including a light-emitting material.

<<Electrode 551(i,j) and Electrode 552>>

An electrode 551(i,j) is electrically connected to the pixel circuit 530(i,j) in an opening portion 591A (see FIG. 5(A)).

The electrode 551(i,j) is provided with the insulating film 528 in the periphery. In other words, the insulating film 528 has an opening portion, and the electrode 551(i,j) overlaps with the opening portion. Thus, a short circuit between the electrode 551(i,j) and an electrode 552 can be prevented.

For example, the material that can be used for the wiring or the like can be used for the electrode 551(i,j) or an electrode 552. Specifically, a material that has a visible-light-transmitting property can be used for the electrode 551(i,j) or the electrode 552.

For example, a conductive oxide, a conductive oxide containing indium, indium oxide, indium tin oxide, indium zinc oxide, zinc oxide, zinc oxide to which gallium is added, or the like can be used. Alternatively, a metal film thin enough to transmit light can be used. Alternatively, a material that has a visible-light-transmitting property can be used.

For example, a metal film that transmits part of light and reflects another part of the light can be used for the electrode 551(i,j) or the electrode 552. Thus, for example, the distance between the electrode 551(i,j) and the electrode 552 can be adjusted. Alternatively, a microcavity structure can be provided in the display element 550(i,j). Alternatively, light of a predetermined wavelength can be extracted more efficiently than other light. Alternatively, light with a narrow half width of a spectrum can be extracted. Alternatively, light of a bright color can be extracted.

For example, a film that reflects light efficiently can be used for the electrode 551(i,j) or the electrode 552. Specifically, a material containing silver, palladium, and the like or a material containing silver, copper, and the like can be used for the metal film.

<<Structure Example 2 of Display Region 231>>

The display region 231 includes one group of a pixel 702(i, 1) to a pixel 702(i,n), another one group of a pixel 702(1,j) to a pixel 702(m,j), a scan line G2(i), and a signal line S2(i) (see FIG. 19).

The one group of the pixel 702(i, 1) to the pixel 702(i,n) includes a pixel 702(i,j) and is arranged in a row direction (the direction indicated by an arrow R1 in the diagram).

The another one group of the pixel 702(1,j) to the pixel 702(m,j) includes the pixel 702(i,j) and is arranged in the column direction (the direction indicated by an arrow C1 in the diagram) that intersects the row direction.

The scan line G2(i) is electrically connected to the one group of pixel 702(i, 1) to the pixel 702(i,n).

The signal line S2(i) is electrically connected to the another one group of the pixel 702(1,j) to the pixel 702(m,j).

Thus, image data can be supplied to a plurality of pixels. Alternatively, the image data can be displayed. As a result, a novel display panel that is highly convenient or reliable can be provided. As a result, a novel display panel that is highly convenient or reliable can be provided.

<Structure Example 6 of Display Panel 700>

The display panel 700 described in this embodiment includes a plurality of pixels. The plurality of pixels have a function of displaying colors with different hues. Alternatively, colors with hues that cannot be displayed by each of the plurality of pixels can be displayed by additive color mixture with the use of the plurality of pixels.

<<Structure Example 2 of Pixel 702(i,j)>>

Note that when a plurality of pixels capable of displaying colors with different hues are used for color mixture, each of the pixels can be rephrased as a subpixel. In addition, a set of subpixels can be rephrased as a pixel.

Figure 1C:
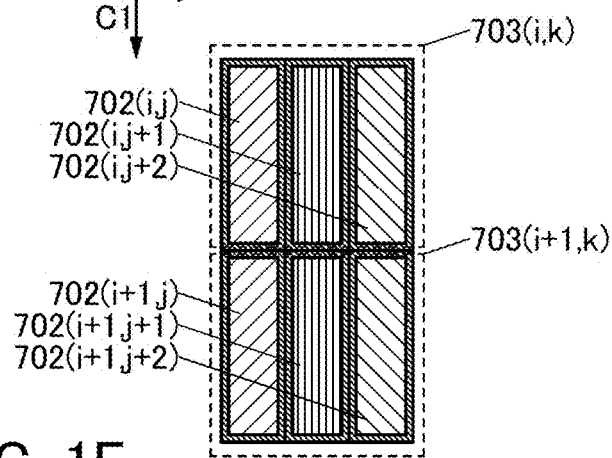
Figure 1D:
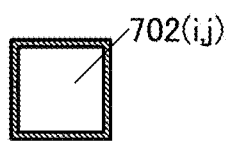

For example, the pixel 702(*i,j*) can be rephrased as a subpixel, and a set of the pixel 702(*i,j*), a pixel 702(*i,j*+1), and a pixel 702(*i,j*+2) can be rephrased as a pixel 703(*i,k*) (see FIG. 1(C)).

Figure 1E:
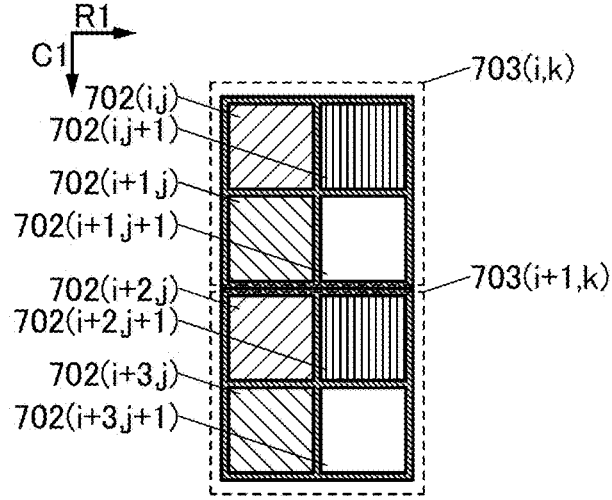

Alternatively, the pixel 702(*i,j*) can be rephrased as a subpixel, and a set of the pixel 702(*i,j*), a pixel 702(*i,j*+1), a pixel 702(*i*+1,*j*), and a pixel 702(*i*+1,*j*+1) can be rephrased as a pixel 703(*i,k*) (see FIG. 1(E)).

Specifically, a set of a subpixel that displays blue, a subpixel that displays green, and a subpixel that displays red can be used as the pixel 703(*i,k*). A set of a subpixel that displays cyan, a subpixel that displays magenta, and a subpixel that displays yellow can be used as the pixel 703(*i,k*).

Furthermore, the above set to which a subpixel that displays white or the like is added can be used as the pixel, for example.

<<Structure Example 7 of Display Panel 700>>

The display region 231 includes the pixel 702(*i,j*), the pixel 702(*i,j*+1), and the pixel 702(*i,j*+2) (see FIG. 1(C)).

The pixel 702(*i,j*) displays a color that has a chromaticity x higher than 0.680 and lower than or equal to 0.720 and a chromaticity y higher than or equal to 0.260 and lower than or equal to 0.320 in the CIE1931 chromaticity coordinates.

The pixel 702(*i,j*+1) displays a color that has a chromaticity x higher than or equal to 0.130 and lower than or equal to 0.250 and a chromaticity y higher than 0.710 and lower than or equal to 0.810 in the CIE 1931 chromaticity coordinates.

The pixel 702(*i,j*+2) displays a color that has a chromaticity x higher than or equal to 0.120 and lower than or equal to 0.170 and a chromaticity y higher than or equal to 0.020 and lower than 0.060 in the CIE 1931 chromaticity coordinates.

The pixel 702(*i,j*), the pixel 702(*i,j*+1), and the pixel 702(*i,j*+2) are provided so that the area ratio of their color gamut to the BT.2020 color gamut in the CIE chromaticity diagram (x,y) is higher than or equal to 80%, or alternatively, the color gamut coverage is higher than or equal to 75%. Preferably, they are provided so that the area ratio is higher than or equal to 90%, or alternatively, the coverage is higher than or equal to 85%.

<Structure Example 8 of Display Panel 700>

The display panel 700 described in this embodiment can include a plurality of driver circuits. For example, a driver circuit GDA, a driver circuit GDB, or a driver circuit SD can be included (see FIG. 19).

<<Driver Circuit GDA and Driver Circuit GDB>>

For example, the driver circuit GDA and the driver circuit GDB can be used as the driver circuit GD. Specifically, the driver circuit GDA and the driver circuit GDB have a function of supplying a selection signal on the basis of control data.

For example, the driver circuit GDA and the driver circuit GDB have a function of supplying a selection signal to one scan line at a frequency of 30 Hz or higher, preferably 60 Hz or higher, on the basis of the control data. Accordingly, a moving image can be smoothly displayed.

For example, the driver circuit GDA and the driver circuit GDB have a function of supplying a selection signal to one scan line at a frequency lower than 30 Hz, preferably lower than 1 Hz, further preferably less than once a minute, on the basis of the control data. Accordingly, an image can be displayed in a stationary state where flickering is reduced.

In the case where a plurality of driver circuits are provided, for example, the frequency at which the driver circuit GDA supplies a selection signal and the frequency at which the driver circuit GDB supplies a selection signal can be made different from each other. Specifically, the selection signal can be supplied at a higher frequency to a region on which a moving image is displayed than to a region on which a still image is displayed. Accordingly, an image can be displayed on a region in a stationary state where flickering is reduced, and a moving image can be smoothly displayed on another region.

A bottom-gate transistor, a top-gate transistor, or the like can be used in the driver circuit GD, for example. Specifically, a transistor MD can be used in the driver circuit GD (see FIG. 6).

<<Driver Circuit SD>>

The driver circuit SD has a function of generating an image signal on the basis of data V11 and a function of supplying the image signal to a pixel circuit electrically connected to one display element (see FIG. 19).

A variety of sequential circuits or the like, such as a shift register, can be used as the driver circuit SD, for example.

For example, an integrated circuit formed on a silicon substrate can be used as the driver circuit SD.

An integrated circuit can be connected to a terminal by a COG (Chip on Glass) method or a COF (Chip on Film) method, for example. Specifically, an anisotropic conductive film can be used to connect an integrated circuit to a terminal.

Note that this embodiment can be combined with other embodiments in this specification as appropriate.

Embodiment 3

In this embodiment, methods of manufacturing a display panel including an electrical module of one embodiment of the present invention are described with reference to FIG. 7 to FIG. 13.

Figure 7:
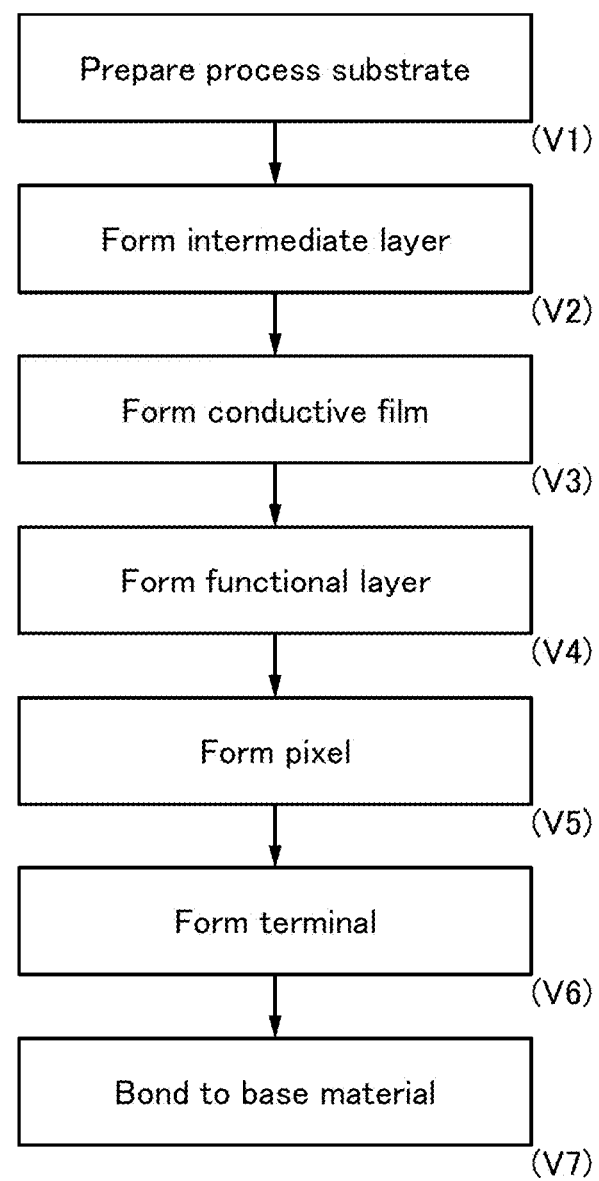
FIG. 7 is a flow diagram showing a method of manufacturing a display panel according to an embodiment.

FIG. 7 is a flow chart showing a method of manufacturing a display panel including an electrical module of one embodiment of the present invention.

FIG. 8 is a diagram showing the method of manufacturing a display panel including an electrical module of one embodiment of the present invention. FIG. 8(A) to FIG. 8(C) are cross-sectional views along the cutting lines X1-X2, X3-X4, and X9-X10 in FIG. 1(A). FIG. 8(D) is a cross-sectional view showing part of FIG. 8(C).

Figure 9A:
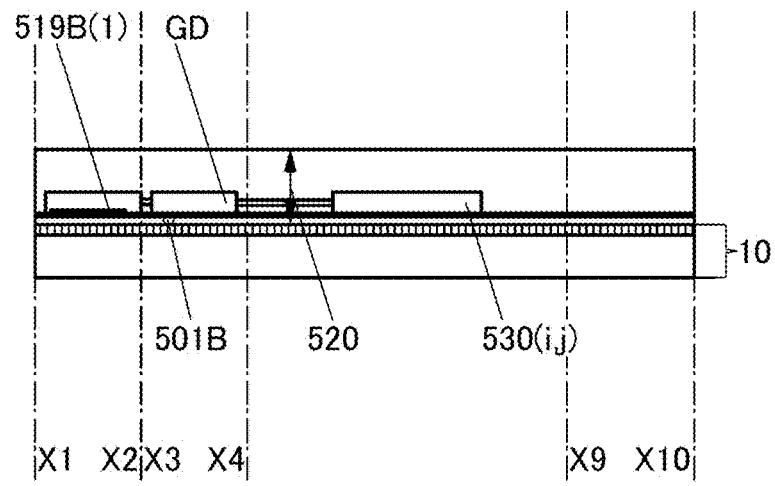
FIGS. 9A-9C are cross-sectional views showing a method of manufacturing a display panel according to an embodiment.
Figure 9B:
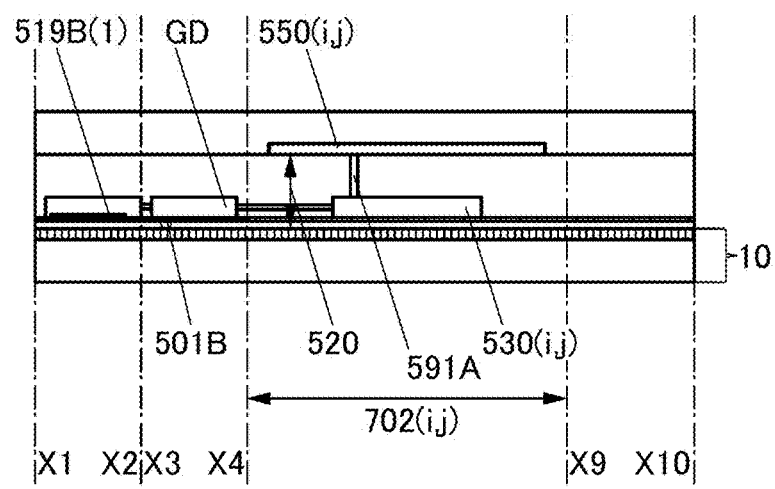
Figure 9C:
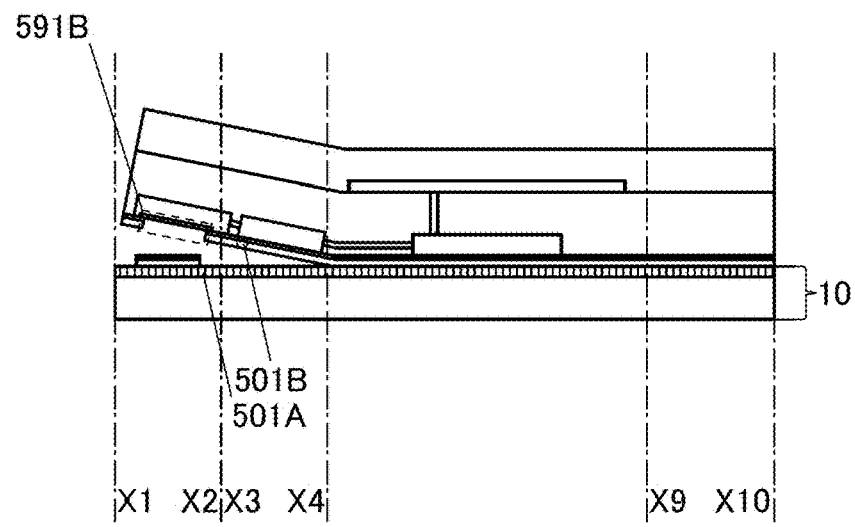

FIG. 9 is a cross-sectional view showing the method of manufacturing a display panel including an electrical module of one embodiment of the present invention. FIG. 9(A) to FIG. 9(C) are cross-sectional views along the cutting lines X1-X2, X3-X4, and X9-X10 in FIG. 1(A).

Figure 10A:
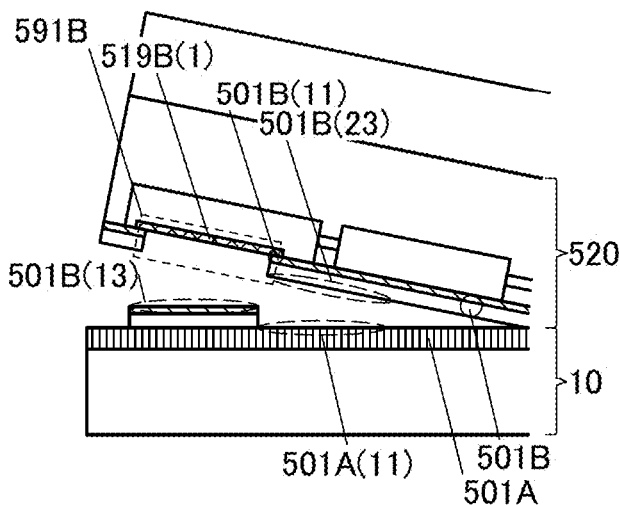
FIGS. 10A-10C are cross-sectional views showing a method of manufacturing a display panel according to an embodiment.
Figure 10B:
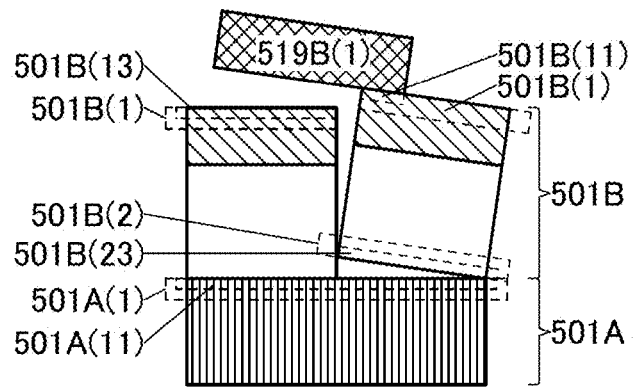
Figure 10C:
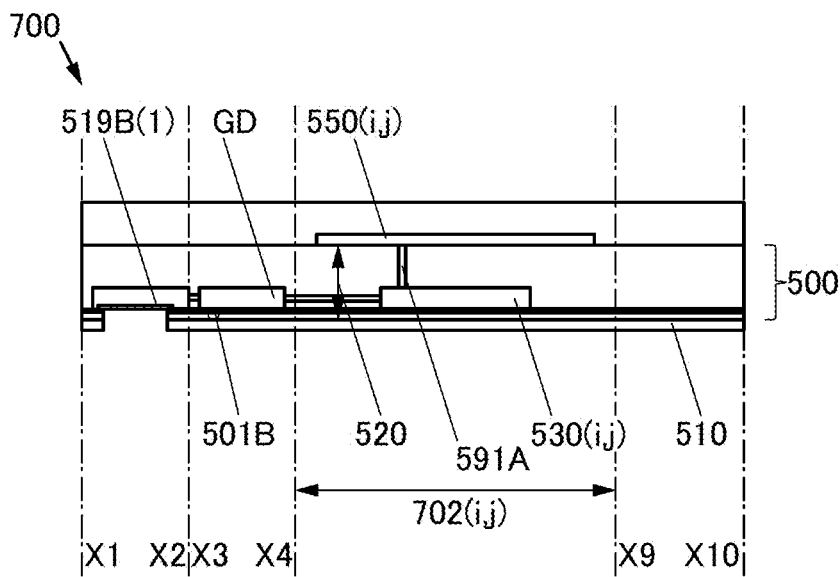

FIG. 10 is a cross-sectional view showing the method of manufacturing a display panel including an electrical module of one embodiment of the present invention. FIG. 10(A) is a diagram showing part of FIG. 9(C), FIG. 10(B) is a cross-sectional view showing part of FIG. 10(A), and FIG. 10(C) is a cross-sectional view of the display panel including an electrical module.

Figure 11A:
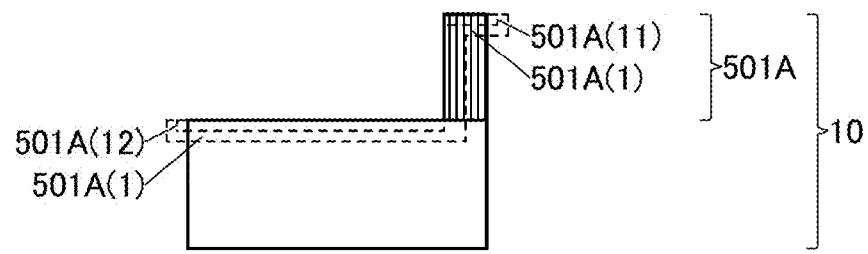
FIGS. 11A-11C are cross-sectional views showing a method of manufacturing a terminal portion of a display panel according to an embodiment.
Figure 11B:
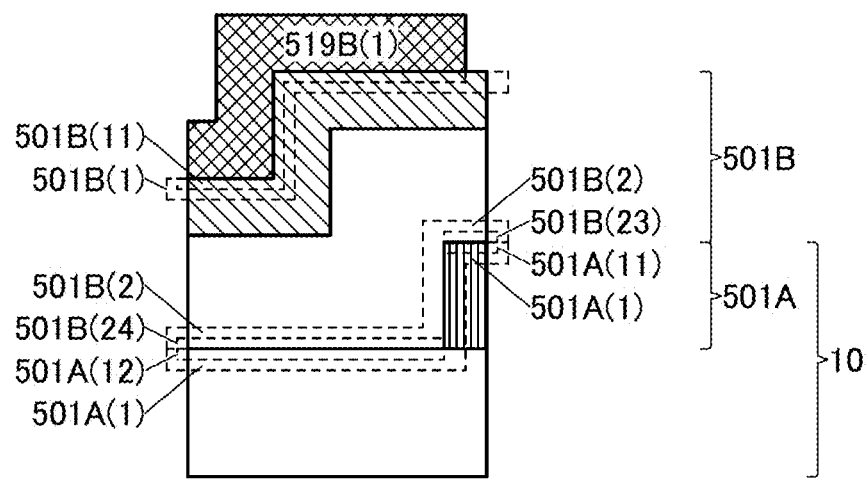
Figure 11C:
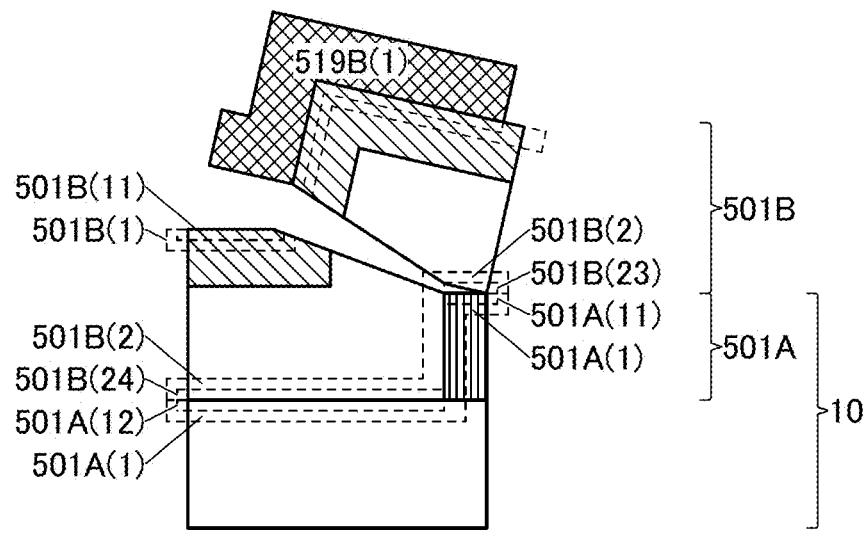

FIG. 11 is a cross-sectional view showing the method of manufacturing a display panel including an electrical module of one embodiment of the present invention. FIG. 11(A) is a cross-sectional view showing part of a structure of a process substrate different from that in FIG. 8(A). FIG. 11(B) is a cross-sectional view showing part of a structure of a processed member different from that in FIG. 8(D). FIG. 11(C) is a cross-sectional view showing part of a structure of a processed member different from that in FIG. 10(B).

FIG. 12 is a cross-sectional view showing the method of manufacturing a display panel including an electrical module of one embodiment of the present invention. FIG. 12(A) to FIG. 12(C) are cross-sectional views along the cutting lines X1-X2, X3-X4, and X9-X10 in FIG. 1(A).

Figure 12A:
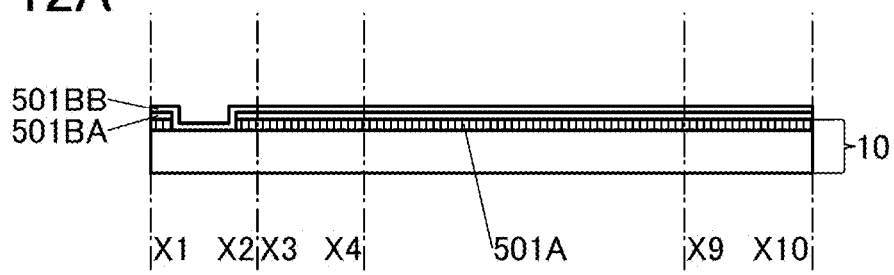
FIGS. 12A-12D are cross-sectional views showing a method of manufacturing a display panel according to an embodiment.
Figure 12B:
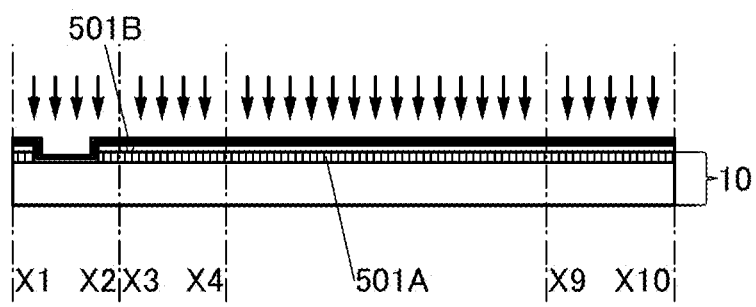
Figure 12C:
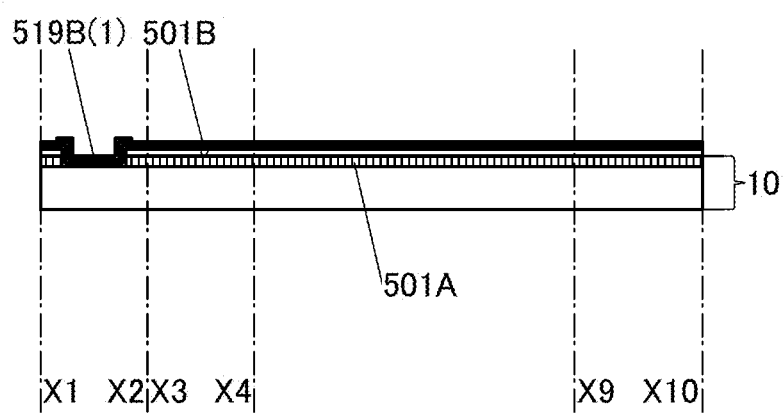
Figure 12D:
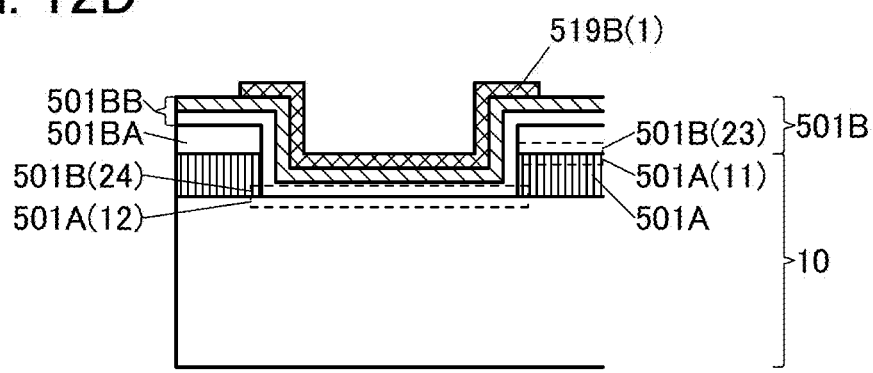

FIG. 12(D) is a cross-sectional view showing part of FIG. 12(C).

Figure 13A:
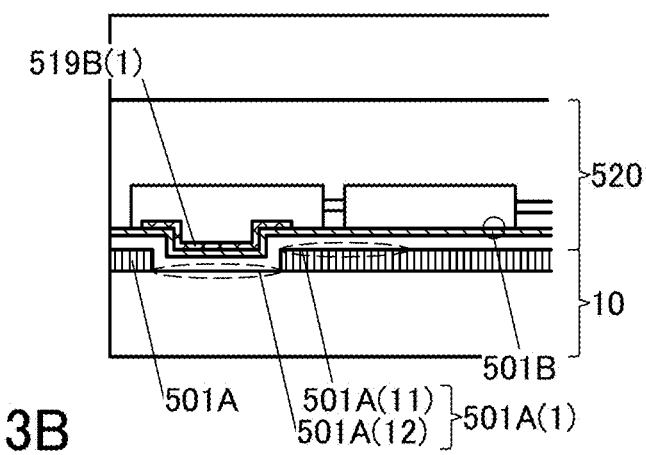
FIGS. 13A-13C are cross-sectional views showing a method of manufacturing a terminal portion of a display panel according to an embodiment and showing part of a processed member.
Figure 13B:
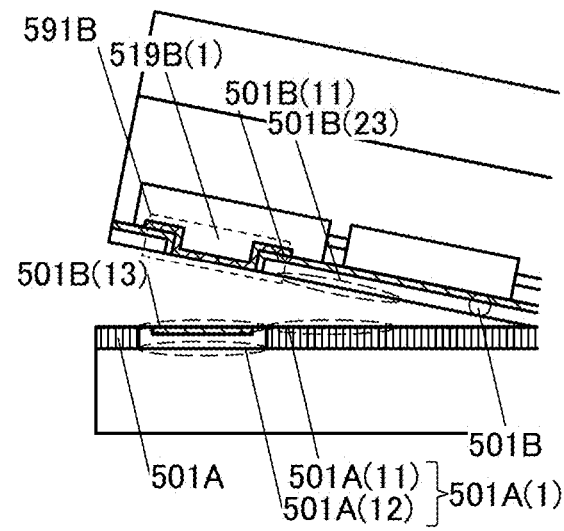
Figure 13C:
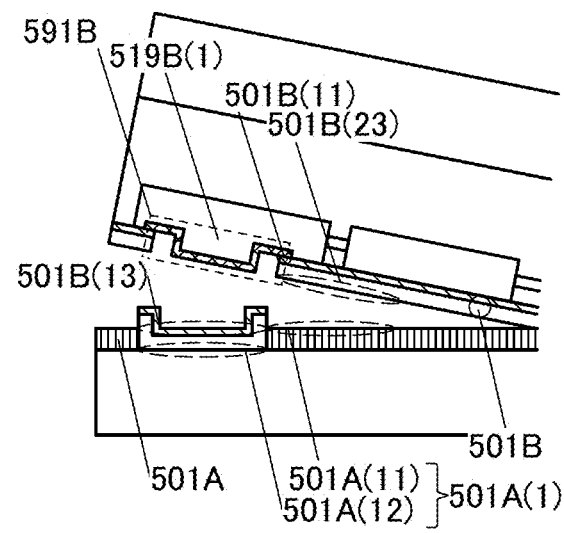

FIG. 13 is a cross-sectional view showing a method of manufacturing a display panel of one embodiment of the present invention. FIG. 13(A) to FIG. 13(C) show part of a processed member.

<Method 1 of Manufacturing Display Panel Including Electrical Module>

The method of manufacturing a display panel including an electrical module described in this embodiment includes the following seven steps (see FIG. 7).

Note that a first step to a fourth step and a sixth step that are extracted from the above seven steps can be referred to as a method of manufacturing an electrical module, which includes a first process (including the first step to the fourth step) of preparing a processed member including a process substrate and a functional layer and a second process (including the sixth step) of separating the functional layer from the process substrate.

[First Step]

Figure 8A:
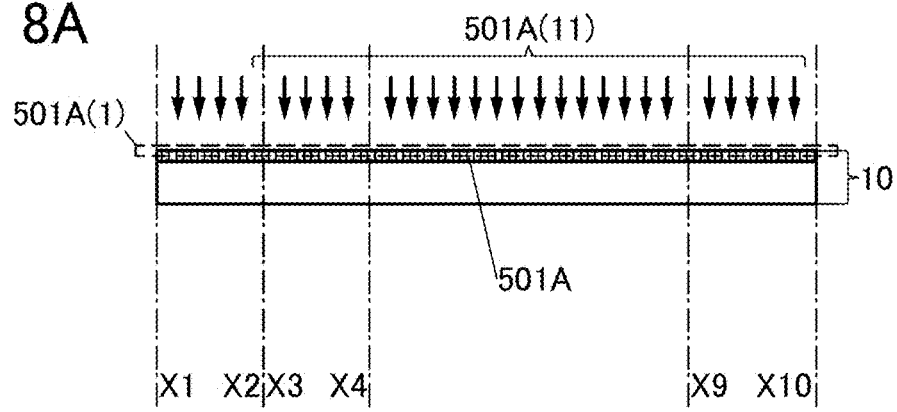
FIGS. 8A-8D are cross-sectional views showing a method of manufacturing a display panel according to an embodiment.

In the first step, a process substrate 10 is prepared (see FIG. 7(V1) and FIG. 8(A)).

The process substrate 10 includes a functional surface 501A(1). For example, a glass substrate including a film 501A can be used as the process substrate 10, and a surface of the film 501A can be used as the functional surface 501A(1) (see FIG. 8(A)).

The functional surface 501A(1) includes an active region 501A(11). For example, the entire surface or part of the functional surface 501A(1) can be used as the active region 501A(11). Note that a portion of the functional layer 520 that overlaps with the active region 501A(11), which is formed in a later step, can be separated from the process substrate 10.

For example, a film including tungsten and oxygen can be used as the film 501A. Alternatively, a film including titanium and oxygen can be used as the film 501A.

For example, the film 501A can be formed in such a manner that a film including tungsten or titanium is formed by a sputtering method and a surface is treated with plasma using a gas including oxygen.

Specifically, the film 501A can be formed in such a manner that 30-nm-thick tungsten is formed over a glass substrate and a surface is treated with plasma using a gas including nitrous oxide ($N_2O$).

Alternatively, a film including a resin can be used as the film 501A. Specifically, a film including polyimide, polyester, polyolefin, polyamide, polycarbonate, an acrylic resin, or the like can be used as the film 501A. Alternatively, a surface of the film 501A, which is in contact with the glass substrate, can be used as the functional surface 501A(1).

For example, a film including a resin can be formed with a knife coater, a slit coater, or the like. Specifically, the glass substrate is coated with a polyimide varnish with a slit coater, whereby a 10-μm-thick polyimide film can be formed.

[Second Step]

Figure 8B:
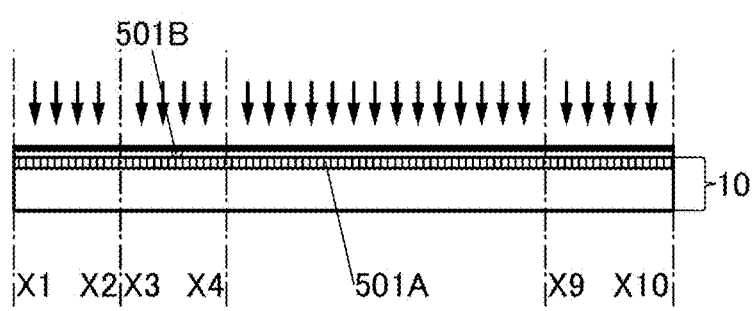

In the second step, the intermediate layer 501B is formed (see FIG. 7(V2) and FIG. 8(B)).

Figure 8C:
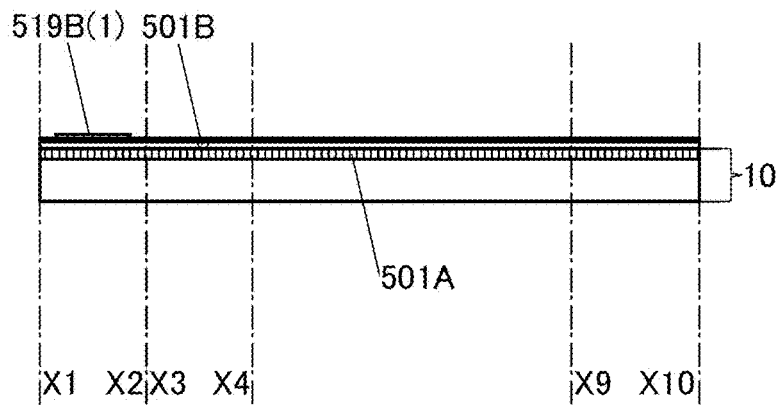
Figure 8D:
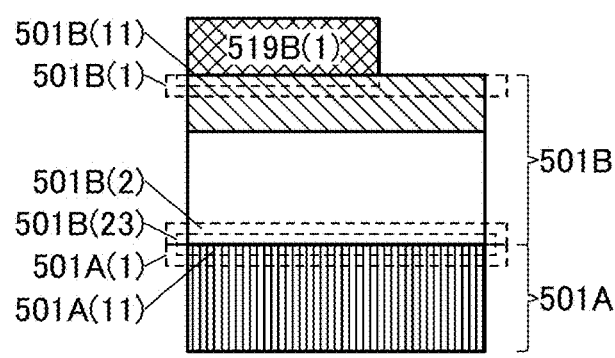

The intermediate layer 501B includes, the surface 501B (1) and the surface 501B(2) (see FIG. 4(A) and FIG. 8(D)).

The surface 501B(1) includes the region 501B(11).

The surface 501B(2) is opposite to the surface 501B(1) and includes a region 501B(23). The region 501B(23) is in contact with the active region 501A(11) (see FIG. 8(D) and FIG. 10(A)).

For example, a film having a function of supplying hydrogen by heating can be used as the intermediate layer 501B. While being heated, the intermediate layer 501B supplies hydrogen to an interface between the surface 501B (2) and the functional surface 501A(1). Alternatively, hydrogen supplied to the interface facilitates separation of the intermediate layer 501B from the process substrate 10. Alternatively, while being heated, the intermediate layer 501B supplies hydrogen to an interface between the surface 501B(1) and the conductive film 519B(1). Alternatively, hydrogen supplied to the interface facilitates separation of the intermediate layer 501B from the conductive film 519B (1).

For example, a film including silicon, oxygen, and nitrogen can be used as the intermediate layer 501B. Specifically, the intermediate layer 501B can be formed by a chemical vapor deposition method. In addition, a surface treated with plasma or the like using a predetermined gas can be used as the surface 501B(1).

When titanium is used for the conductive film 519B(1) formed later, the surface 501B(1) is treated with plasma using a gas including fluorine, for example. Alternatively, when tungsten is used, the surface 501B(1) is treated with plasma using a gas including oxygen, for example.

Specifically, the intermediate layer 501B including the surface 501B(1) is formed in such a manner that a film including silicon, oxygen, and nitrogen is formed to a thickness of 135 nm and a surface is treated with plasma using a gas including sulfur hexafluoride.

[Third Step]

In a third step, the conductive film 519B(1) is formed (see FIG. 7(V3), FIG. 8(C), and FIG. 8(D)). Accordingly, the region 501B(11) of the intermediate layer 501B is in contact with the conductive film 519B(1).

For example, a film including titanium or tungsten can be used as the conductive film 519B(1).

Specifically, 100-nm-thick titanium can be formed by a sputtering method.

[Fourth Step]

In the fourth step, the functional layer 520 is formed (see FIG. 7(V4) and FIG. 9(A)). Note that the functional layer 520 includes the conductive film 519B(1) and the intermediate layer 501B. The functional layer 520 also includes the driver circuit GD and the pixel circuit 530(i,j).

For example, a thin film is formed by a sputtering method, a chemical vapor deposition method, or the like and then the thin film can have a predetermined shape by an etching method. Alternatively, a predetermined element can be formed by stacking the thin films.

[Fifth Step]

In a fifth step, the pixel 702(i,j) is formed (see FIG. 7(V5) and FIG. 9(B)). Note that the pixel 702(i,j) includes the pixel circuit 530(i,j) and the display element 550(i,j).

For example, the display element 550(i,j) is formed with an evaporation apparatus or the like. Note that the display element 550(i,j) is electrically connected to the pixel circuit 530(i,j) in the functional layer 520 through the opening portion 591A.

[Sixth Step]

In the sixth step, the opening portion 591B is formed in the intermediate layer 501B, and the terminal 519B (not illustrated) is formed (see FIG. 7(V6) and FIG. 9(C)). For example, the opening portion 591B and the terminal 519 are formed while part of the intermediate layer 501B is separated from the process substrate 10.

Specifically, the functional layer 520 or the process substrate 10 is bent, and at the region 501B(11), the intermediate layer 501B is separated from the conductive film 519B(1) (see FIG. 10(A) and FIG. 10(B)). Also at the region 501B (23), the intermediate layer 501B is separated from the active region 501A(11). Note that both the functional layer 520 and the process substrate 10 may be bent.

Consequently, part of the intermediate layer 501B that is in contact with the conductive film 519B(1) is not only separated from the conductive film 519B(1) but also separated from the other portion of the intermediate layer 501B. That is, the part of the intermediate layer 501B is removed from the intermediate layer 501B. Alternatively, the opening portion 591B is formed in the intermediate layer 501B. Alternatively, the part of the intermediate layer 501B is separated together with the process substrate 10 from the functional layer 520. Note that the part of the intermediate layer 501B includes a region 501B(13), and the region 501B(13) is part of the region 501B(11) before being separated from the conductive film 519B(1) (see FIG. 8(D)).

Thus, in the second step, the intermediate layer can be separated from the conductive film and the intermediate layer can be separated from the active region. Alternatively, the opening portion 591B can be formed in the intermediate layer.

[Seventh Step]

In a seventh step, the intermediate layer 501B is bonded to the base material 510 (see FIG. 7(V7) and FIG. 10(C)). For example, the intermediate layer 501B and the base material 510 can be bonded using a bonding layer 505.

Thus, the display panel including the electrical module described in Embodiment 2 can be manufactured.

<Method 2 of Manufacturing Display Panel Including Electrical Module>

Another method of manufacturing a display panel including an electrical module of one embodiment of the present invention is described with reference to FIG. 11 and FIG. 13.

Another manufacturing method shown in this embodiment is different from the manufacturing method described with reference to FIG. 7 to FIG. 10 in that the process substrate 10 including an inert region 501A(12) is used. Different portions will be described in detail here, and refer to the above description for portions that can use similar structures.

[Modification Example of First Step]

In the first step, the process substrate 10 with the functional surface 501A(1) including the active region 501A(11) and the inert region 501A(12) is prepared (see FIG. 7(V1) and FIG. 11(A)).

For example, a region where the film 501A is formed can be used as the active region 501A(11) and a region where the film 501A is not formed can be used as the inert region 501A(12).

For example, the active region 501A(11) and the inert region 501A(12) can be formed by processing the film 501A into a predetermined shape by an etching method. Specifically, a plurality of inert regions 501A(12) can be placed at intervals of 10 μm.

Thus, the active region 501A(11) from which the intermediate layer 501B is easily separated can be placed in the functional surface 501A(1). Alternatively, the inert region 501A(12) from which the intermediate layer 501B is not easily separated can be placed in the functional surface 501A(1). Alternatively, the inert regions 501A(12) can be placed between a plurality of active regions 501A(11).

Alternatively, the inert region 501A(12) having a width narrower than the width of the active region 501A(11) can be placed. Alternatively, the active region 501A(12) with a width of approximately 10 μm can be placed, for example.

[Modification Example of Sixth Step]

In the sixth step, the opening portion 591B is formed in the intermediate layer 501B, and the terminal 519B (not illustrated) is formed (see FIG. 7(V6), FIG. 11(C), and FIG. 13(B)).

Note that the processed member used for the sixth step includes, for example, a region 501B(23) in contact with the active region 501A(11) and a region 501B(24) in contact with the active region 501A(12) (see FIG. 11(B) and FIG. 13(A)).

Thus, the force required when the region 501B(24) of the intermediate layer 501B is separated from the inert region 501A(12) can be greater than the force required when the region 501B(23) of the intermediate layer 501B is separated from the active region 501A(11). Alternatively, the intermediate layer 501B can be made difficult to peel from the inert region 501A(12). Alternatively, the intermediate layer 501B can be made easy to peel from the active region 501A(11).

Specifically, the functional layer 520 or the process substrate 10 is bent, and the region 501B(23) is separated from the active region 501A(11) and part of the region 501B(11) is separated from the conductive film 519B(1) (see FIG. 11(C)). Note that since a great force is required to separate the region 501B(24) from the inert region 501A(12), the inert region 501A(12) remains in contact with the region 501B(24). Consequently, the opening portion 591B is formed in the intermediate layer 501B, and the terminal 519 can be formed (see FIG. 13(B) or FIG. 13(C)).

Thus, a plurality of opening portions 591B can be formed at small intervals in the intermediate layer 501B. Alternatively, the opening portion 591B having a predetermined shape can be formed in the intermediate layer 501B.

<Method 3 of Manufacturing Display Panel Including Electrical Module>

Another method of manufacturing a display panel including an electrical module of one embodiment of the present invention is described with reference to FIG. 12, FIG. 14, FIG. 15, and FIG. 18.

FIG. 14 is a cross-sectional view showing the method of manufacturing a display panel including an electrical module of one embodiment of the present invention. FIG. 14(A) to FIG. 14(E) are diagrams illustrating details of the terminal portion.

Figure 15A:
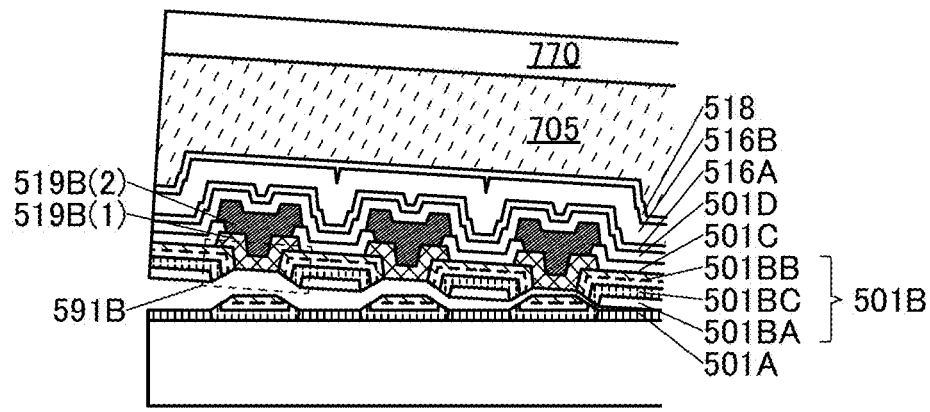
FIGS. 15A-15C are cross-sectional views showing a method of manufacturing a terminal portion of a display panel according to an embodiment.
Figure 15B:
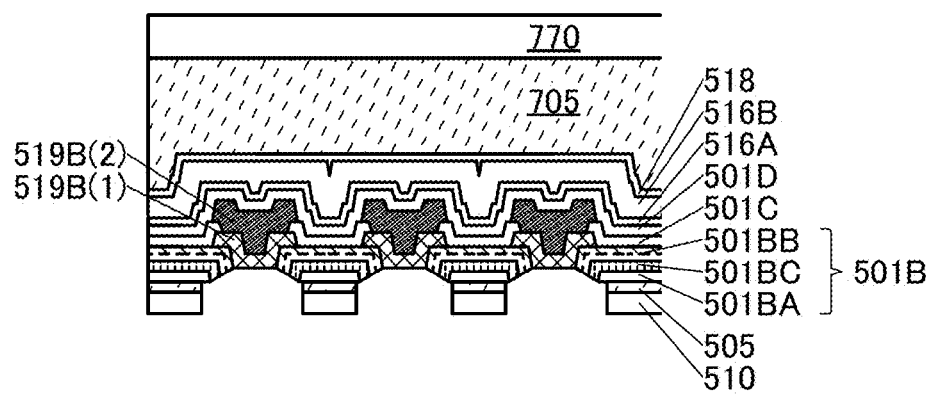
Figure 15C:
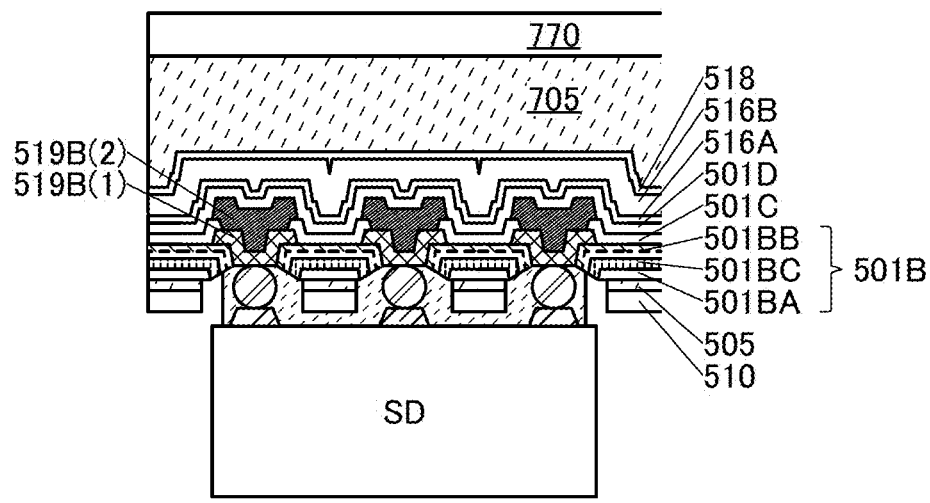

FIG. 15 is a cross-sectional view showing the method of manufacturing a display panel including an electrical module of one embodiment of the present invention. FIG. 15(A) to FIG. 15(C) illustrate details of the terminal portion.

FIG. 18 is a cross-sectional view showing the method of manufacturing a display panel including an electrical module of one embodiment of the present invention.

In another manufacturing method described in this embodiment, the following points are different from the manufacturing method described with reference to FIG. 7 to FIG. 10: the inert region 501A(12) is formed after part of the intermediate layer 501B is formed; and the other part of the intermediate layer 501B is formed after the inert region 501A(12) is formed is formed. Specifically, after an intermediate layer 501BA is formed, the inert region 501A(12) is formed and then an intermediate layer 501BC and an intermediate layer 501BB are formed. Different portions will be described in detail here, and refer to the above description for portions that can use similar structures.

[Modification Example of Second Step]

Figure 14A:
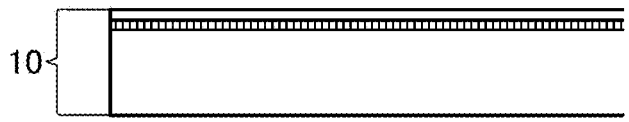
FIGS. 14A-14E are cross-sectional views showing a method of manufacturing a terminal portion of a display panel according to an embodiment.

In the second step, a film to be the intermediate layer 501BA is formed over the process substrate 10 (see FIG. 14(A)). For example, a film having a function of supplying hydrogen by heating can be used as the intermediate layer 501BA. Specifically, a film including silicon, oxygen, and nitrogen is formed by a chemical vapor deposition method.

Figure 14B:
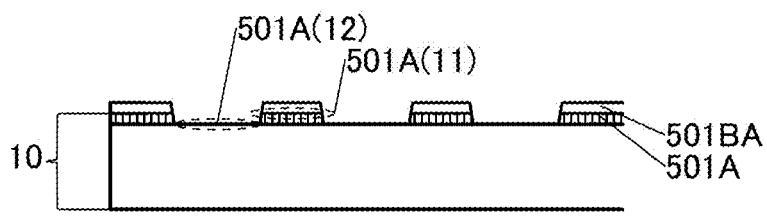

Next, the active region 501A(11), the inert region 501A(12), and the intermediate layer 501BA are formed by processing the intermediate layer 501BA and the film 501A into a predetermined shape by an etching method or the like (see FIG. 14(B)). Note that the intermediate layer 501BA is in contact with the active region 501A(11).

Thus, contamination of the active region 501A(11) caused during the etching process can be prevented, for example. Alternatively, the intermediate layer 501BA can be formed in the active region 501A(11) in a clean state. Alternatively, the intermediate region 501BA can be separated from the active region 501A(11) easily.

Next, the intermediate layer 501BB is formed by a chemical vapor deposition method or the like (see FIG. 12(A)). In addition, a surface treated with plasma or the like using a predetermined gas can be used as the surface 501B(1) (see FIG. 12(B) and FIG. 14(C)). For example, a surface treated with plasma using a gas including fluorine or plasma using a gas including oxygen can be used as the surface 501B(1).

Figure 14C:
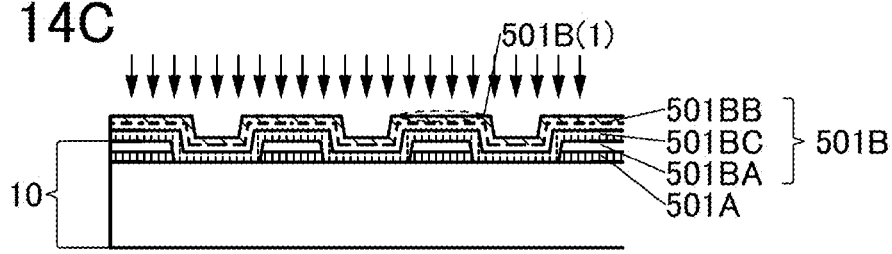

Note that the intermediate layer 501BC may be formed between the intermediate layer 501BA and the intermediate layer 501BB (see FIG. 14(C)). For example, a film with a high gas barrier property can be used as the intermediate layer 501BC. Specifically, a film including silicon and nitrogen can be used as the intermediate layer 501BC. Thus, hydrogen can be supplied from the intermediate layer 501B to the interface between the surface 501B(2) and the functional surface 501A(1).

Figure 14D:
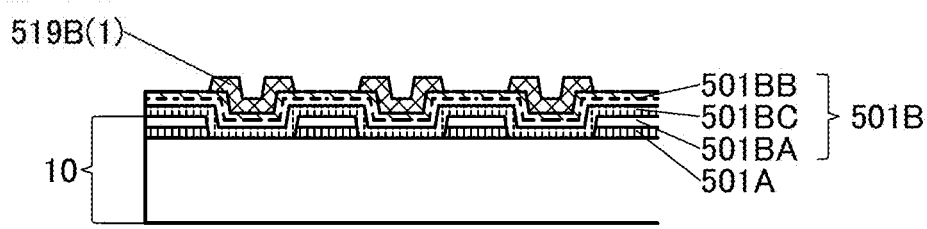
Figure 14E:
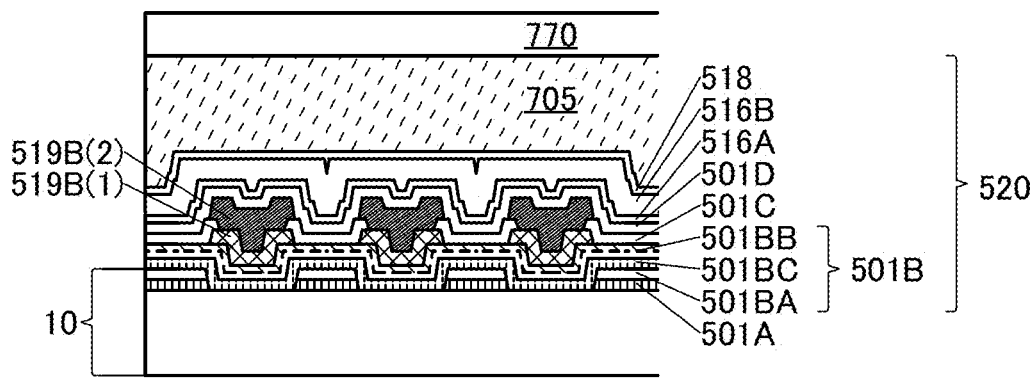

In the third step, the conductive film 519B(1) is formed (see FIG. 12(C), FIG. 12(D), and FIG. 14(D)). Accordingly, the conductive film 519B(1) is in contact with the region 501B(11) of the intermediate layer 501B. Moreover, the functional layer 520 is formed in the fourth step, and a pixel is formed in the fifth step (see FIG. 13(A) and FIG. 14(E)).

Next, in the sixth step, the opening portion 591B is formed in the intermediate layer 501B, and the terminal 519 is formed (see FIG. 13(B) and FIG. 15(A)). Note that in another manufacturing method described in this embodiment, defects such as a failure in separation in a predetermined region are unlikely to occur when the intermediate layer 501BA is separated from the active region 501A(11).

The shape of the terminal 519B can be controlled using the shapes of the active region 501A(11) and the inert region 501A(12) (see FIG. 13(B) and FIG. 13(C)).

For example, in the case where a step between the active region 501A(11) and the inert region 501A(12) of the process substrate 10 is small (see FIG. 18(A-2)), the terminal 519 can be recessed from the surface 501B(2) of the intermediate layer 501B (see FIG. 18(A-1)).

For example, in the case where the step between the active region 501A(11) and the inert region 501A(12) of the process substrate 10 is large (see FIG. 18(B-2)), the terminal 519 can be stuck out of the surface 501B(2) of the intermediate layer 501B (see FIG. 18(B-1)).

According to another manufacturing method described in this embodiment, terminals can be placed at intervals as small as approximately 10 μm, for example. Thus, for example, the driver circuit SD can be electrically connected to the terminal 519 of the manufactured display panel including an electrical module with the use of an anisotropic conductive film or the like (see FIG. 15(C)).

<Method 4 of Manufacturing Display Panel Including Electrical Module>

Another method of manufacturing a display panel including an electrical module of one embodiment of the present invention is described with reference to FIG. 16 and FIG. 17.

FIG. 16 is a cross-sectional view showing the method of manufacturing a display panel including an electrical module of one embodiment of the present invention. FIG. 16(A) to FIG. 16(E) illustrate details of the terminal portion.

Figure 17A:
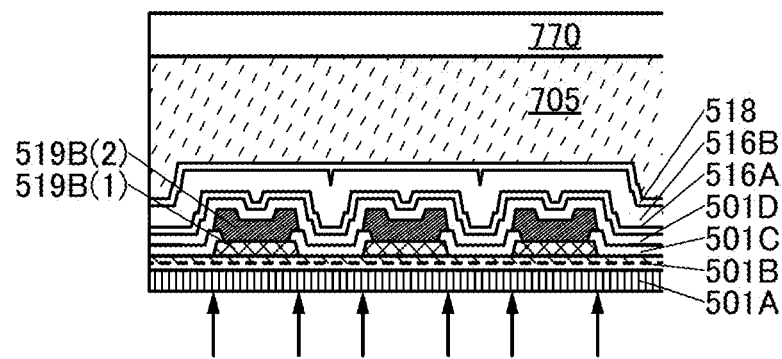
FIGS. 17A-17C are cross-sectional views showing a method of manufacturing a terminal portion of a display panel according to an embodiment.
Figure 17B:
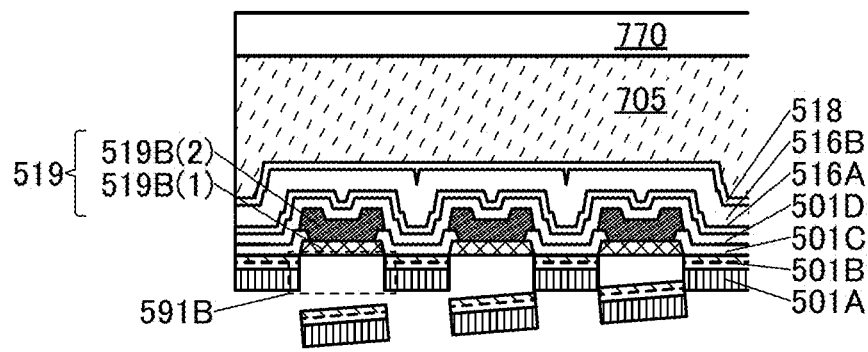
Figure 17C:
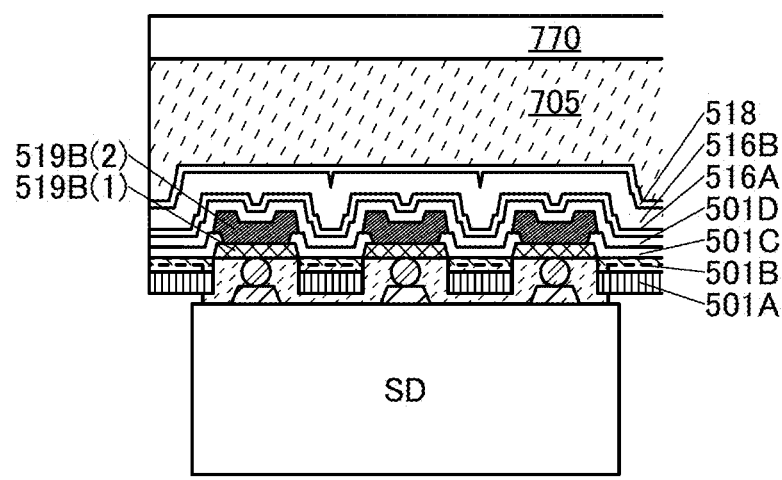

FIG. 17 is a cross-sectional view showing the method of manufacturing a display panel including an electrical module of one embodiment of the present invention. FIG. 17(A) to FIG. 17(C) illustrate details of the terminal portion.

In another manufacturing method described in this embodiment, the following points are different from the manufacturing method described with reference to FIG. 7 to FIG. 10: the base material 11, the film 501A, and the active region 501A(11) are included and the process substrate 10 in which the active region 501A(11) is interposed between the base material 11 and the film 501A is used; and the opening portion 591B is formed in the film 501A after the film 501A is separated from the process substrate 10.

Figure 16A:
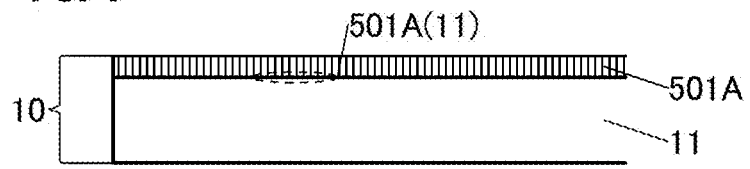
FIGS. 16A-16E are cross-sectional views showing a method of manufacturing a terminal portion of a display panel according to an embodiment.

In the first step, the process substrate is prepared (see FIG. 7(V1) and FIG. 16(A)). For example, a glass substrate is used as the base material 11 and a 10-μm-thick polyimide film can be used as the film 501A. Specifically, the base material 11 is coated with a polyimide varnish with a slit coater, whereby the process substrate can be formed.

Figure 16B:
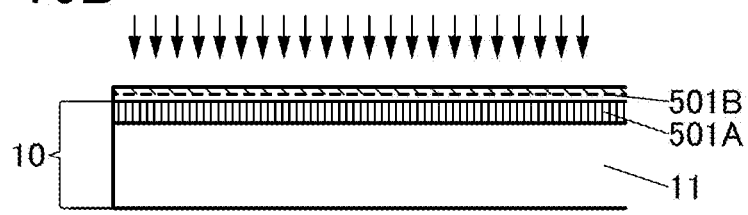
Figure 16C:
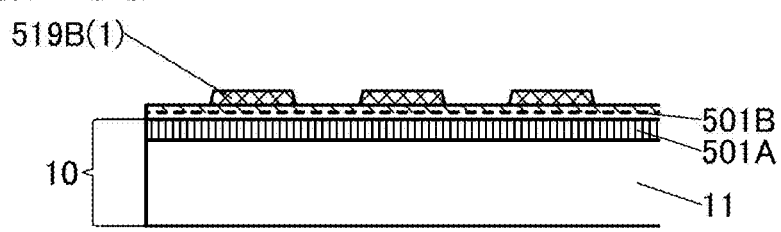
Figure 16D:
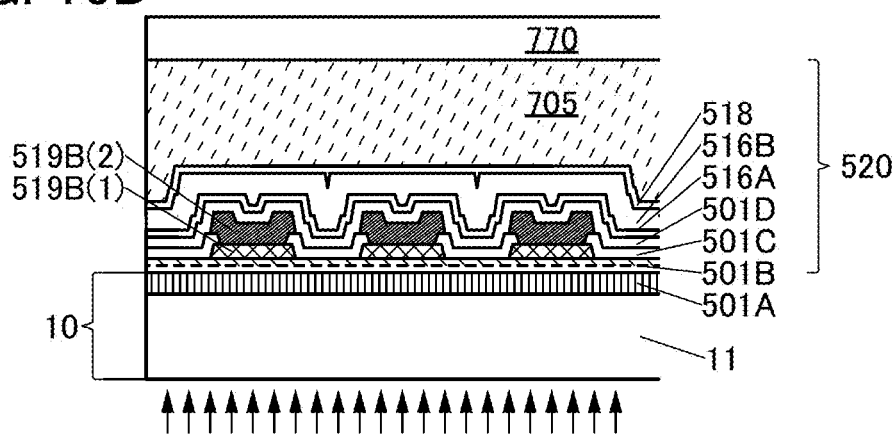

Next, in the second step, the intermediate layer 501B is formed (see FIG. 7(V2) and FIG. 16(B)). In the third step, the conductive film 519B(1) is formed (see FIG. 7(V3) and FIG. 16(C)). Moreover, the functional layer 520 is formed in the fourth step, and a pixel is formed in the fifth step (see FIG. 7(V4), FIG. 7(V5), and FIG. 16(D)).

Next, the film 501A is separated from the base material 11. For example, the film 501A is irradiated with light, which is transmitted through the base material 11 and absorbed by the film 501A, from the base material 11 side. Specifically, the film 501A is irradiated with ultraviolet rays using an excimer laser. This can separate the film 501A from the base material 11.

Figure 16E:
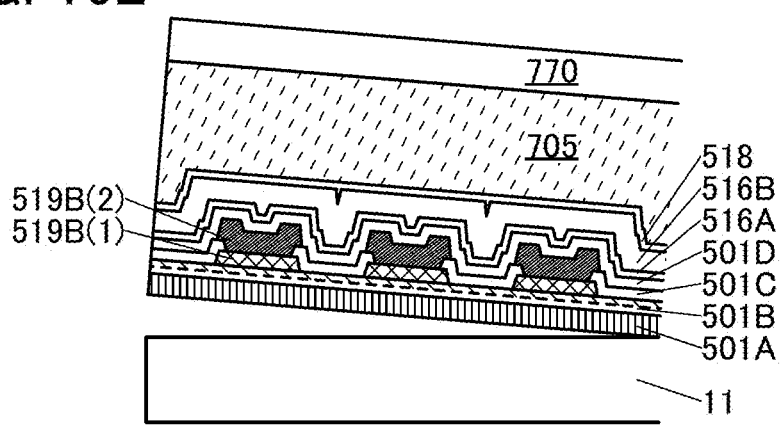

Next, the functional layer 520 or the base material 11 is bent, and the film 501A is separated in the active region 501A(11) (see FIG. 16(E)).

In the sixth step, the opening portion 591B is formed in the intermediate layer 501B, and the terminal 519 is formed (see FIG. 7(V6), FIG. 17(A), and FIG. 17(B)). For example, the opening portion 591B can be formed using a solid-state laser. Specifically, when the film 501A is irradiated with 266-nm light using a solid-state laser, a cut that reaches the vicinity of the conductive film 519B(1) can be made in the film 501A.

Note that in the case where the film 501A has a sufficient thickness exceeding approximately 10 μm, for example, the seventh step in which the film 501A is bonded to the base material can be omitted.

According to the other manufacturing method described in this embodiment, terminals can be placed at intervals as small as approximately 10 μm, for example. Thus, for example, the driver circuit SD can be electrically connected to the terminal 519 of the manufactured display panel including an electrical module with the use of an anisotropic conductive film or the like (see FIG. 17(C)).

Note that this embodiment can be combined with other embodiments in this specification as appropriate.

Embodiment 4

In this embodiment, a configuration of a display device of one embodiment of the present invention will be described with reference to FIG. 20.

FIG. 20 is a view showing the configuration of the display device of one embodiment of the present invention. FIG. 20(A) is a block diagram of the display device of one embodiment of the present invention. FIG. 20(B-1) to FIG. 20(B-3) are projection views showing the appearance of the display device of one embodiment of the present invention.

<Structure Example 1 of Display Device>

The display device described in this embodiment includes the control portion 238 and the display panel 700 (see FIG. 20(A)).

<<Structure Example 1 of Control Portion 238>>

The control portion 238 is supplied with the image data V1 and the control data CI. For example, a clock signal, a timing signal, or the like can be used as the control data CI.

The control portion 238 generates data V11 on the basis of the image data V1 and generates a control signal SP on the basis of the control data CI. Furthermore, the control portion 238 supplies the data V11 and the control signal SP.

The data V11 includes a grayscale of 8 bits or more, preferably 12 bits or more, for example. In addition, a clock signal, a start pulse, or the like of a shift register used for a driver circuit can be used as the control signal SP, for example.

Specifically, the control portion 238 includes a decompression circuit 234 and an image processing circuit 235.

<<Decompression Circuit 234>>

The decompression circuit 234 has a function of decompressing the image data V1 supplied in a compressed state. The decompression circuit 234 includes a memory portion. The memory portion has a function of storing decompressed image data, for example.

<<Image Processing Circuit 235>>

The image processing circuit 235 includes a memory region, for example. The memory region has a function of storing data included in the image data V1, for example.

The image processing circuit 235 has a function of generating the data V11 by correcting the image data V1 on the basis of a predetermined characteristic curve and a function of supplying the data V11, for example.

<<Structure Example 9 of Display Panel 700>>

The display panel 700 is supplied with the data V11 and the control signal SP. For example, the display panel 700 described in Embodiment 2 can be used. Note that the display panel 700 includes the electrical module 500.

For example, a control circuit 233 can be used in the display panel 700. For example, a driver circuit can be used in the display panel 700.

<<Control Circuit 233>>

The control circuit 233 has a function of generating and supplying the control signal SP. For example, a clock signal, a timing signal, or the like can be used as the control signal SP. Specifically, a timing controller can be used as the control circuit 233.

For example, the control circuit 233 formed over a rigid substrate can be used for the display panel 700. The control circuit 233 formed over a rigid substrate can be electrically connected to the control portion 238 with the use of a flexible printed board.

<<Electrical Module>>

The display panel 700 including an electrical module includes a driver circuit and is supplied with the data V11 and the control signal SP.

For example, the data V11 and the control signal SP can be supplied to the terminal 519B.

<<Driver Circuit>>

The driver circuit operates on the basis of the control signal SP. For example, a driver circuit GDA(1), a driver circuit GDA(2), a driver circuit GDB(1), and a driver circuit GDB(2) are supplied with the control signal SP and have a function of supplying a selection signal.

For example, a driver circuit SDA(1), a driver circuit SDA(2), a driver circuit SDB(1), a driver circuit SDB(2), a driver circuit SDC(1), and a driver circuit SDC(1) are supplied with the control signal SP and the data V11 and capable of supplying an image signal.

Using the control signal SP enables a synchronized operation of a plurality of driver circuits.

<<Structure Example 3 of Pixel 702$(i,j)$>>

The pixel 702$(i,j)$ performs display on the basis of the data V11.

Thus, the image data can be displayed using the display element. As a result, a novel display device that is highly convenient or reliable can be provided. Alternatively, for example, a television receiver system (see FIG. 20(B-1)), a video monitor (see FIG. 20(B-2)), a laptop computer (see FIG. 20(B-3)), or the like can be provided.

Note that this embodiment can be combined with other embodiments in this specification as appropriate.

Embodiment 5

In this embodiment, a configuration of an input/output device of one embodiment of the present invention will be described with reference to FIG. 21.

Figure 21:
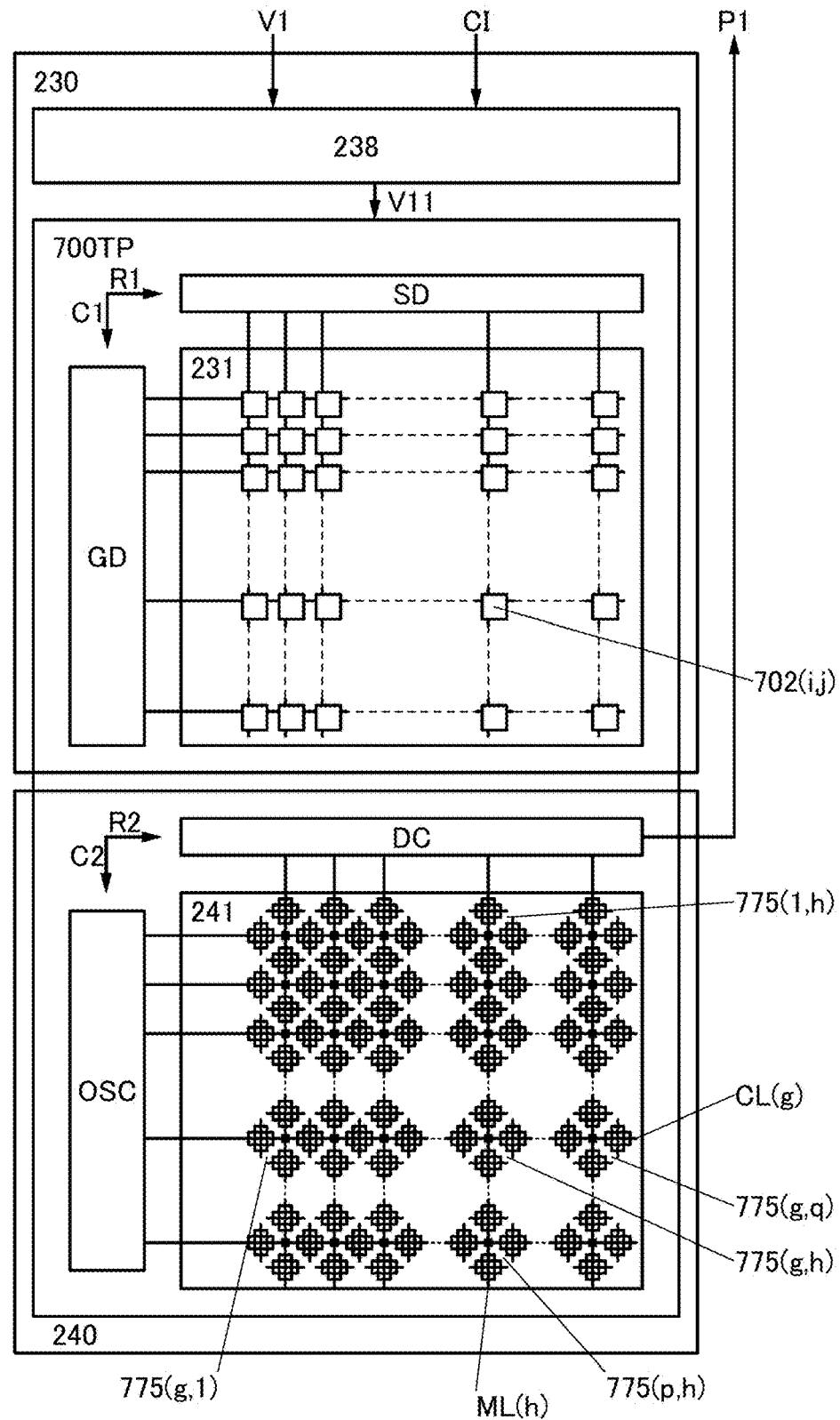
FIG. 21 is a block diagram showing a configuration of an input/output device according to an embodiment.

FIG. 21 is a block diagram showing the configuration of the input/output device of one embodiment of the present invention.

<Structure Example 1 of Input/Output Device>

The input/output device described in this embodiment includes the input portion 240 and the display portion 230.

<<Structure Example 1 of Display Portion 230>>

The display portion 230 includes the display panel 700. For example, the display panel 700 described in Embodiment 2 can be used for the display portion 230. Note that a structure including the input portion 240 and the display portion 230 can be referred to as an input/output panel 700TP.

<<Structure Example 1 of Input Portion 240>>

The input portion 240 includes a sensing region 241. The input portion 240 senses an object approaching the sensing region 241.

The sensing region 241 includes a region overlapping with the pixel 702$(i,j)$.

Thus, the object approaching the region overlapping with the display portion can be sensed while image data is displayed by the display portion. Alternatively, a finger or the like that approaches the display portion can be used as a pointer to input positional data. Alternatively, positional data can be associated with image data displayed on the display portion. As a result, a novel input/output device that is highly convenient or reliable can be provided.

<<Structure Example 2 of Input Portion 240>>

The input portion 240 includes an oscillation circuit OSC and a sensing circuit DC (see FIG. 21).

<<Sensing Region 241>>

The sensing region 241 includes one or more sensing elements, for example.

The sensing region 241 includes a group of sensing elements 775$(g, 1)$ to 775$(g,q)$ and a different group of sensing elements 775(1,h) to 775(p,h). Note that g is an integer greater than or equal to 1 and less than or equal to p, h is an integer greater than or equal to 1 and less than or equal to q, and p and q are each an integer greater than or equal to 1.

The group of sensing elements 775(g, 1) to 775(g,q) include a sensing element 775(g,h) and are provided in the row direction (the direction indicated by an arrow R2 in the drawing). Note that the direction indicated by the arrow R2 may be the same as or different from the direction indicated by the arrow R1.

The different group of sensing elements 775(1,h) to 775(p,h) include the sensing element 775(g,h) and are provided in the column direction (the direction indicated by an arrow C2 in the drawing) that intersects the row direction.

<<Sensing Element>>

The sensing element has a function of sensing an approaching pointer. For example, a finger, a stylus pen, or the like can be used as the pointer. For example, a piece of metal, a coil, or the like can be used for the stylus pen.

Specifically, a capacitive proximity sensor, an electromagnetic inductive proximity sensor, an optical proximity sensor, a resistive proximity sensor, or the like can be used as the sensing element.

A plurality of types of sensing elements can be used in combination. For example, a sensing element that senses a finger and a sensing element that senses a stylus pen can be used in combination.

This allows determination of the kind of a pointer. Alternatively, different instructions can be associated with pieces of sensing data depending on the kind of a pointer that has been determined. Specifically, in the case where it is determined that a finger is used as a pointer, sensing data can be associated with a gesture. Alternatively, in the case where it is determined that a stylus pen is used as a pointer, sensing data can be associated with drawing processing.

Specifically, a capacitive proximity sensor or an optical proximity sensor can be used to sense a finger. Alternatively, an electromagnetic inductive proximity sensor or an optical proximity sensor can be used to sense a stylus pen.

Note that this embodiment can be combined with other embodiments in this specification as appropriate.

Embodiment 6

In this embodiment, a configuration of a data processing device of one embodiment of the present invention will be described with reference to FIG. 22 to FIG. 24.

Figure 22A:
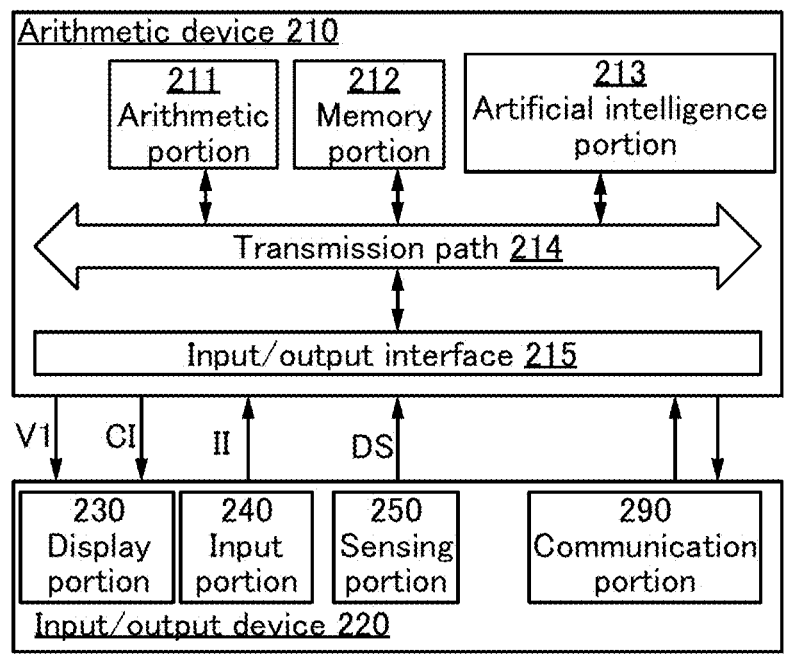
FIGS. 22A-22C are a block diagram and projection views showing a configuration of a data processing device according to an embodiment.
Figure 22B:
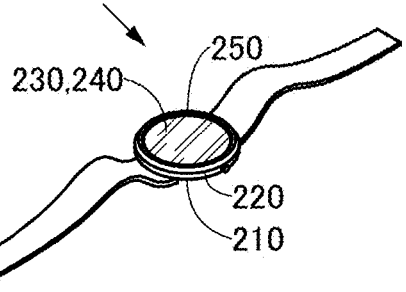
Figure 22C:
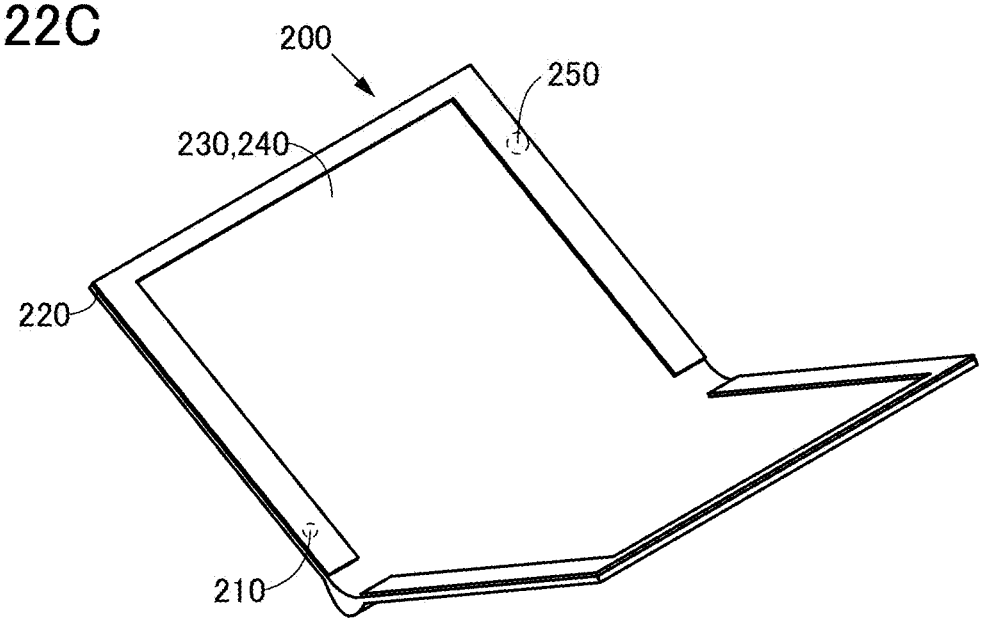

FIG. 22(A) is a block diagram showing the configuration of the data processing device of one embodiment of the present invention. FIG. 22(B) and FIG. 22(C) are projection views showing examples of the appearance of the data processing device.

Figure 23A:
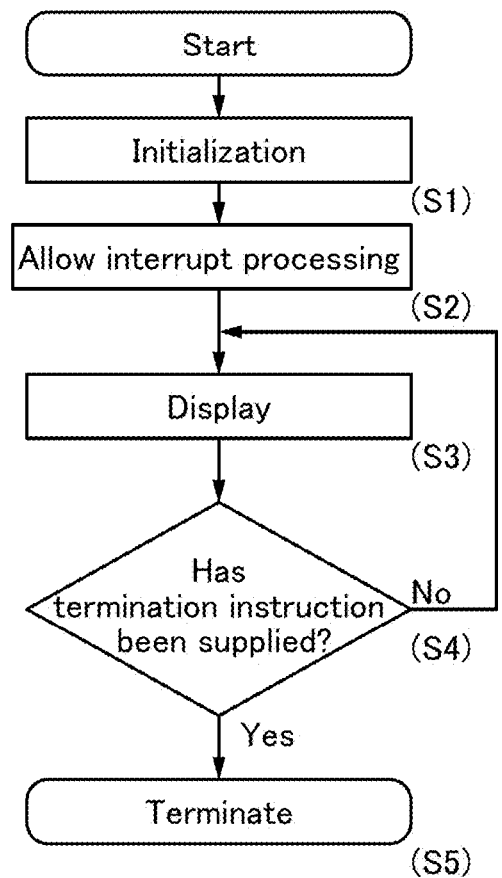
FIGS. 23A and 23B are flow charts showing programs of a data processing device according to an embodiment.
Figure 23B:
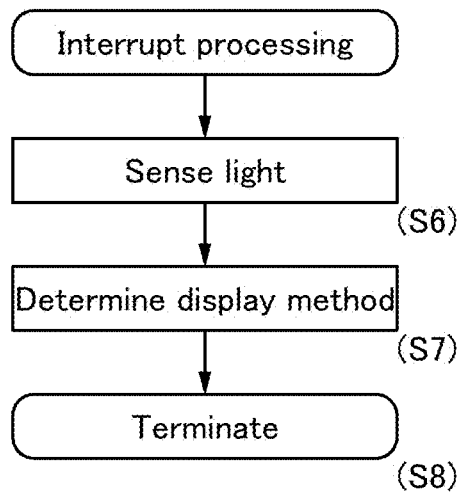

FIG. 23 is a flow chart showing a program of one embodiment of the present invention. FIG. 23(A) is a flow chart showing main processing of the program of one embodiment of the present invention, and FIG. 23(B) is a flow chart showing interrupt processing.

Figure 24A:
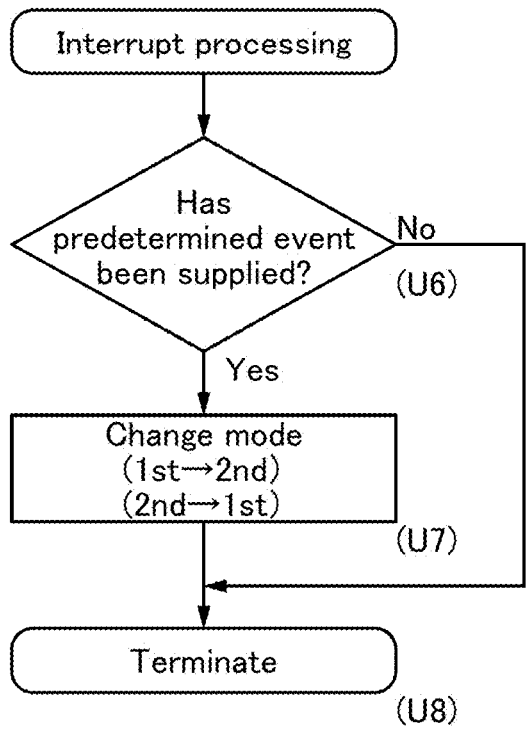
FIGS. 24A-24C are diagrams showing a program of a data processing device according to an embodiment.
Figure 24B:
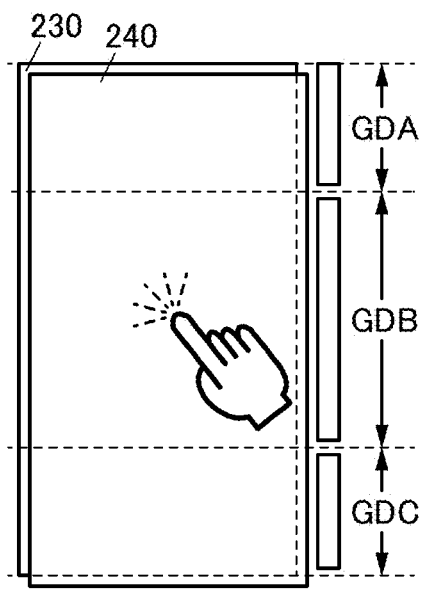
Figure 24C:
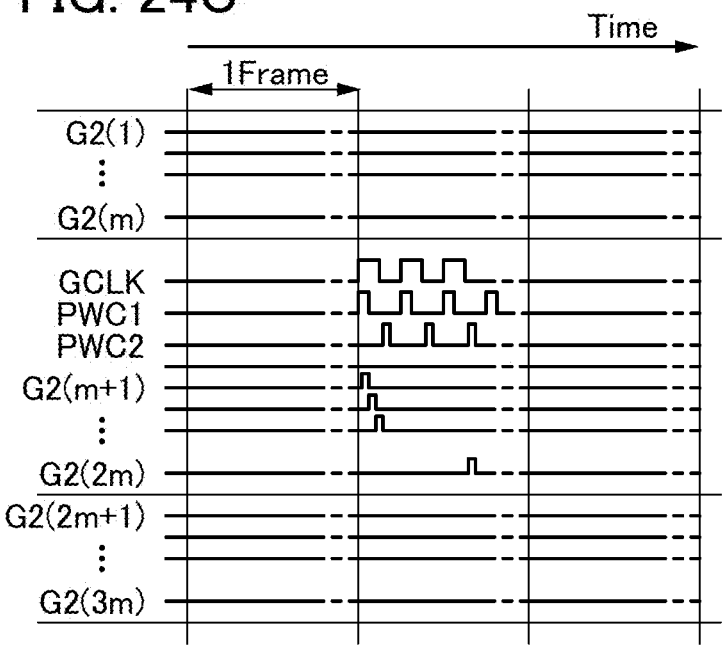

FIG. 24 shows a program of one embodiment of the present invention. FIG. 24(A) is a flow chart showing interrupt processing of the program of one embodiment of the present invention. FIG. 24(B) is a schematic view showing operation of the data processing device, and FIG. 24(C) is a timing chart showing operation of the data processing device of one embodiment of the present invention.

<Structure Example 1 of Data Processing Device>

A data processing device described in this embodiment includes an arithmetic device 210 and an input/output device 220 (see FIG. 22(A)). Note that the input/output device is electrically connected to the arithmetic device 210. A data processing device 200 can also include a housing (see FIG. 22(B) or FIG. 22(C)).

<<Structure Example 1 of Arithmetic Device 210>>

The arithmetic device 210 is supplied with the input data II or the sensing data DS. The arithmetic device 210 supplies the control data CI and the image data V1.

The arithmetic device 210 includes an arithmetic portion 211 and a memory portion 212. The arithmetic device 210 includes a transmission path 214 and an input/output interface 215.

The transmission path 214 is electrically connected to the arithmetic portion 211, the memory portion 212, and the input/output interface 215.

<<Arithmetic Portion 211>>

The arithmetic portion 211 has a function of executing a program, for example.

<<Memory Portion 212>>

The memory portion 212 has a function of storing, for example, the program executed by the arithmetic portion 211, initial data, setting data, an image, or the like.

Specifically, a hard disk, a flash memory, a memory using a transistor including an oxide semiconductor, or the like can be used.

<<Input/Output Interface 215 and Transmission Path 214>>

The input/output interface 215 includes a terminal or a wiring and has a function of supplying data and being supplied with data. The input/output interface 215 can be electrically connected to the transmission path 214, for example. The input/output interface 215 can also be electrically connected to the input/output device 220.

The transmission path 214 includes a wiring and has a function of supplying data and being supplied with data. The transmission path 214 can be electrically connected to the input/output interface 215, for example. The transmission path 214 can also be electrically connected to the arithmetic portion 211, the memory portion 212, or the input/output interface 215.

<<Structure Example 1 of Input/Output Device 220>>

The input/output device 220 supplies the input data II and the sensing data DS. The input/output device 220 is supplied with the control data CI and the image data V1 (see FIG. 22(A)).

As the input data II, for example, a scan code of a keyboard, positional data, operation data of buttons, sound data, image data, or the like can be used. Alternatively, for example, illuminance data, attitude data, acceleration data, bearing data, pressure data, temperature data, humidity data, or the like of an environment where the data processing device 200 is used, or the like can be used as the sensing data DS.

As the control data CI, for example, a signal controlling the luminance of display of the image data V1, a signal controlling the color saturation, or a signal controlling the hue can be used. Alternatively, a signal that changes display of part of the image data V1 can be used as the control data CI.

The input/output device 220 includes the display portion 230, the input portion 240, and a sensing portion 250. For example, the input/output device described in Embodiment 5 can be used.

<<Structure Example 2 of Display Region 230>>

The display portion 230 displays the image data V1 on the basis of the control data CI.

The display portion 230 includes the control portion 238, a driver circuit GD, a driver circuit SD, and the display panel 700 (not illustrated). For example, the display device described in Embodiment 4 can be used for the display portion 230.

<<Structure Example 3 of Input Portion 240>>

The input portion 240 generates the input data II. For example, the input portion 240 has a function of supplying positional data.

For example, human interfaces or the like can be used for the input portion 240 (see FIG. 22(A)). Specifically, a keyboard, a mouse, a touch sensor, a microphone, a camera, or the like can be used as the input portion 240.

Moreover, a touch sensor including a region overlapping with the display portion 230 can be used. Note that input/output device including the display portion 230 and a touch sensor including a region overlapping with the display portion 230 can be referred to as a touch panel or a touch screen.

A user can make various gestures (tap, drag, swipe, pinch in, and the like) using his/her finger touching the touch panel as a pointer, for example.

The arithmetic device 210, for example, analyzes data on the position, path, or the like of the finger in contact with the touch panel and can determine that a specific gesture is supplied when the analysis results meet predetermined conditions. Thus, the user can supply a predetermined operation instruction associated with the predetermined gesture in advance by using the gesture.

For instance, the user can supply a "scroll instruction" for changing the display position of image data by using a gesture of moving the finger in contact with the touch panel along the touch panel.

<<Structure Example 1 of Sensing Portion 250>>

The sensing portion 250 generates the sensing data DS. The sensing portion 250 has a function of sensing the illuminance of the environment where the data processing device 200 is used and a function of supplying illuminance data, for example.

The sensing portion 250 has a function of sensing the ambient conditions and supplying the sensing data. Specifically, the sensing portion 250 can supply illuminance data, attitude data, acceleration data, bearing data, pressure data, temperature data, humidity data, or the like.

For example, a photosensor, an attitude sensor, an acceleration sensor, a direction sensor, a GPS (Global Positioning System) signal receiving circuit, a pressure sensor, a temperature sensor, a humidity sensor, a camera, or the like can be used as the sensing portion 250.

<<Communication Portion 290>>

A communication portion 290 has a function of supplying data to a network and obtaining data from the network.

<<Housing>>

Note that the housing has a function of storing the input/output device 220 or the arithmetic device 210. Alternatively, the housing has a function of supporting the display portion 230 or the arithmetic device 210.

Thus, the control data can be generated on the basis of the input data or the sensing data. Alternatively, the image data can be displayed on the basis of the input data or the sensing data. Alternatively, the data processing device can determine the intensity of light received by the housing of the data processing device and operate under the usage environment of the data processing device. Alternatively, a user of the data processing device can select a display method. As a result, a novel data processing device that is highly convenient or reliable can be provided.

Note that in some cases, these components cannot be clearly distinguished from each other and one component may also serve as another component or include part of another component. For example, a touch panel in which a touch sensor overlaps with a display panel is an input portion as well as a display portion.

<<Structure Example 2 of Arithmetic Device 210>>

The arithmetic device 210 includes an artificial intelligence portion 213 (see FIG. 22(A)). The artificial intelligence portion 213 generates the control data CI on the basis of the input data II or the sensing data DS.

[Natural Language Processing on Input Data II]

Specifically, the artificial intelligence portion 213 can perform natural language processing on the input data II to extract one feature from the whole input data II. For example, the artificial intelligence portion 213 can infer emotion or the like put in the input data II, which can be a feature. The artificial intelligence portion 213 can infer the color, design, font, or the like empirically felt suitable for the feature. The artificial intelligence portion 213 can generate data specifying the color, design, or font of a letter or data specifying the color or design of the background, and the data can be used as the control data CI.

Specifically, the artificial intelligence portion 213 can perform natural language processing on the input data II to extract some words included in the input data II. For example, the artificial intelligence portion 213 can extract expressions including a grammatical error, a factual error, emotion, and the like. The artificial intelligence portion 213 can generate and the control data CI for display of extracted part in the color, design, font, or the like different from those of another part, and the data can be used as the control data CI.

[Image Processing on Input Data II]

Specifically, the artificial intelligence portion 213 can perform image processing on the input data II to extract one feature from the input data II. For example, the artificial intelligence portion 213 can infer the age where an image of the input data II is taken, whether the image is taken indoors or outdoors, whether the image is taken in the daytime or at night, or the like, which can be a feature. The artificial intelligence portion 213 can infer the color tone empirically felt suitable for the feature and generate the control data CI for use of the color tone for display. Specifically, data specifying color (e.g., full color, monochrome, or sepia) used for expression of a gradation can be used as the control data CI.

Specifically, the artificial intelligence portion 213 can perform image processing on the input data II to extract some images included in the input data II. For example, the artificial intelligence portion 213 can generate the control data CI for display of a boundary between extracted part of the image and another part. Specifically, the artificial intelligence portion 213 can generate the control data CI for display of a rectangle surrounding the extracted part of the image.

[Inference Using Sensing Data DS]

Specifically, the artificial intelligence portion 213 can generate an inference with the use of the sensing data DS. Alternatively, the artificial intelligence portion 213 can generate the control data CI on the basis of the inference so that the user of the data processing device 200 can feel comfortable.

Specifically, the artificial intelligence portion 213 can generate the control data CI for adjustment of display brightness on the basis of the ambient illuminance or the like so that the display brightness can be felt comfortable. Alternatively, the artificial intelligence portion 213 can generate the control data CI for adjustment of volume on the basis of the ambient noise or the like so that the volume can be felt comfortable.

As the control data CI, a clock signal, a timing signal, or the like that is supplied to the control portion 238 included in the display portion 230 can be used. Alternatively, a clock signal, a timing signal, or the like that is supplied to a control portion included in the input portion 240 can be used as the control data CI.

<Structure Example 2 of Data Processing Device>

Another configuration of the data processing device of one embodiment of the present invention is described with reference to FIG. 23(A) and FIG. 23(B).

<<Program>>

A program of one embodiment of the present invention has the following steps (see FIG. 23(A)).

[First Step]

In a first step, setting is initialized (see FIG. 23(A)(S1)).

For example, predetermined image data which is to be displayed on start-up and data for determining a predetermined mode of displaying the image data and a predetermined display method for displaying the image data are acquired from the memory portion 212. Specifically, one still image data or another moving image data can be used as the predetermined image data. Furthermore, a first mode or a second mode can be used as the predetermined mode.

[Second Step]

In a second step, interrupt processing is allowed (see FIG. 23(A)(S2)). Note that an arithmetic device allowed to execute the interrupt processing can perform the interrupt processing in parallel with the main processing. The arithmetic device that has returned from the interrupt processing to the main processing can reflect the results obtained through the interrupt processing in the main processing.

The arithmetic device may execute the interrupt processing when a counter has an initial value, and the counter may be set at a value other than the initial value when the arithmetic device returns from the interrupt processing. Thus, the interrupt processing can always follow the start-up of the program.

[Third Step]

In a third step, image data is displayed by a predetermined mode or a predetermined display method selected in the first step or the interrupt processing (see FIG. 23(A)(S3)). Note that the predetermined mode determines a mode of displaying the data, and the predetermined display method determines a method for displaying the image data. For example, the image data V1 can be used as data to be displayed.

One method for displaying the image data V1 can be associated with the first mode, for example. Alternatively, another method for displaying the image data V1 can be associated with the second mode. Thus, a display method can be selected on the basis of the selected mode.

<<First Mode>>

Specifically, a method for supplying selection signals to a scan line at a frequency of 30 Hz or higher, preferably 60 Hz or higher, and performing display on the basis of the selection signals can be associated with the first mode.

For example, when selection signals are supplied at a frequency of 30 Hz or higher, preferably 60 Hz or higher, the movement of a moving image can be smoothly displayed.

For example, when an image is refreshed at a frequency of 30 Hz or higher, preferably 60 Hz or higher, an image that changes so as to smoothly follow the user's operation can be displayed on the data processing device 200 which is being operated by the user.

<<Second Mode>>

Specifically, a method for supplying selection signals to a scan line at a frequency lower than 30 Hz, preferably lower than 1 Hz, further preferably less than once a minute, and performing display on the basis of the selection signals can be associated with the second mode.

The supply of selection signals at a frequency lower than 30 Hz, preferably lower than 1 Hz, further preferably less than once a minute enables display with a flicker or flickering suppressed. Furthermore, the power consumption can be reduced.

For example, when the data processing device 200 is used for a clock, the display can be refreshed at a frequency of once a second, once a minute, or the like.

Note that when a light-emitting element is used as the display element, for example, the light-emitting element can be configured to emit light in a pulsed manner so that image data is displayed. Specifically, an organic EL element can be configured to emit light in a pulsed manner, and its afterglow can be used for display. The organic EL element has excellent frequency characteristics; thus, time for driving the light-emitting element can be shortened, and thus the power consumption can be reduced in some cases. Alternatively, heat generation is inhibited; thus, the deterioration of the light-emitting element can be suppressed in some cases.

[Fourth Step]

In a fourth step, selection is performed such that the program proceeds to a fifth step when a termination instruction has been supplied, whereas the program proceeds to the third step when the termination instruction has not been supplied (see FIG. 23(A)(S4)).

For example, the termination instruction supplied in the interrupt processing may be used for the determination.

[Fifth Step]

In the fifth step, the program terminates (see FIG. 23(A) (S5)).

<<Interrupt Processing>>

The interrupt processing includes a sixth step to an eighth step described below (see FIG. 23(B)).

[Sixth Step]

In the sixth step, the illuminance of the environment where the data processing device 200 is used is sensed using the sensing portion 250, for example (see FIG. 23(B)(S6)). Note that color temperature or chromaticity of ambient light may be sensed instead of the illuminance of the environment.

[Seventh Step]

In the seventh step, a display method is determined on the basis of the sensed illuminance data (see FIG. 23(B)(S7)). For example, a display method is determined such that the brightness of display is not too dark or too bright.

Note that in the case where the color temperature of the ambient light or the chromaticity of the ambient light is sensed in the sixth step, the color of display may be adjusted.

[Eighth Step]

In the eighth step, the interrupt processing terminates (see FIG. 23(B)(S8)).

<Structure Example 3 of Data Processing Device>

Another configuration of the data processing device of one embodiment of the present invention is described with reference to FIG. 24.

FIG. 24(A) is a flow chart showing a program of one embodiment of the present invention. FIG. 24(A) is a flow chart showing interrupt processing different from the interrupt processing shown in FIG. 23(B).

Note that the structure example 3 of the data processing device is different from the interrupt processing described with reference to FIG. 23(B) in that the interrupt processing includes a step of changing a mode on the basis of a supplied predetermined event. Different portions will be described in detail here, and refer to the above description for portions that can use similar structures.

<<Interrupt Processing>>

The interrupt processing includes a sixth step to an eighth step described below (see FIG. 24(A)).

[Sixth Step]

In the sixth step, the program proceeds to the seventh step when a predetermined event has been supplied, whereas the program proceeds to the eighth step when the predetermined event has not been supplied (see FIG. 24(A)(U6)). For example, whether the predetermined event is supplied in a predetermined period or not can be used as a condition. Specifically, the predetermined period can be longer than 0 seconds, and shorter than or equal to 5 seconds, shorter than or equal to 1 second, or shorter than or equal to 0.5 seconds, preferably shorter than or equal to 0.1 seconds.

[Seventh Step]

In the seventh step, the mode is changed (see FIG. 24(A)(U7)). Specifically, the second mode is selected in the case where the first mode has been selected, and the first mode is selected in the case where the second mode has been selected.

For example, it is possible to change the mode of a region that is part of the display portion 230. Specifically, the mode of a region where one driver circuit in the display portion 230 including the driver circuit GDA, the driver circuit GDB, and a driver circuit GDC supplies a selection signal can be changed (see FIG. 24(B)).

For example, the mode of the region where a selection signal is supplied from the driver circuit GDB can be changed when a predetermined event is supplied to the input portion 240 in a region overlapping with the region where a selection signal is supplied from the driver circuit GDB (see FIG. 24(B) and FIG. 24(C)). Specifically, the frequency of supply of the selection signal from the driver circuit GDB can be changed in accordance with a "tap" event supplied to a touch panel with a finger or the like.

A signal GCLK is a clock signal controlling the operation of the driver circuit GDB, and a signal PWC1 and a signal PWC2 are pulse width control signals controlling the operation of the driver circuit GDB. The driver circuit GDB supplies selection signals to a scan line G2($m$+1) to a scan line G2($2m$) on the basis of the signal GCLK, the signal PWC1, the signal PWC2, and the like.

Thus, for example, the driver circuit GDB can supply a selection signal without supply of selection signals from the driver circuit GDA and the driver circuit GDC. Alternatively, the display of the region where a selection signal is supplied from the driver circuit GDB can be refreshed without any change in the display of regions where selection signals are supplied from the driver circuit GDA and the driver circuit GDC. Alternatively, power consumed by the driver circuits can be reduced.

[Eighth Step]

In the eighth step, the interrupt processing terminates (see FIG. 24(A)(U8)). Note that in a period in which the main processing is executed, the interrupt processing may be repeatedly executed.

<<Predetermined Event>>

For example, it is possible to use events supplied using a pointing device such as a mouse, such as "click" and "drag", and events supplied to a touch panel with a finger or the like used as a pointer, such as "tap", "drag", and "swipe".

For example, the position of a slide bar pointed by a pointer, the swipe speed, and the drag speed can be used to assign arguments to an instruction associated with a predetermined event.

For example, data sensed by the sensing portion 250 is compared with a predetermined threshold value, and the compared results can be used for the event.

Specifically, a pressure sensor or the like in contact with a button or the like that is provided so as to be pushed in a housing can be used for the sensing portion 250.

<<Instruction Associated with Predetermined Event>>

For example, the termination instruction can be associated with a specific event.

For example, "page-turning instruction" for switching display from one displayed image data to another image data can be associated with a predetermined event. Note that an argument determining the page-turning speed or the like, which is used when the "page-turning instruction" is executed, can be supplied using the predetermined event.

For example, "scroll instruction" for moving the display position of displayed part of image data and displaying another part continuing from that part, or the like can be associated with a predetermined event. Note that an argument determining the moving speed of display, or the like, which is used when the "scroll instruction" is executed, can be supplied using the predetermined event.

For example, an instruction for setting the display method, an instruction for generating image data, or the like can be associated with a predetermined event. Note that an argument determining the brightness of a generated image can be associated with a predetermined event. An argument determining the brightness of a generated image may be determined on the basis of ambient brightness sensed by the sensing portion 250.

For example, an instruction for acquiring data distributed via a push service using the communication portion 290 or the like can be associated with a predetermined event.

Note that positional data sensed by the sensing portion 250 may be used for the determination of the presence or absence of a qualification for acquiring data. Specifically, it may be determined that there is a qualification for acquiring data in the case of presence in a predetermined class room, school, conference room, company, building, or the like or in a predetermined region. Thus, for example, educational materials distributed in a classroom of a school, a university, or the like can be received, so that the data processing device 200 can be used as a schoolbook or the like (see FIG. 22(C)). Alternatively, materials distributed in a conference room in, for example, a company can be received and used for a conference material.

Note that this embodiment can be combined with other embodiments in this specification as appropriate.

Embodiment 7

In this embodiment, structures of a data processing device of one embodiment of the present invention are described with reference to FIG. 25 and FIG. 26.

FIG. 25 and FIG. 26 are diagrams showing structures of the data processing device of one embodiment of the present invention. FIG. 25(A) is a block diagram of the data processing device, and FIG. 25(B) to FIG. 25(E) are perspective views showing structures of the data processing device. FIG. 26(A) to FIG. 26(E) are perspective views showing structures of the data processing device.

<Data Processing Device>

Figure 25A:
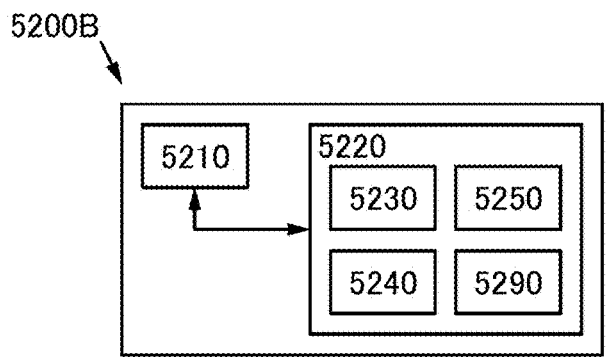
FIGS. 25A-25E are a block diagram of a data processing device according to an embodiment and diagrams showing a configuration of the data processing system.

A data processing device 5200B described in this embodiment includes an arithmetic device 5210 and an input/output device 5220 (see FIG. 25(A)).

The arithmetic device 5210 has a function of being supplied with operation data and a function of supplying image data on the basis of the operation data.

The input/output device 5220 includes a display portion 5230, an input portion 5240, a sensing portion 5250, and a communication portion 5290 and has a function of supplying operation data and a function of being supplied with image data. The input/output device 5220 also has a function of supplying sensing data, a function of supplying communication data, and a function of being supplied with communication data.

The input portion 5240 has a function of supplying operation data. For example, the input portion 5240 supplies operation data on the basis of operation by a user of the data processing device 5200B.

Specifically, a keyboard, a hardware button, a pointing device, a touch sensor, an illuminance sensor, an imaging device, an audio input device, an eye-gaze input device, an attitude sensing device, or the like can be used as the input portion 5240.

The display portion 5230 includes a display panel and has a function of displaying image data. For example, the display panel described in Embodiment 2 can be used for the display portion 5230.

The sensing portion 5250 has a function of supplying sensing data. For example, the sensing portion 5250 has a function of sensing a surrounding environment where the data processing device is used and supplying sensing data.

Specifically, an illuminance sensor, an imaging device, an attitude sensing device, a pressure sensor, a human motion sensor, or the like can be used as the sensing portion 5250.

The communication portion 5290 has a function of being supplied with communication data and a function of supplying communication data. For example, the communication portion 5290 has a function of being connected to another electronic device or a communication network through wireless communication or wired communication. Specifically, the communication portion 5290 has a function of wireless local area network communication, telephone communication, or near field communication, for example.

<<Structure Example 4 of Data Processing Device>>

Figure 25B:
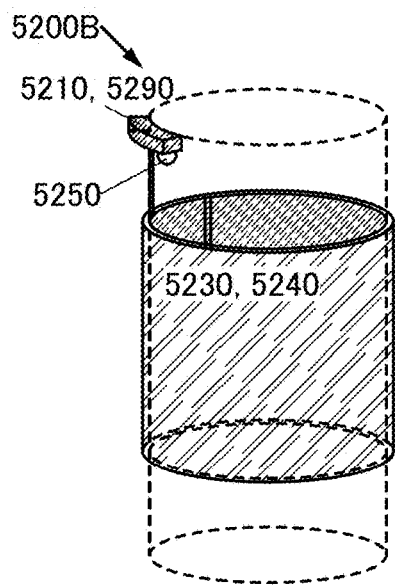

For example, the display portion 5230 can have an outer shape along a cylindrical column (see FIG. 25(B)). The data processing device has a function of changing its display method in accordance with the illuminance of a usage environment. In addition, the data processing device has a function of changing the displayed content in response to sensed existence of a person. This allows the data processing device to be provided on a column of a building, for example. The data processing device can display advertising, guidance, or the like. The data processing device can be used for digital signage or the like.

<<Structure Example 5 of Data Processing Device>>

Figure 25C:
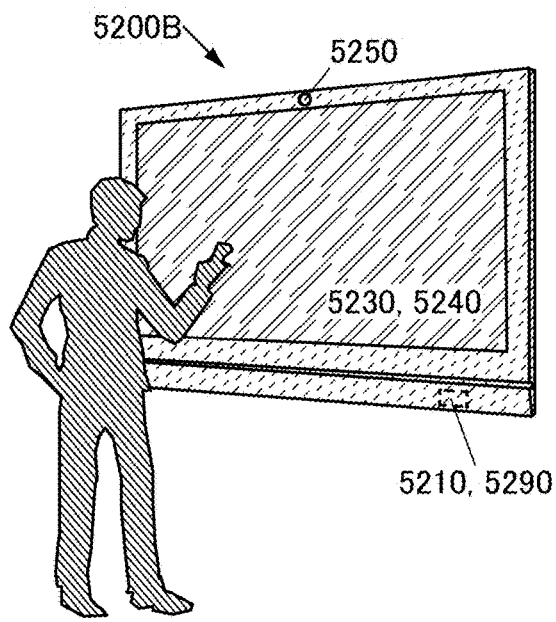

For example, the data processing device has a function of generating image data on the basis of the path of a pointer used by a user (see FIG. 25(C)). Specifically, the display panel with a diagonal size of 20 inches or longer, preferably 40 inches or longer, further preferably 55 inches or longer can be used. Alternatively, a plurality of display panels can be arranged and used as one display region. Alternatively, a plurality of display panels can be arranged and used as a multiscreen. Thus, the data processing device can be used for an electronic blackboard, an electronic bulletin board, or digital signage, for example.

<<Structure Example 6 of Data Processing Device>>

Figure 25D:
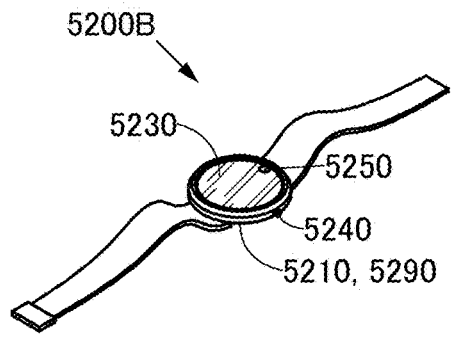

For example, the data processing device has a function of changing its display method in accordance with the illuminance of a usage environment (see FIG. 25(D)). Thus, for example, the power consumption of a smartwatch can be reduced. Alternatively, for example, a smartwatch can display an image so as to be suitably used even in an environment under strong external light, e.g., outdoors in fine weather.

<<Structure Example 7 of Data Processing Device>>

Figure 25E:
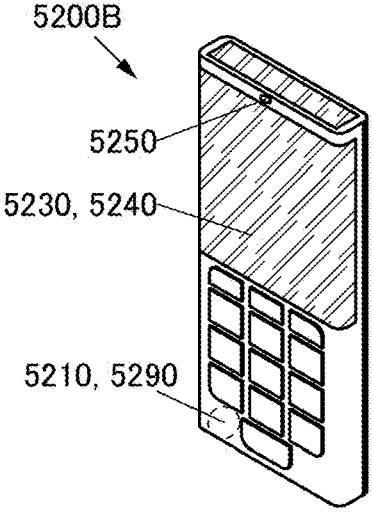

For example, the display portion 5230 has a surface gently curved along a side surface of a housing (see FIG. 25(E)). The display portion 5230 includes a display panel that can display an image on the front surface, the side surfaces, and the top surface, for example. Thus, for example, a mobile phone can display image data not only on its front surface but also on its side surfaces and top surface.

<<Structure Example 8 of Data Processing Device>>

Figure 26A:
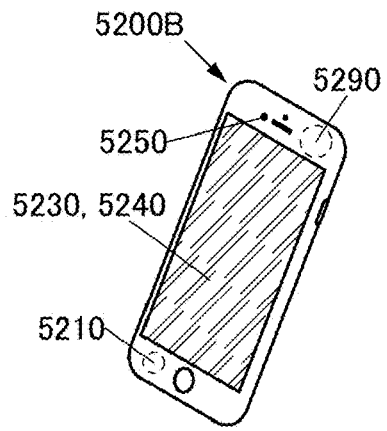
FIGS. 26A-26E are diagrams showing structures of a data processing device according to an example.

For example, the data processing device has a function of changing its display method in accordance with the illuminance of a usage environment (see FIG. 26(A)). Thus, the power consumption of a smartphone can be reduced. Alternatively, for example, a smartphone can display an image so as to be suitably used even in an environment under strong external light, e.g., outdoors in fine weather.

<<Structure Example 9 of Data Processing Device>>

Figure 26B:
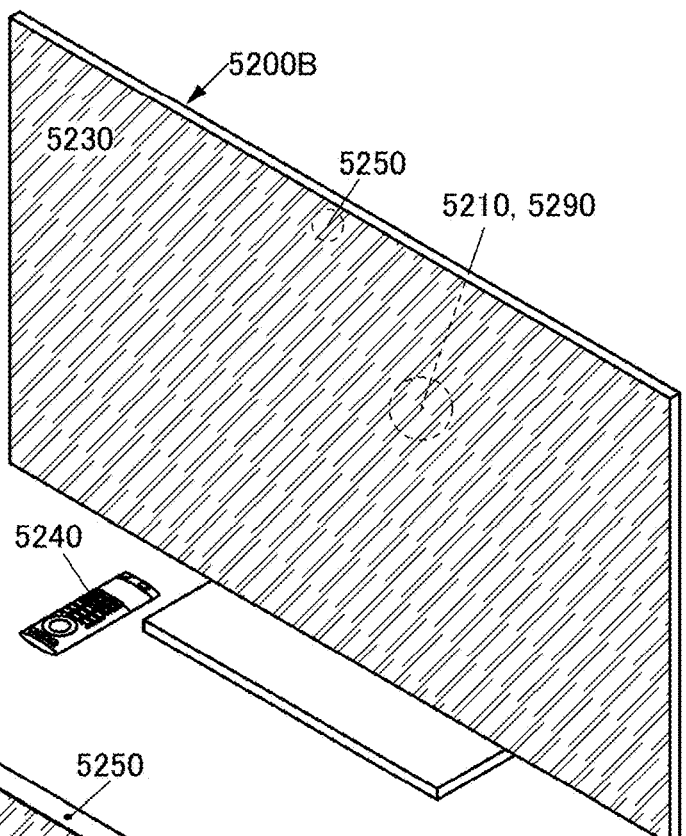

For example, the data processing device has a function of changing its display method in accordance with the illuminance of a usage environment (see FIG. 26(B)). Accordingly, for example, a television system can display an image in such a manner that the television system can be suitably used even when irradiated with strong external light that enters the room from the outside in fine weather.

<<Structure Example 10 of Data Processing Device>>

Figure 26C:
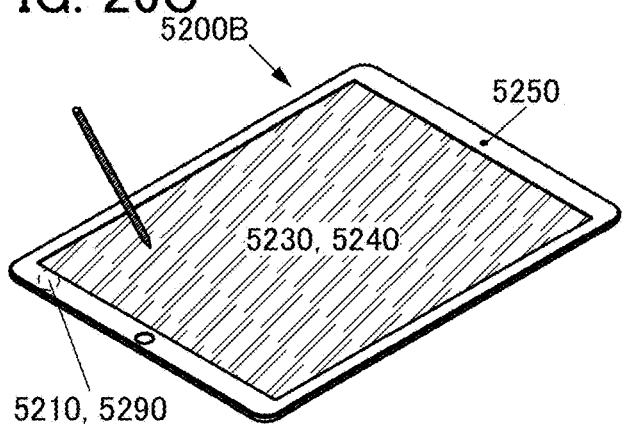

For example, the data processing device has a function of changing its display method in accordance with the illuminance of a usage environment (see FIG. 26(C)). Thus, for example, a tablet computer can display an image so as to be suitably used even in an environment under strong external light, e.g., outdoors in fine weather.

<<Structure Example 11 of Data Processing Device>>

Figure 26D:
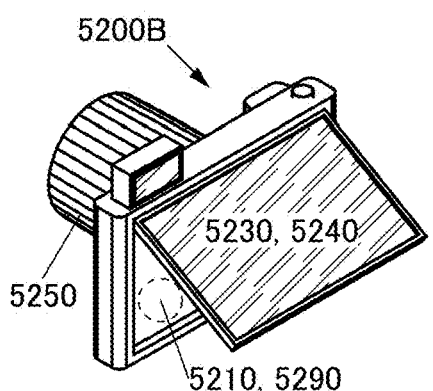

For example, the data processing device has a function of changing its display method in accordance with the illuminance of a usage environment (see FIG. 26(D)). Accordingly, for example, a digital camera can display a subject in such a manner that an image is favorably viewed even in an environment under strong external light, e.g., outdoors in fine weather.

<<Structure Example 12 of Data Processing Device>>

Figure 26E:
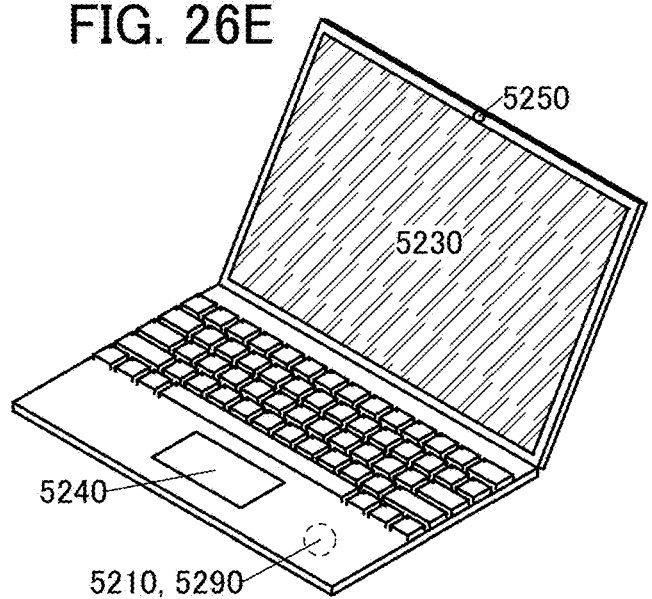

For example, the data processing device has a function of changing its display method in accordance with the illuminance of a usage environment (see FIG. 26(E)). Accordingly, for example, a personal computer can display an image so as to be suitably used even in an environment under strong external light, e.g., outdoors in fine weather.

Note that this embodiment can be combined with other embodiments in this specification as appropriate.

Example 1

In this example, a fabricated display panel of one embodiment of the present invention is described with reference to FIG. 27 to FIG. 29.

Figure 27A:
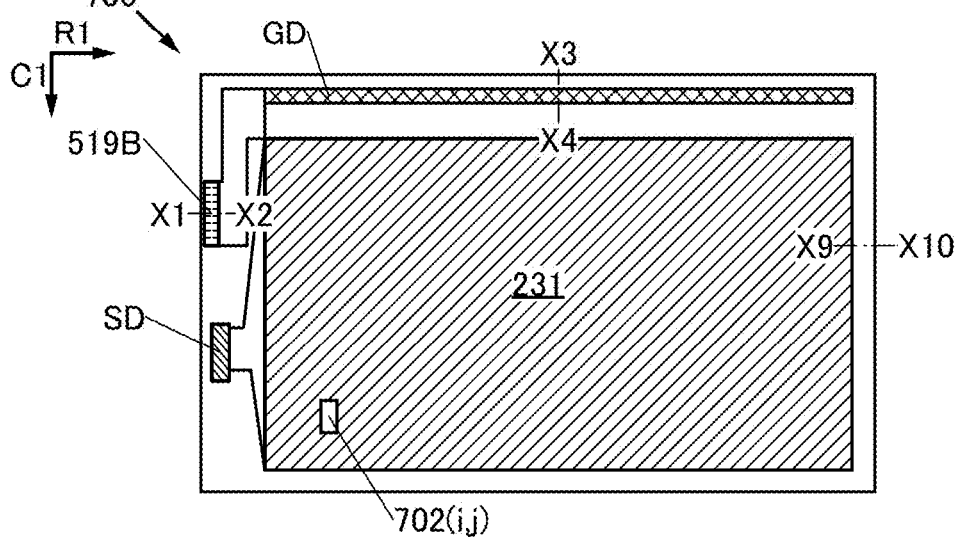
FIGS. 27A-27C are diagrams showing a structure of a display panel according to an example.
Figure 27B:
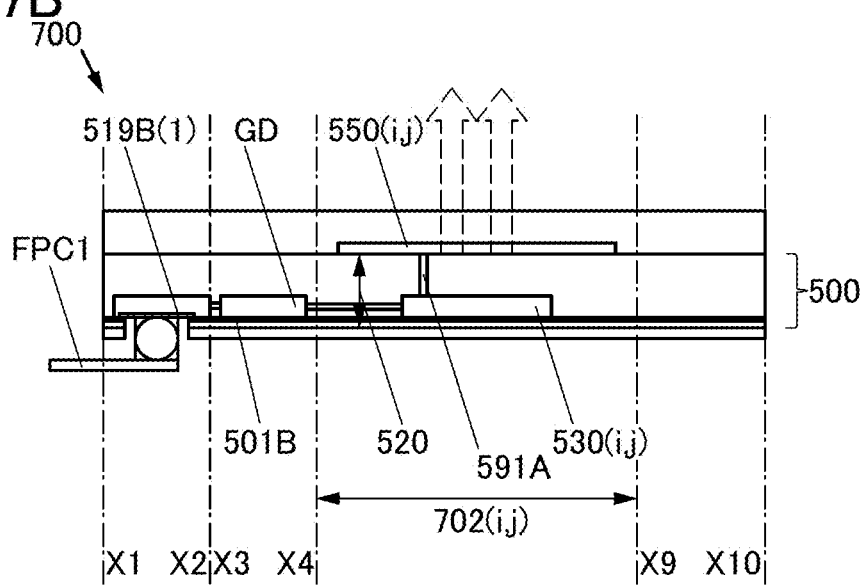
Figure 27C:
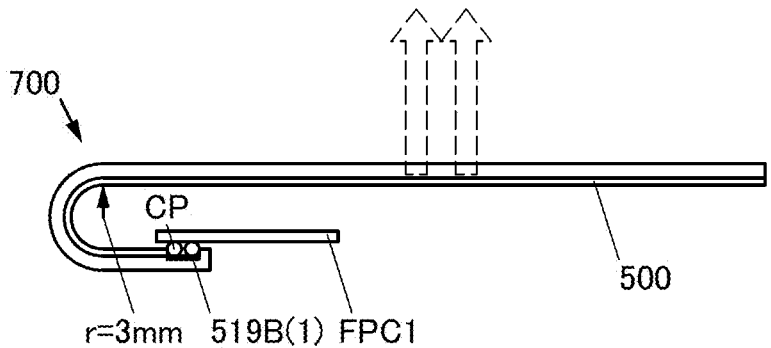

FIG. 27 is a diagram showing a structure of the display panel including the electrical module of one embodiment of the present invention. FIG. 27(A) is a block diagram of the display panel, and FIG. 27(B) is a cross-sectional view taken along cutting plane lines X1-X2, X3-X4, and X9-X10 in FIG. 27(A). FIG. 27(C) is a cross-sectional view showing the display panel in the state where it is partly bent.

Figure 28A:
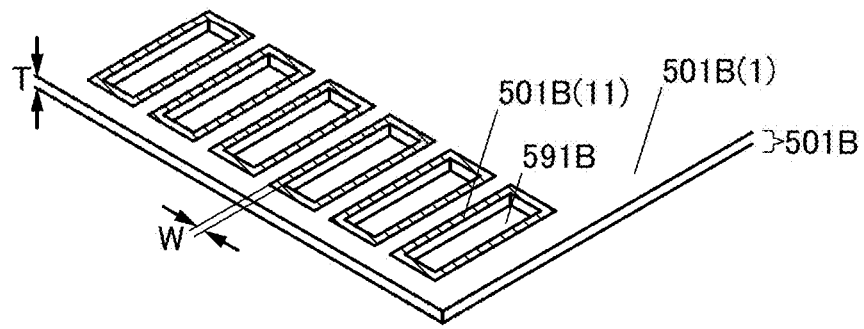
FIGS. 28A-28C are a view and photographs showing a structure of a display panel according to an example.
Figure 28B:
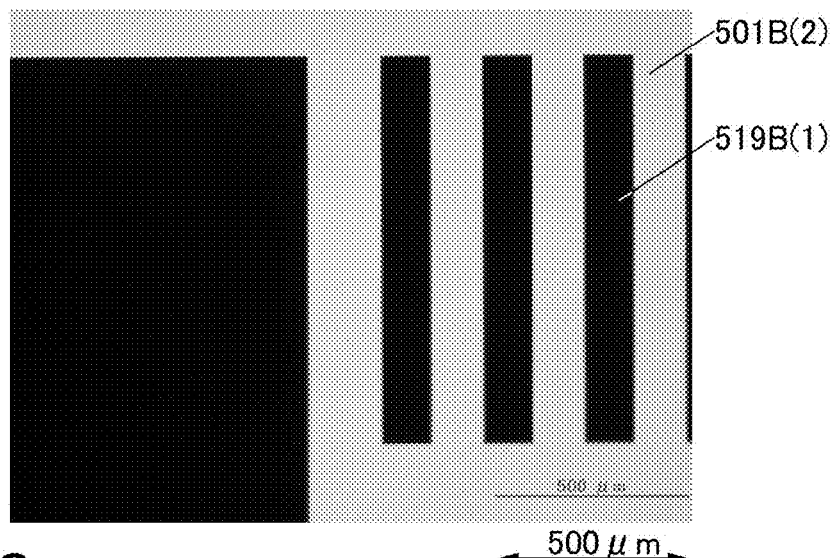
Figure 28C:
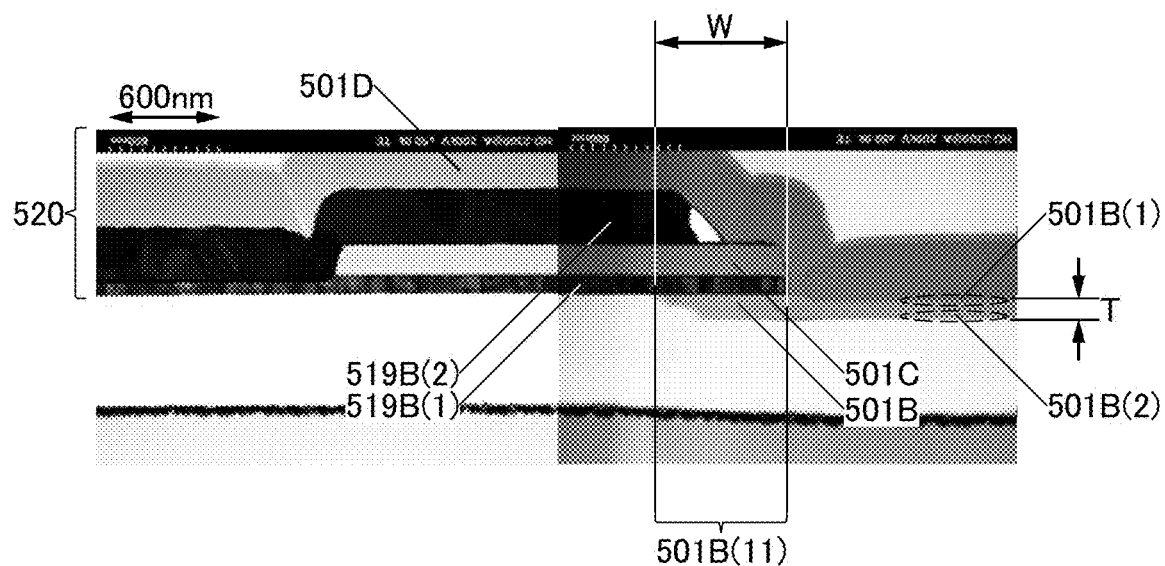

FIG. 28 illustrates a view and photographs showing a structure of a display panel including an electrical module of one embodiment of the present invention. FIG. 28(A) is a perspective view showing part of the display panel illustrated in FIG. 27(A), FIG. 28(B) is an optical micrograph of a terminal portion of the fabricated display panel, and FIG. 28(C) is an electron micrograph of a cross section of the terminal portion of the fabricated display panel.

Figure 29A:
FIGS. 29A and 29B are photographs showing display results of a display panel according to an example.
Figure 29B:
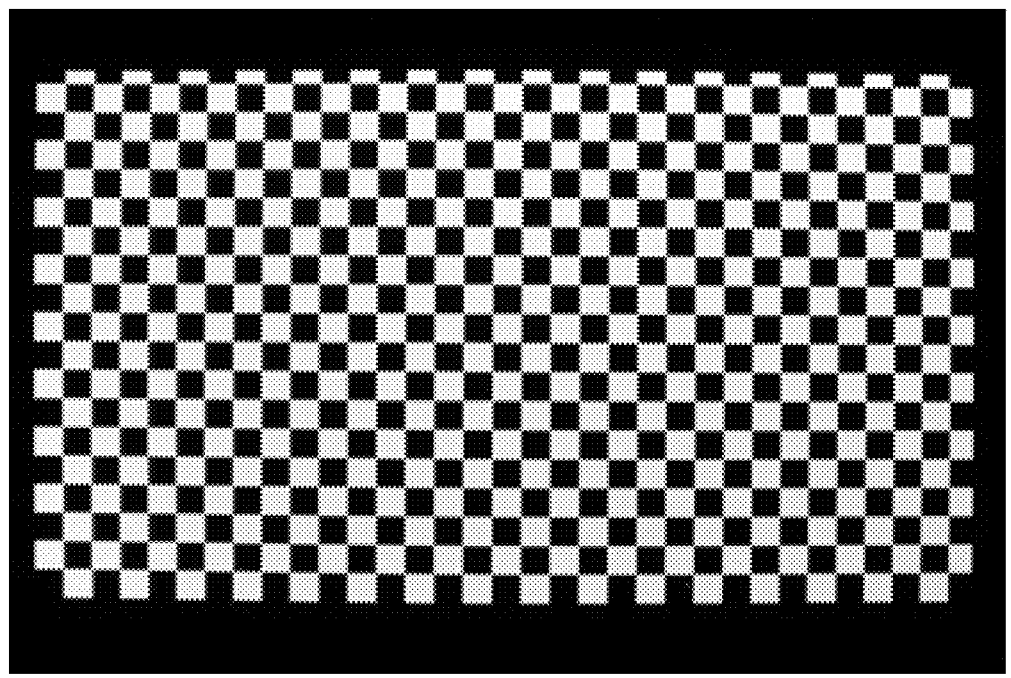

FIG. 29 is a photograph showing display results of the display panel including an electrical module of one embodiment of the present invention.

<Structure Example 1 of Display Panel 700>

The fabricated display panel 700 includes the display region 231 and the electrical module (see FIG. 27(A)).

<<Structure of Display Region 231>>

The display region 231 includes the pixel 702(i,j).

<<Structure of Pixel 702(i,j)>>

The pixel 702(i,j) includes the pixel circuit 530(i,j) and the display element 550(i,j) (see FIG. 27(B)).

<<Electrical Module 500>>

The electrical module 500 includes the functional layer 520.

<<Functional Layer 520>>

The functional layer 520 includes the pixel circuit 530(i,j). The pixel circuit 530(i,j) is electrically connected to the display element 550(i,j), and the pixel circuit 530(i,j) includes the element 100.

Specifically, the pixel circuit 530(i,j) includes a transistor.

The functional layer 520 includes an element, the conductive film 519B(1), and the intermediate layer 501B. The functional layer 520 also includes the conductive film 519B(2) and the insulating film 501C (see FIG. 28(C)).

The element 100 is electrically connected to the conductive film 519B(1).

Specifically, the transistor included in the pixel circuit 530(i,j) was electrically connected to the conductive film 519B(1).

<<Conductive Film 519B(1)>>

The conductive film 519B(1) includes titanium. Specifically, 100-nm-thick titanium was used as the conductive film 519B(1).

Moreover, a stacked layer film in which 10-nm-thick tantalum nitride and 300-nm-thick copper were stacked was used as the conductive film 519B(2).

<<Intermediate Layer 501B>>

The intermediate layer 501B includes silicon and oxygen. Specifically, a 135-nm-thick film including silicon, oxygen, and nitrogen was used as the intermediate layer 501B.

The intermediate layer 501B includes the opening portion 591B and a first surface 501B(1) (see FIG. 28(A)). Specifically, the intermediate layer 501B includes the opening portion 591B that is a 1000 µm long and 130 µm wide rectangle.

The opening portion 591B overlaps with the conductive film 519B(1). Note that the conductive film 519B(1) exposed in the opening portion 591B was able to be used as the terminal.

The surface 501B(1) the region 501B(11).

The region 501B(11) is positioned at the periphery of the opening portion 591B and is in contact with the conductive film 519B(1). In addition, the region 501B(11) has a width W ten times or less, preferably five times or less, further preferably twice or less the thickness T of the intermediate layer 501B (see FIG. 28(B)). Specifically, a film including silicon, oxygen, and nitrogen, whose thickness T was 100 nm, was used as the intermediate layer 501B. Note that the width W of the region 501B(11) was 720 nm.

The region 501B(11) includes fluorine.

The fabricated display panel 700 was bent with a radius of curvature of 3 mm, and the terminal 519B and the flexible printed board FPC1 were electrically connected (see FIG. 27(C)). Note that an anisotropic conductive film including a conductive particle CP with a diameter of 3 µm was used for the connection between the terminal 519B and the flexible printed board FPC1. In addition, data is supplied to the terminal 519B through the flexible printed board FPC1, and an image was displayed on the display region 231 (see FIG. 29).

Example 2

In this example, a structure of a member in a manufacturing process of the display panel including an electrical module of one embodiment of the present invention is described with reference to FIG. 30.

Figure 30:
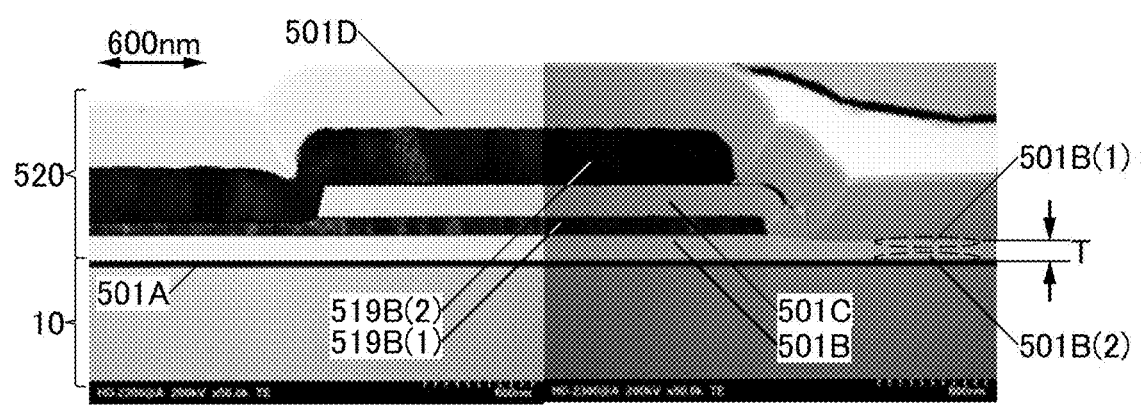
FIG. 30 is a photograph showing a structure of a member in a manufacturing process of a display panel according to an example.

FIG. 30 is a photograph showing a manufacturing process of a display panel including an electrical module of one embodiment of the present invention. FIG. 30 is an electron micrograph of a cross section of the terminal portion of the member in the manufacturing process.

Note that the display panel was fabricated using the method described in Embodiment 3. Here, a structure of the processed member which has been subjected to the process described in the fifth step described in Embodiment 3 is described.

<Structure 1 of Processed Member>

The processed member includes the process substrate 10 and the functional layer 520 (see FIG. 30).

<<Structure of Process Substrate 10>>

The process substrate 10 includes a non-alkali glass substrate and the functional surface 501A(1).

A 30-nm-thick tungsten film was used as the film 501A. Specifically, a surface of the film 501A subjected to plasma treatment using a nitrous oxide ($N_2O$) gas was used as the functional surface 501A(1).

<<Structure of Functional Layer 520>>

The functional layer 520 includes the intermediate layer 501B, the conductive film 519B(1), and the insulating film 501D. The functional layer 520 also includes the conductive film 519B(2) and the insulating film 501C.

Example 3

In this example, a fabricated display panel of one embodiment of the present invention is described with reference to FIG. 31 and FIG. 32.

Figure 31A:
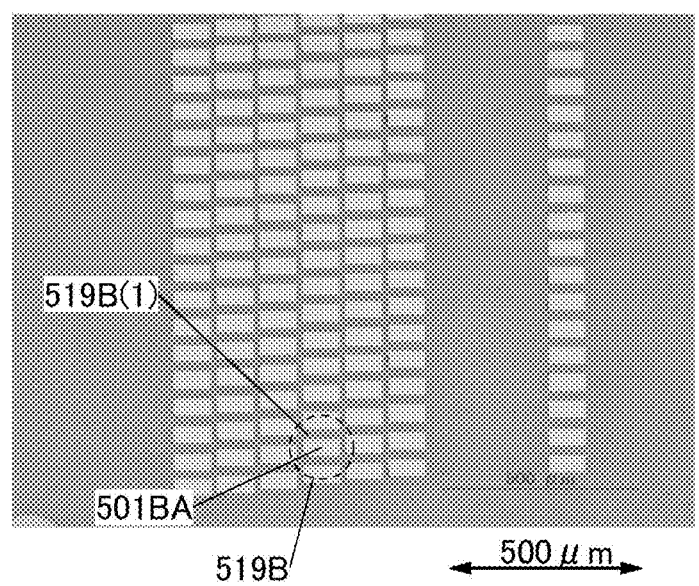
FIGS. 31A and 31B are photographs showing a structure of a display panel according to an example.
Figure 31B:
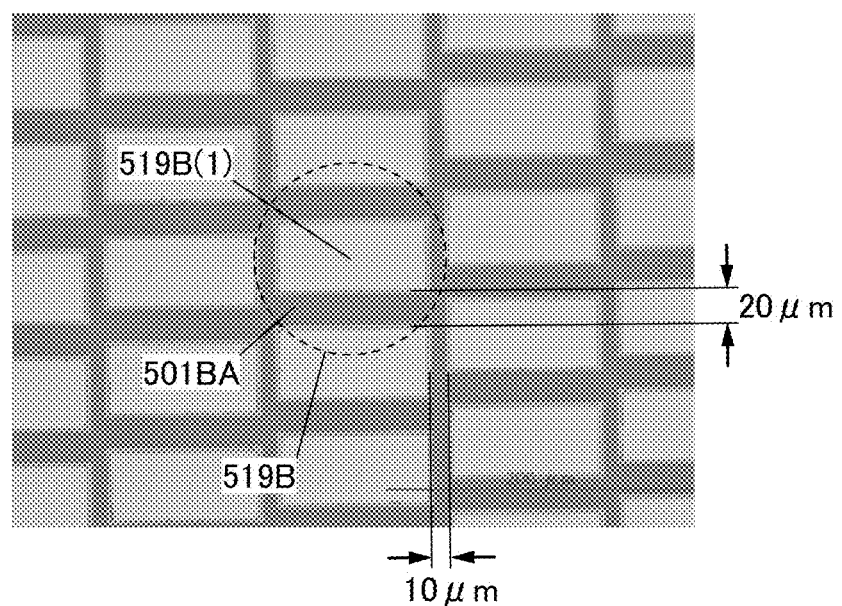

FIG. 31 is a photograph showing part of the display panel including an electrical module of one embodiment of the present invention. FIG. 31(A) is an optical micrograph of a terminal portion of the display panel, and FIG. 31(B) is an enlarged photograph of part of FIG. 31(A).

Figure 32A:
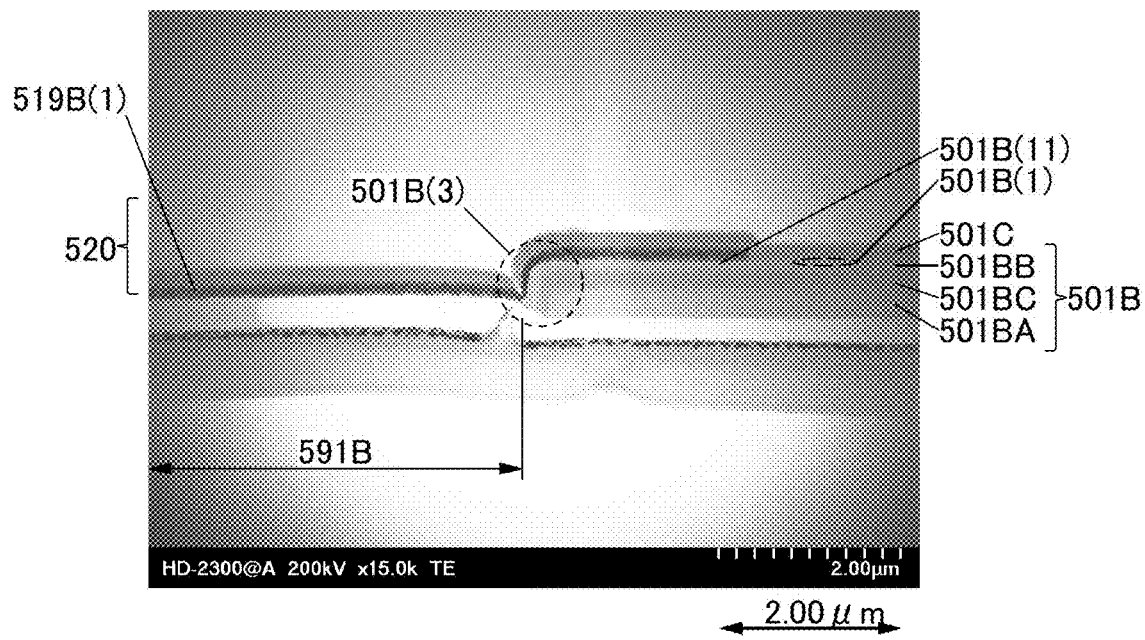
FIGS. 32A and 32B are photographs showing a structure of a display panel and a structure of a process substrate according to an example.
Figure 32B:
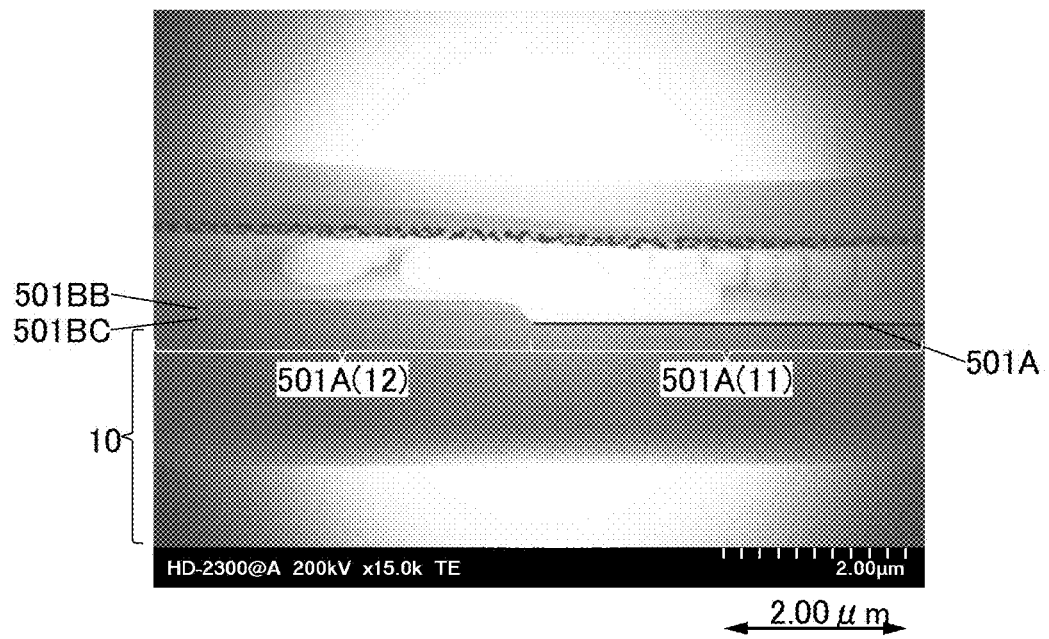

FIG. 32 is a view and a photograph showing a structure of a display panel including an electrical module of one embodiment of the present invention. FIG. 32(A) is an electron micrograph of a cross section of the terminal portion of the fabricated display panel, and FIG. 32(B) is an electron micrograph of a cross section of the process substrate after the display panel illustrated in FIG. 32(A) is separated.

<Structure 2 of Display Panel>

The fabricated display panel includes the functional layer 520.

<<Structure of Functional Layer 520>>

The functional layer 520 includes the conductive film 519B(1) and the intermediate layer 501B. The functional layer 520 also includes the insulating film 501C (see FIG. 32(A)). Note that 100-nm-thick titanium was used as the conductive film 519B(1).

<<Structure of Intermediate Layer 501B>>

The intermediate layer 501B includes the opening portion 591B and the surface 501B(1).

The intermediate layer 501B includes the intermediate layer 501BA, the intermediate layer 501BB, and the intermediate layer 501BC.

Note that a 160-nm-thick film including silicon, oxygen, and nitrogen was used as the intermediate layer 501BA, and a 130-nm-thick film including silicon, oxygen, and nitrogen was used as the intermediate layer 501BB. In addition, a 180-nm-thick film including silicon and nitrogen was used as the intermediate layer 501BC.

<<Structure of Opening Portion 591B>>

The opening portion 591B overlaps with the conductive film 519B(1). In addition, the opening portion 591B includes the side end portion 501B(3) and the side end portion 501B(3) is in contact with the conductive film 519B(1).

<<Structure of Surface 501B(1)>>

The surface 501B(1) includes the region 501B(11), and the region 501B(11) is positioned at the periphery of the opening portion 591B.

The region 501B(11) is in contact with the conductive film 519B(1).

Note that the process substrate 10 used in the manufacture of the above display panel includes the active region 501A(11) and the inert region 501A(12) (see FIG. 32(B)).

The active region 501A(11) includes a non-alkali glass substrate and the film 501A. A 30-nm-thick tungsten film was used as the film 501A. Specifically, a surface of the film 501A subjected to plasma treatment using a nitrous oxide (N$_2$O) gas was used as the functional surface 501A(1).

A surface of a non-alkali glass substrate was used as the inert region 501A(12). Note that the intermediate layer 501BB and the intermediate layer 501BC are transferred to the inert region 501A(12) of the process substrate 10 after the separation of the functional layer 520.

Example 4

In this example, a structure of a member in a manufacturing process of the display panel including an electrical module of one embodiment of the present invention is described with reference to FIG. 33.

Figure 33A:
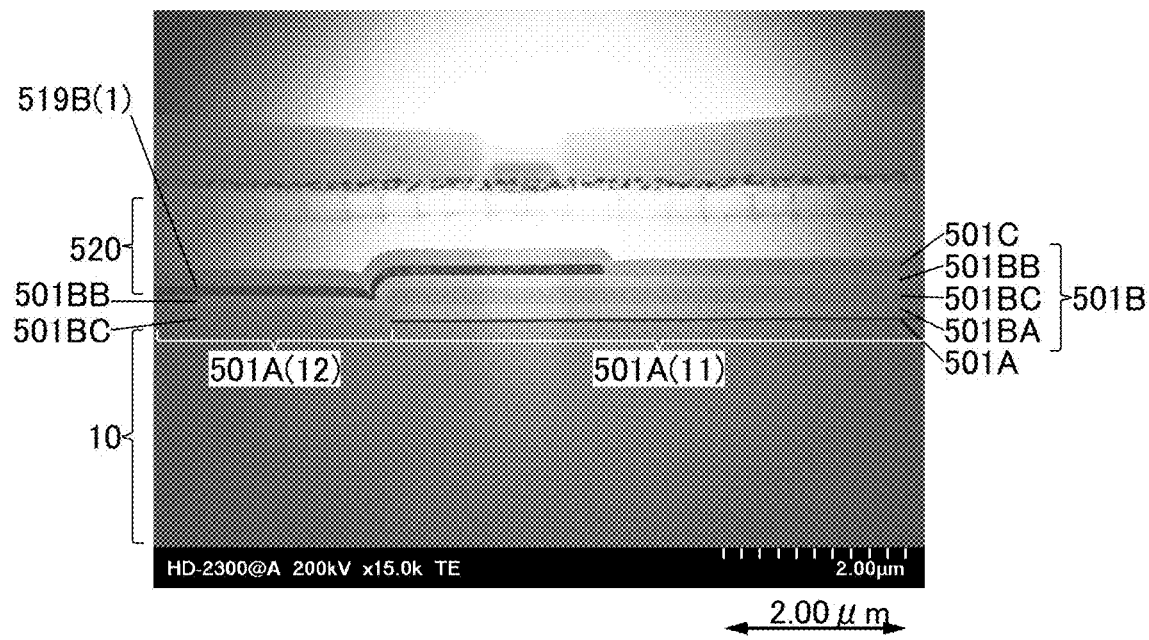
FIGS. 33A and 33B are photographs showing a structure of a member in a manufacturing process of a display panel according to an example.
Figure 33B:
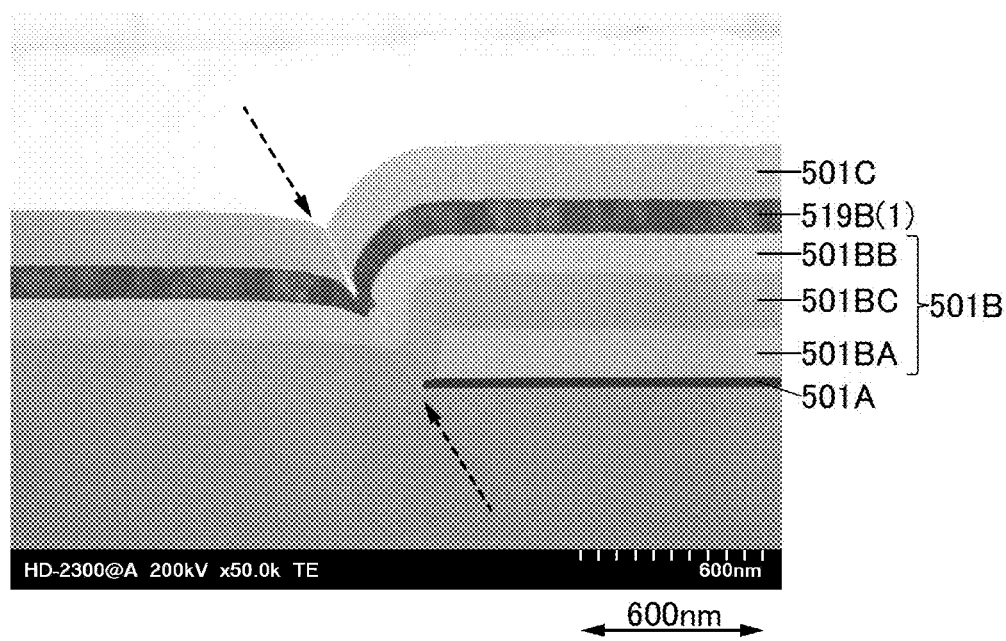

FIG. 33 is a photograph showing a manufacturing process of a display panel including an electrical module of one embodiment of the present invention. FIG. 33(A) is an electron micrograph of a cross section of the terminal portion of the member in the manufacturing process, and FIG. 33(B) is a detailed electron micrograph of part of FIG. 33(A).

Note that the display panel was fabricated by Method 3 of manufacturing a display panel including an electrical module according to Embodiment 3. Here, a structure of the processed member which has finished the step described in the fifth step of Method 3 of manufacturing a display panel including an electrical module according to Embodiment 3 is described.

<Structure 2 of Processed Member>

The processed member includes the process substrate 10 and the functional layers 520 (see FIG. 33(A)).

<<Structure of Process Substrate 10>>

The process substrate 10 includes the active region 501A(11) and the inert region 501A(12).

The active region 501A(11) includes the film 501A. A 30-nm-thick tungsten film was used as the film 501A. Specifically, a surface of the film 501A subjected to plasma treatment using a nitrous oxide (N$_2$O) gas was used as the functional surface 501A(1).

A surface of a non-alkali glass substrate was used as the inert region 501A(12).

<<Structure of Functional Layer 520>>

The functional layer 520 includes the intermediate layer 501B, the conductive film 519B(1), and the insulating film 501C. Note that a step is provided between the active region 501A(11) and the inert region 501A(12), and a low-density region can be formed from the boundary between the active region 501A(11) and the inert region 501A(12) toward the inside of the intermediate layer 501B (the region sandwiched between the two arrows illustrated in FIG. 33(B)). Accordingly, allows a structure that is likely to be broken by stress concentration can be formed inside the intermediate layer 501B. Alternatively, a region that is likely to be pulled apart when the process substrate 10 is separated from the functional layer 520 can be formed in the intermediate layer 501B. Alternatively, the shape of the opening portion 591B can be controlled using the shape of the inert region 501A(12).

Example 5

In this example, a display panel 700C of one embodiment of the present invention will be described with reference to FIG. 34.

FIG. 34 is views and photographs showing a structure of the display panel 700C of one embodiment of the present invention. FIG. 34(A) is a top view illustrating the structure of the display panel, and FIG. 34(B) is a cross-sectional view taken along a cutting plane line P1-P2 in FIG. 34(A). FIG. 34(C-1) to FIG. 34(C-3) are optical micrographs of an end portion of the fabricated display panel.

<Structure of Display Panel>

The display panel 700C of one embodiment of the present invention includes the functional layer 520, the bonding layer 505, and the base material 510 (see FIG. 34(A) and FIG. 34(B)). The display panel further includes the base material 770 and the sealant 705. Note that the functional layer 520 includes the element, the conductive film, and the intermediate layer 501B.

<<Bonding Layer 505>>

The bonding layer 505 has a function of bonding the functional layer 520 and the base material 510, and the bonding layer 505 includes an epoxy resin.

A two-component-type epoxy resin (produced by Nissin Resin Co., Ltd.: CEP-5) was used for the bonding layer 505. For example, the intermediate layer 501B and the base material 510 were bonded to each other with the bonding layer 505, left at room temperature for 12 hours, and then heated at a temperature higher than 40° C. for 4 hours. Note that the thickness of the bonding layer 505 was 4 μm.

<<Base Material 510>>

The base material 510 includes cycloolefin polymer. Specifically, a cycloolefin polymer film (produced by Gunze Limited) with a thickness of 40 μm, a heat shrinkage of 0.10% or lower, and an absorptance of 0.01% or lower was used for the base material 510. Note that the glass transition temperature of the cycloolefin polymer film used for the base material 510 is 180° C. For example, a material having a surface that has been subjected to corona discharge treatment can be used for the base material.

After the bonding with the bonding layer 505, the display panel that has been heated at 60° C. for 4 hours was preserved in a hot and humid environment where the temperature was 65° C. and the humidity was 95%. Even after 500 hours of preservation time elapsed, no crack was generated in the intermediate layer 501B (see FIG. 34(C-1)).

After the bonding with the bonding layer 505, the display panel that has been heated at 80° C. for 4 hours was preserved in a hot and humid environment where the temperature was 65° C. and the humidity was 95%. Even after 500 hours of preservation time elapsed, no crack was generated in the intermediate layer 501B (see FIG. 34(C-2)).

Thus, adhesion of the bonding layer to the base material can be increased. Alternatively, a crack or the like in the intermediate layer can be inhibited for 500 hours or longer in a hot and humid environment where the temperature was 65° C. and the humidity was 95%. Alternatively, it is possible to perform 500-hour preservation in a hot and humid environment where the temperature was 65° C. and the humidity was 95% without generation of bending. As a result, a novel data processing device that is highly convenient or reliable can be provided.

<Comparative Example of Display Panel>

The two-component-type epoxy resin (produced by Nissin Resin Co., Ltd.: CEP-5) was used for the bonding layer 505, the intermediate layer 501B and the base material 510 were bonded to each other with the bonding layer 505, and then heated at a temperature set to 40° C. for 12 hours. Refer to the above description for the other portions that can use similar structures.

The display panel used in the comparative example was preserved in a hot and humid environment where the temperature was 65° C. and the humidity was 95%. After the elapse of 500 hours, cracks were generated in the intermediate layer 501B (see FIG. 34(C-3)). Note that the cracks are generated in the regions sandwiched between the short arrows in the photograph.

Note that this example can be combined with other embodiments in this specification as appropriate.

In the case where there is an explicit description, X and Y are connected, in this specification and the like, for example, the case where X and Y are electrically connected, the case where X and Y are functionally connected, and the case where X and Y are directly connected are disclosed in this specification and the like. Accordingly, without being limited to a predetermined connection relation, for example, a connection relation shown in drawings or texts, a connection relation other than one shown in drawings or texts is regarded as being disclosed in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y (e.g., a switch, a transistor, a capacitor, an inductor, a resistor, a diode, a display element, a light-emitting element, and a load) provided therebetween.

For example, in the case where X and Y are electrically connected, one or more elements that allow an electrical connection between X and Y (e.g., a switch, a transistor, a capacitor, an inductor, a resistor, a diode, a display element, a light-emitting element, and a load) can be connected between X and Y. Note that a switch has a function of being controlled to be turned on or off. That is, a switch has a function of being in a conduction state (on state) or a non-conduction state (off state) to control whether or not current flows. Alternatively, the switch has a function of selecting and changing a current path. Note that the case where X and Y are electrically connected includes the case where X and Y are directly connected.

An example of the case where X and Y are functionally connected is the case where one or more circuits that allow functional connection between X and Y (for example, a logic circuit (an inverter, a NAND circuit, a NOR circuit, or the like), a signal converter circuit (a DA converter circuit, an AD converter circuit, a gamma correction circuit, or the like), a potential level converter circuit (a power supply circuit (for example, a step-up circuit, a step-down circuit, or the like), a level shifter circuit for changing the potential level of a signal, or the like), a voltage source, a current source, a switching circuit, an amplifier circuit (a circuit capable of increasing signal amplitude, the amount of current, or the like, an operational amplifier, a differential amplifier circuit, a source follower circuit, a buffer circuit, or the like), a signal generator circuit, a memory circuit, a control circuit, or the like) can be connected between X and Y. For example, even when another circuit is interposed between X and Y, X and Y are functionally connected when a signal output from X is transmitted to Y. Note that the case where X and Y are functionally connected includes the case where X and Y are directly connected and the case where X and Y are electrically connected.

Note that in the case where there is an explicit description, X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are disclosed in this specification and the like. That is, in the case where there is an explicit description, being electrically connected, the same contents as the case where there is only an explicit disclosure, being connected, are described in this specification and the like.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y can be expressed as follows.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path through the transistor and between the source (or the first terminal or the like) of the transistor and a drain (or a second terminal or the like) of the transistor, the first connection path is a path through Z1, the drain (or the second terminal or the like) of the transistor is electrically connected to Y through at least a third connection path, the third connection path does not include the second connection path, and the third connection path is a path through Z2" and "a source (or a first terminal or the like) of a transistor is electrically connected to X through Z1 by at least a first connection path, the first connection path does not include a second connection path, the second connection path includes a connection path through the transistor, a drain (or a second terminal or the like) of the transistor is electrically connected to Y through Z2 by at least a third connection path, and the third connection path does not include the second connection path". Still another example of the expression is "a source (or a first terminal or the like) of a transistor is electrically connected to X through Z1 by at least a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through Z2 by at least a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and the expression is not limited to these expressions. Here, X, Y, Z1, and Z2 denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, electrical connection in this specification includes in its category such a case where one conductive film has functions of a plurality of components.

REFERENCE NUMERALS

ANO: wiring, BM: light-blocking film, C21: capacitor, CF1: coloring film, CI: control data, CP: conductive particle, DS: sensing data, FPC1: flexible printed board, G2: scan line, GD: driver circuit, GDA: driver circuit, GDB: driver circuit, GCLK: signal, II: input data, M: transistor, MD: transistor, OSC: oscillator circuit, P1: positional data, PWC1: signal, PWC2: signal, S2: signal line, SD: driver circuit, SDA: driver circuit, SDB: driver circuit, SDC: driver circuit, SP: control signal, SW2: switch, V1: image data, V11: data, 10: process substrate, 11: base material, 100: element, 200: data processing device, 210: arithmetic device, 211: arithmetic portion, 212: memory portion, 213: artificial intelligence portion, 214: transmission path, 215: input/output interface, 220: input/output device, 230: display portion, 231: display region, 233: control circuit, 234: decompression circuit, 235: image processing circuit, 238: control portion, 240: input portion, 241: sensing region, 250: sensing portion, 290: communication portion, 500: electrical module, 501A(1): functional surface, 501A(11): active region, 501A(12): inert region, 501A: film, 501B: intermediate layer, 501BA: intermediate layer, 501BB: intermediate layer, 501BC: intermediate layer, 501B(1): surface, 501B (11): region, 501B(12): region, 501B(13): region, 501B(2): surface, 501B(23): region, 501B(24): region, 501B(3): surface, 501C: insulating film, 501D: insulating film, 504: conductive film, 505: bonding layer, 506: insulating film, 508: semiconductor film, 508A: region, 508B: region, 508C: region, 510: base material, 512A: conductive film, 512B: conductive film, 512C: conductive film, 512D: conductive film, 516A: insulating film, 516B: insulating film, 518: insulating film, 519: terminal, 519B: terminal, 519B(1): conductive film, 519B(2): conductive film, 520: functional layer, 521: insulating film, 524: conductive film, 528: insulating film, 530$(i,j)$: pixel circuit, 550$(i,j)$: display element, 551$(i,j)$: electrode, 552: electrode, 553$(j)$: layer, 591A: opening portion, 591B: opening portion, 700: display panel, 700C: display panel, 700TP: input/output panel, 702$(i,j)$: pixel, 703$(i,k)$: pixel, 705: sealant, 720: functional layer, 770: base material, 770P: functional film, 771: insulating film, 775: sensing element, 5200B: data processing device, 5210: arithmetic device, 5220: input/output device, 5230: display portion, 5240: input portion, 5250: sensing portion, 5290: communication portion This application is based on Japanese Patent Application Serial No. 2018-048815 filed with Japan Patent Office on Mar. 16, 2018, Japanese Patent Application Serial No. 2018-086283 filed with Japan Patent Office on Apr. 27, 2018, and Japanese Patent Application Serial No. 2018-096028 filed with Japan Patent Office on May 18, 2018, the entire contents of which are hereby incorporated herein by reference.

The invention claimed is:

1. An electrical module comprising a functional layer,
wherein the functional layer comprises an element, a conductive film, and an intermediate layer,
wherein the element is electrically connected to the conductive film,
wherein the intermediate layer comprises an opening portion, a first surface, and a second surface,
wherein the opening portion overlaps with the conductive film,
wherein the opening portion comprises a first side end portion in the first surface, and a second side end portion in the second surface,
wherein the first side end portion is in contact with the conductive film,
wherein the second side end portion is not in contact with the conductive film,
wherein the first surface comprises a first region,
wherein the first region is positioned at a periphery of the opening portion, and
wherein the first region is in contact with the conductive film.

2. The electrical module according to claim 1,
wherein the intermediate layer comprises silicon and oxygen,
wherein the first region and the first side end portion comprise fluorine, and
wherein the conductive film comprises titanium.

3. The electrical module according to claim 1,
wherein the intermediate layer comprises silicon and oxygen,
wherein the first region and the first side end portion comprise nitrogen, and
wherein the conductive film comprises tungsten.

4. The electrical module according to claim 1,
wherein the intermediate layer comprises a second region, and
wherein the second region adheres to another component of the functional layer with a force greater than a force of adhesion of the first region to the conductive film.

5. A display panel comprising:
a display region; and
the electrical module according to claim 1,
wherein the display region comprises a pixel,
wherein the pixel comprises a pixel circuit and a display element,
wherein the electrical module comprises the pixel circuit,
wherein the pixel circuit is electrically connected to the display element, and
wherein the pixel circuit comprises the element.

6. The display panel according to claim 5,
wherein the display region comprises one group of pixels, another one group of pixels, a scan line, and a signal line,
wherein the one group of pixels comprise the pixel in the display region,
wherein the one group of pixels are arranged in a row direction,
wherein the another one group of pixels comprise the pixel,
wherein the another one group of pixels are arranged in a column direction intersecting with the row direction,
wherein the scan line is electrically connected to the one group of pixels, and
wherein the signal line is electrically connected to the another one group of pixels.

7. A display device comprising:
the display panel according to claim 5; and
a control portion,
wherein the control portion is supplied with image data and control data,
wherein the control portion generates data on the basis of the image data,
wherein the control portion generates a control signal on the basis of the control data,
wherein the control portion supplies the data and the control signal,
wherein the electrical module is supplied with the data and the control signal,
wherein a driver circuit operates on the basis of the control signal, and
wherein the pixel performs display on the basis of the data.

8. An input/output device comprising:
an input portion; and
a display portion,
wherein the display portion comprises the display panel according to claim 5,
wherein the input portion comprises a sensing region,
wherein the input portion senses an object approaching the sensing region, and
wherein the sensing region comprises a region overlapping with the pixel.

9. A data processing device comprising:
an arithmetic device; and
an input/output device,
wherein the arithmetic device is supplied with input data or sensing data,
wherein the arithmetic device generates control data and image data on the basis of the input data or the sensing data,
wherein the arithmetic device supplies the control data and the image data,
wherein the input/output device supplies the input data and the sensing data,
wherein the input/output device is supplied with the control data and the image data,
wherein the input/output device comprises a display portion, an input portion, and a sensing portion,
wherein the display portion comprises the display panel according to claim 5,
wherein the display portion displays the image data on the basis of the control data,
wherein the input portion generates the input data, and
wherein the sensing portion generates the sensing data.

10. A data processing device comprising:
one or more of a keyboard, a hardware button, a pointing device, a touch sensor, an illuminance sensor, an imaging device, an audio input device, an eye-gaze input device, and an attitude detection device; and
the display panel according to claim 5.

11. A method of manufacturing an electrical module, comprising:
a first step of preparing a processed member that comprises a process substrate and a functional layer; and
a second step of separating the functional layer from the process substrate,
wherein the process substrate comprises a functional surface,
wherein the functional surface comprises an active region,
wherein the functional layer comprises a conductive film and an intermediate layer, wherein the intermediate layer comprises a first surface and a second surface,
wherein the first surface comprises a first region,
wherein the first region is in contact with the conductive film,
wherein the second surface is opposite to the first surface,
wherein the second surface comprises a third region,
wherein the third region is in contact with the active region, and
wherein in the second step, the functional layer or the process substrate is bent,
the intermediate layer is separated from the conductive film at the first region, and
the intermediate layer is separated from the active region at the third region.

* * * * *